(12) United States Patent
Sallin et al.

(10) Patent No.: US 10,269,855 B2
(45) Date of Patent: Apr. 23, 2019

(54) PHOTO DETECTOR SYSTEMS AND METHODS OF OPERATING SAME

(71) Applicant: ActLight SA, Lausanne (CH)

(72) Inventors: Denis Sallin, Echandens (CH); Maxim Gureev, Lausanne (CH); Alexander Kvasov, Blonay (CH); Serguei Okhonin, St-Sulpice (CH)

(73) Assignee: ACTLIGHT SA, Lausanne (CH)

( * ) Notice: Subject to any disclaimer, the term of this patent is extended or adjusted under 35 U.S.C. 154(b) by 0 days.

(21) Appl. No.: 15/461,645

(22) Filed: Mar. 17, 2017

(65) Prior Publication Data

US 2018/0175095 A1 Jun. 21, 2018

Related U.S. Application Data

(63) Continuation-in-part of application No. 14/194,928, filed on Mar. 3, 2014, now Pat. No. 9,735,304.

(Continued)

(51) Int. Cl.
*H01L 31/0352* (2006.01)
*H01L 27/146* (2006.01)
(Continued)

(52) U.S. Cl.
CPC .... *H01L 27/14643* (2013.01); *H01L 31/1136* (2013.01); *H04N 5/374* (2013.01)

(58) Field of Classification Search
CPC .................................................. H01L 31/0352
See application file for complete search history.

(56) References Cited

U.S. PATENT DOCUMENTS 9,142,692 B2 9/2015 Sheu
2003/0223053 A1 12/2003 Liu et al.
(Continued)

FOREIGN PATENT DOCUMENTS

CN 101236995 A 8/2008
CN 102901992 A 1/2013
(Continued)

OTHER PUBLICATIONS

Van Nieuwenhove, et al, "Photonic Demodulator With Sensitivity Control," IEEE Sensors Journal, vol. 7, No. 3, Mar. 1, 2007, pp. 317-318 (2 pages).

(Continued)

*Primary Examiner* — Jae Lee
(74) *Attorney, Agent, or Firm* — Wilmer Cutler Pickering Hale and Dorr LLP

(57) ABSTRACT

According to embodiments of the present disclosure, a dynamic photodiode may include a substrate, a first doped region, a second doped region, a first resettable doped region between the first doped region and the second doped region, and a first light absorbing region between the first doped region and the second doped region. The first doped region may include a first contact that receives a first voltage. The second doped region may include a second contact that receives a second voltage. The first resettable doped region may include a first resettable contact that receives a reset voltage or is set as an open circuit. The first light absorbing region may generate first electron-hole pairs in the substrate when the first resettable contact is set as an open circuit, and the first electron-hole pairs may be removed from the substrate when the first resettable contact receives the reset voltage.

22 Claims, 75 Drawing Sheets

Related U.S. Application Data

(60) Provisional application No. 61/786,781, filed on Mar. 15, 2013.

(51) Int. Cl.
  *H01L 31/113* (2006.01)
  *H04N 5/374* (2011.01)

(56) References Cited

U.S. PATENT DOCUMENTS

| | | | |
|---|---|---|---|
| 2010/0237455 A1* | 9/2010 | Lee | H01L 31/1105 257/462 |
| 2011/0024808 A1 | 2/2011 | Janesick | |
| 2011/0292380 A1 | 12/2011 | Bamji | |
| 2012/0313155 A1 | 12/2012 | Okhonin | |
| 2013/0056708 A1 | 3/2013 | Kim | |
| 2015/0221806 A1 | 8/2015 | Okhonin | |

FOREIGN PATENT DOCUMENTS

| | | |
|---|---|---|
| JP | 2005-235893 A | 9/2005 |
| JP | 2005-303268 A | 10/2005 |
| JP | 2007-526448 | 9/2007 |
| JP | 2011-007622 A | 1/2011 |
| WO | WO-2004/114369 | 12/2004 |
| WO | WO-2013/124956 A1 | 8/2013 |

OTHER PUBLICATIONS

Klein, P., et al., "Design and Performance of Semiconductor Detectors With Integrated Amplification and Charge Storage Capability," Nuclear Instruments & Methods in Physics Research. vol. A305, Aug. 1, 1991, pp. 517-526 (10 pages).

Sallin, Denis, et al., "MOS-PN Hybrid Device With Minimum Dark Current for Sensitive Digital Photodection," IEEE Photonics Technology Letters, IEEE Service Center, vol. 26, No. 20, Oct. 15, 2014, pp. 2062-2065 (4 pages).

Notification of International Search Report and Written Opinion dated Jun. 28, 2018, received in related PCT/IB2018/000356 filed Mar. 16, 2018 (19 pages).

Notice of Reasons for Rejection dated May 8, 2018 received in related Japanese Patent Application No. 2016-547246 filed Jul. 3, 2014 (6 pages).

\* cited by examiner

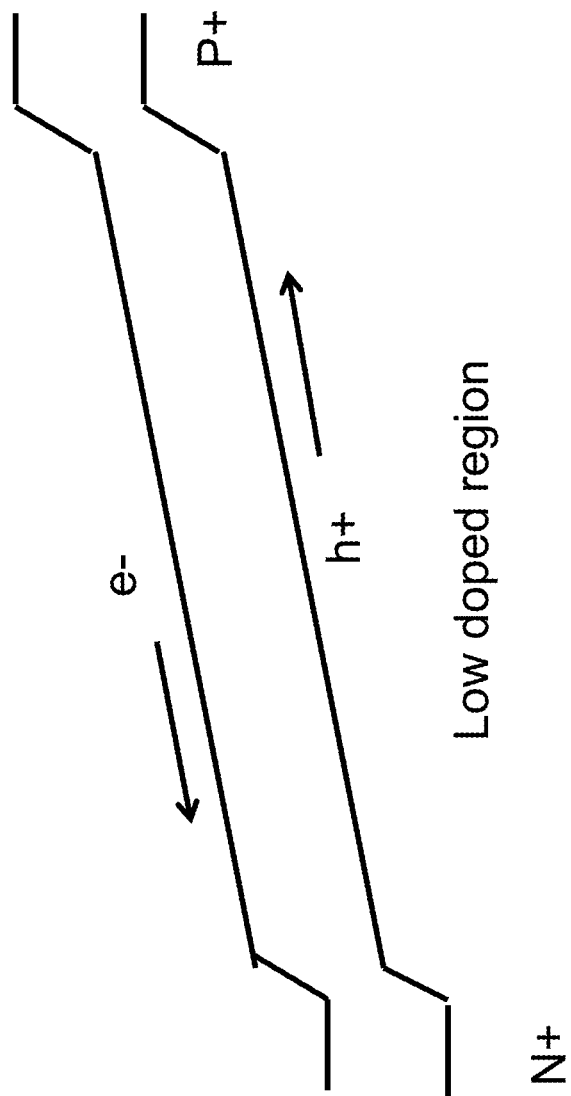

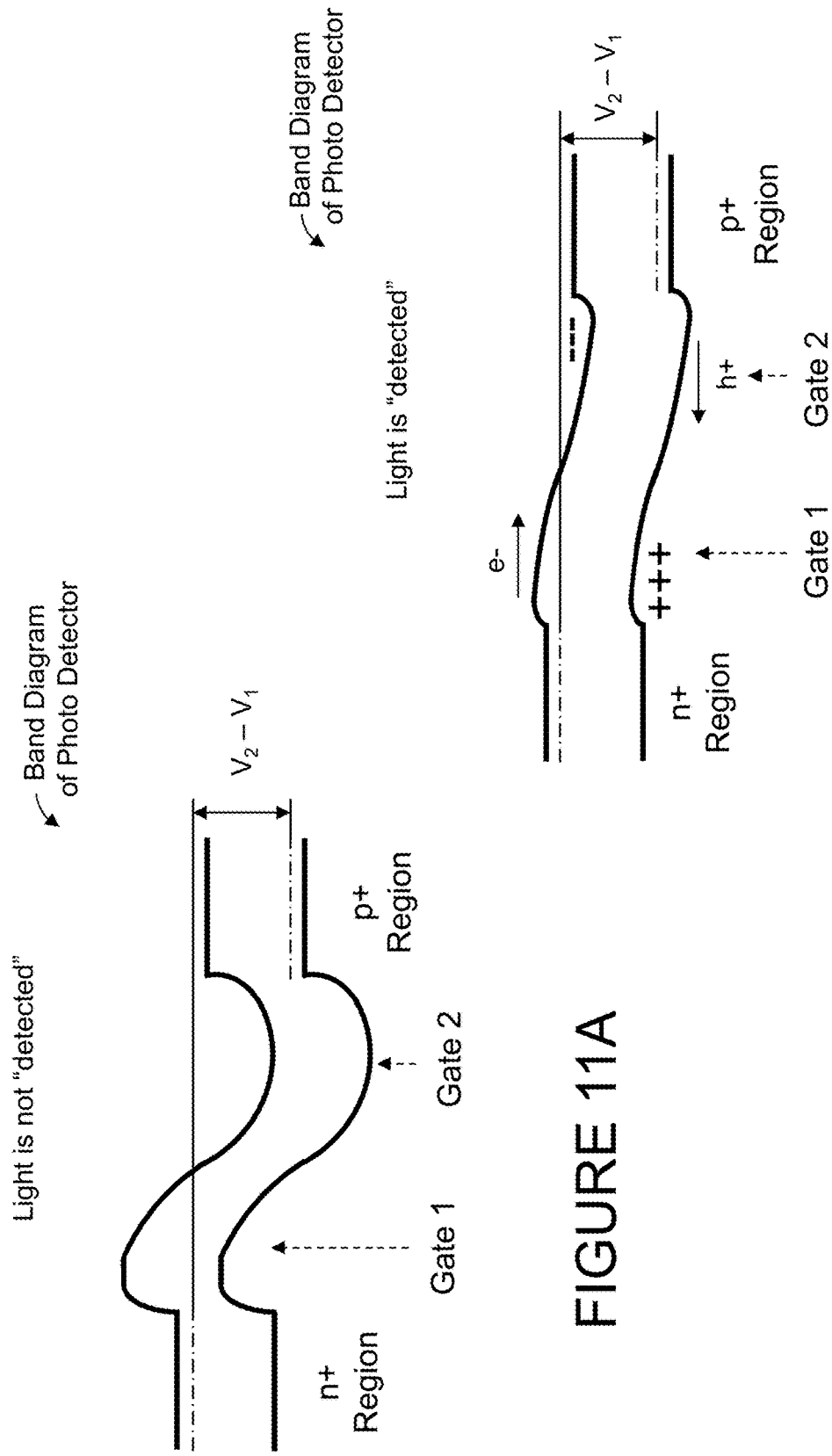

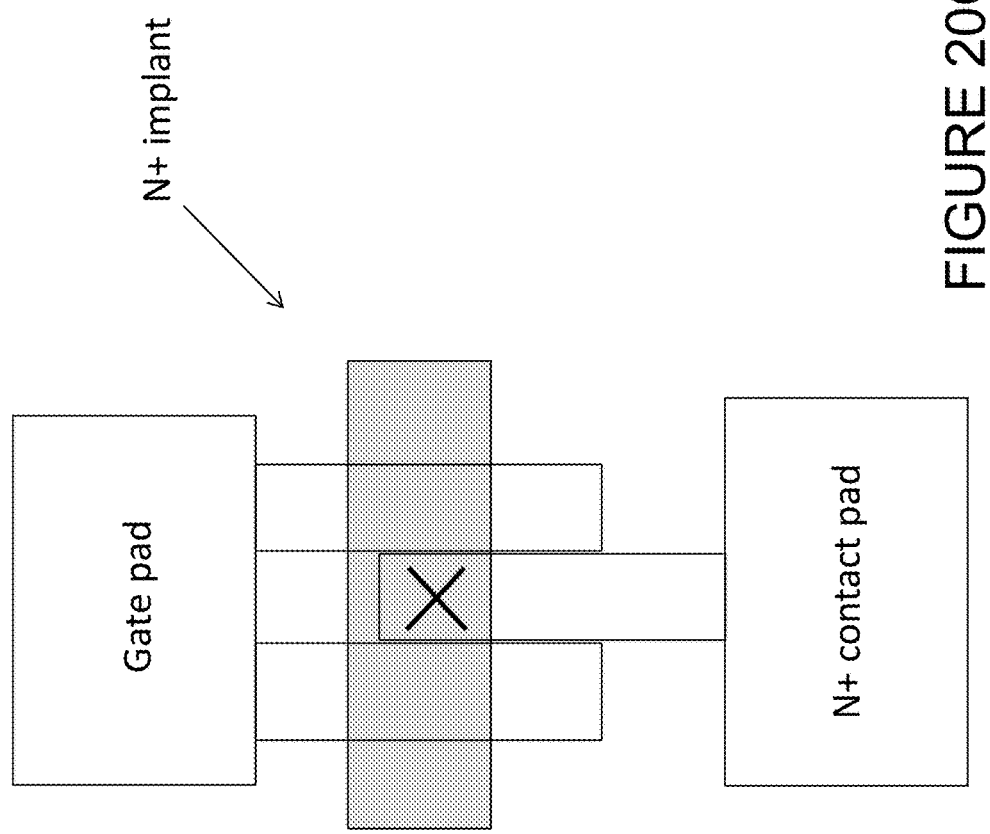

PHOTO DETECTOR SYSTEMS AND METHODS OF OPERATING SAME

RELATED APPLICATION

This patent application is a continuation-in-part of U.S. patent application Ser. No. 14/194,928, filed Mar. 3, 2014, which claims priority to U.S. Provisional Patent Application No. 61/786,781, filed Mar. 15, 2013, the contents of which are incorporated by reference herein in their entirety.

INTRODUCTION

There are many inventions described and illustrated herein, as well as many aspects and embodiments of those inventions. In one aspect, the present inventions relate to, among other things, monolithic detectors or sensors to detect light (for example, output from an optical fiber) and, in response thereto, to generate an electrical signal. In another aspect, the present inventions also relate to methods of controlling such monolithic light sensors or photo detectors (whether such sensors/detectors are discrete devices or integrated with other circuitry, for example, communication receivers and/or transceivers). Notably, the monolithic light sensors or photo detectors of the present inventions may be implemented in high-speed data communication systems that employ an optical fiber for data transmission.

In some embodiments, a dynamic photodiode may include a substrate and a first doped region disposed on the substrate, where the first doped region may include a first contact that may receive a first voltage. The dynamic photodiode may include a second doped region disposed on the substrate. The second doped region may include a second contact that may receive a second voltage. A first resettable doped region may be disposed on the substrate between the first doped region and the second doped region. The first resettable doped region may include a first resettable contact that may receive a reset voltage or be set as an open circuit, and a first light absorbing region disposed on the substrate between the first doped region and the second doped region. The first light absorbing region may generate first electron-hole pairs in the substrate. First electron-hole pairs may be generated in the substrate when the first resettable contact is set as an open circuit, and the first electron-hole pairs may be removed from the substrate when the first resettable contact receives the reset voltage.

In some embodiments, the reset voltage may be a positive voltage value. The positive voltage value may be greater than or equal to 1 volt, but may be less than or equal to 3.3 volts.

In some embodiments, the dynamic photodiode may include a third doped region disposed on the substrate. The third doped region may include a third contact that is grounded.

In some embodiments, the dynamic photodiode may include a fourth doped region disposed on the substrate. The fourth doped region may include a fourth contact configured to receive the first voltage.

In some embodiments, the dynamic photodiode may include a second resettable doped region disposed on the substrate between the second doped region and the fourth doped region. The second resettable doped region may include a second resettable contact configured to receive the reset voltage or be set as an open circuit.

In some embodiments, the dynamic photodiode may include a second light absorbing region disposed on the substrate between the second doped region and the fourth doped region. The second light absorbing region may generate second electron-hole pairs in the substrate, wherein the second electron-hole pairs may be generated in the substrate when the second resettable contact is set as an open circuit, and the second electron-hole pairs may be removed from the substrate when the second resettable contact receives the reset voltage.

In some embodiments, the first doped region, second doped region, first resettable region, second resettable region, and fourth doped region may be linear regions arranged parallel to each other.

In some embodiments, the first doped region may be an n+ doped region, the second doped region may be a p+ doped region, the first resettable region may be an n+ doped region, the second resettable region may be an n+ doped region, and the fourth doped region may be an n+ doped region.

In some embodiments, the first doped region may surround the first resettable doped region.

In some embodiments, the first resettable doped region may surround the second doped region.

In some embodiments, the first doped region may be an n+ doped region, the second doped region may be a p+ doped region, the first resettable doped region may be an n+ doped region, and the third doped region may be a p+ doped region.

In some embodiments, the third doped region may surround the first doped region.

In some embodiments, the first doped region may be an n+ doped region, the second doped region may be a p+ doped region, and the first resettable region may be an n+ doped region.

In some embodiments, the dynamic photodiode may include a back contact attached to a first side of the substrate opposite to a second side of the substrate where the first doped region, second doped region, first resettable region, and first resettable doped region may be disposed.

In some embodiments, the back contact may be grounded.

In some embodiments, the back contact may be etched into the substrate.

In some embodiments, a doped layer may be arranged between the back contact and the substrate.

In some embodiments, the doped layer may be p+ doped.

In some embodiments, a well may be arranged below the third doped region and may extend the third contact into the substrate via the third doped region.

In some embodiments, the well may have the same doping type as the third doped region.

In some embodiments, the dynamic photodiode may further include an epi-layer disposed underneath the first doped region, the second doped region, the first resettable doped, and the first light absorbing region, and a buried oxide region that may be disposed underneath the epi-layer, the buried oxide region contacting the substrate.

In some embodiments, the dynamic photodiode may further include comprising an epi-layer disposed underneath the first doped region, the second doped region, the first resettable doped, and the first light absorbing region, and an epitaxial layer disposed underneath the epi-layer. The epitaxial layer may contact the substrate.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It should be understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as exemplary should not to be construed as preferred or advantageous, for example, over other embodiments or implementations; rather, it is intended reflect or indicate the embodiment or embodiments as an example embodiment(s).

FIGS. 4-7 depicts the stages of operation of the photo detector from an energy band diagram perspective, in accordance with certain aspects of the present inventions, wherein a first voltage (for example, a negative voltage which, in this exemplary embodiment, may be −5V) may be applied to the photo detector to reverse bias and/or maintain the photo detector in a detection hold state (FIG. 4—reverse bias voltage applied (i.e., no detection control signal applied to photo detector) to photo detector; photo detector in a non-detection state via applied hold voltage—charge carriers may be "removed" from low doped region); wherein a second voltage (for example, a positive voltage which, in this exemplary embodiment, may be 1V) may be applied to the photo detector to place the detector in a detection ready state wherein potential barriers adjacent to the n+ and p+ regions blocks or prevents (significant) current flow (FIG. 5—energy band diagram immediately after switching to the forward bias: photo detector is in a detection ready state; potential barriers adjacent to the n+ and p+ regions of the photo detector block or prevent (significant) current flow); in the presence of incident light, carriers generated by light accumulate in the regions adjacent to the n+ and p+ of the photo detector; light generated carriers reduces potential barriers adjacent to the n+ and p+ regions of the photo detector (FIG. 6—the carriers generated by light accumulate in the regions adjacent to the n+ and p+ regions of the photo detector; light generated carriers reduces potential barriers adjacent to the n+ and p+ regions) such that current flows between n+ and p+ regions of the photo detector in the presence of detected light and in response to the control signal applied by the control circuitry wherein under these circumstances the detector is in a detect state (FIG. 7—current flows between n+ and p+ regions of the photo detector in the presence of detected light and in response to the control signal applied by the control circuitry; under these circumstances, the barriers eventually disappear and the forward current flows);

FIGS. 11A and 11B depict the general operation and/or response of the monolithic sensor or detector in connection with an energy band diagram, in accordance with certain aspects of the exemplary monolithic light sensors or photo detectors described and illustrated in the '891 application, wherein when the sensor does not detect or is not exposed to light, little to no current may flow between the p+ and n+ regions due to the barrier provided or caused by the voltages applied to the gates; however, when the sensor detects or is exposed to incident light from one or more light sources, the majority of the positive carriers (i.e., holes) move towards the region 1, disposed under gate 1 (Gate 1), and the majority of the negative carriers (i.e., electrons) move towards the region 2, disposed under gate 2 (Gate 2) and the excess of holes in the region 1 may provide, induce or cause a lowering of the potential barrier to electron movement and electron current flow from n+ region while the excess of electrons in the region 2 may provide, induce or cause a lowering of the hole barrier and hole current flowing from p+ region; under these circumstances, the sensor may be in a conductive state or mode which may provide a large internal current gain; additionally a positive feedback mechanism may accelerate accumulation of excess carriers under the respective gates, which, in turn, may reduce the potential barriers related corresponding to such regions and cause a current to flow between the p+ and n+ regions of the photo detector and an output current upon detecting or in response to the incident light;

FIGS. 20B-20E are top views illustrating certain fabrication techniques in relation to a CMOS process wherein the sensor includes n+ regions and p+ region (see, for example, the illustrative embodiments of FIGS. 10A, 13A, 14A and 14B), the p+ regions, gates and contact regions may be fabricated during or in relation to the CMOS process of fabricating the PMOS and NMOS transistors; in one embodiment, after forming the gates, an n+ implant may be performed wherein n+ area surrounded by two gates fabricated via CMOS processing (see "X" in FIG. 20B), and thereafter a contact to a portion of the n+ region may be formed (see FIG. 20C), the p+ regions may be formed in a similar manner wherein in one embodiment, after forming the gates, an p+ implant may be performed wherein n+ area surrounded by two gates fabricated via CMOS processing (see FIGS. 20D and 20E); notably, FIG. 20F illustrates a cross-section of the resulting or "final" structure; indeed, where the sensor does not include n+ regions as in several of the exemplary embodiments set forth herein, the n+ processing in connection with the sensor may be omitted;

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

Figure 1:
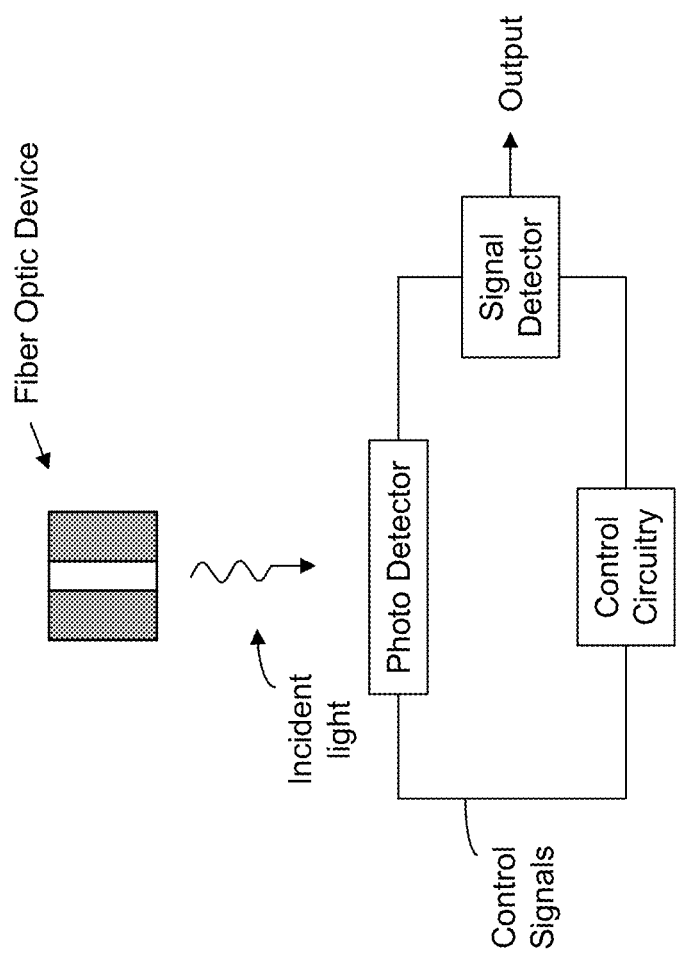
FIG. 1 illustrates, in block diagram form, an exemplary embodiment of the present inventions including control circuitry to generate control signals, which may be applied to the photo diode, which in response such control signals and upon detecting incident light, generates an output current that may be detected by the signal detector; according to certain aspects and embodiments of the present inventions.
Figure 2:
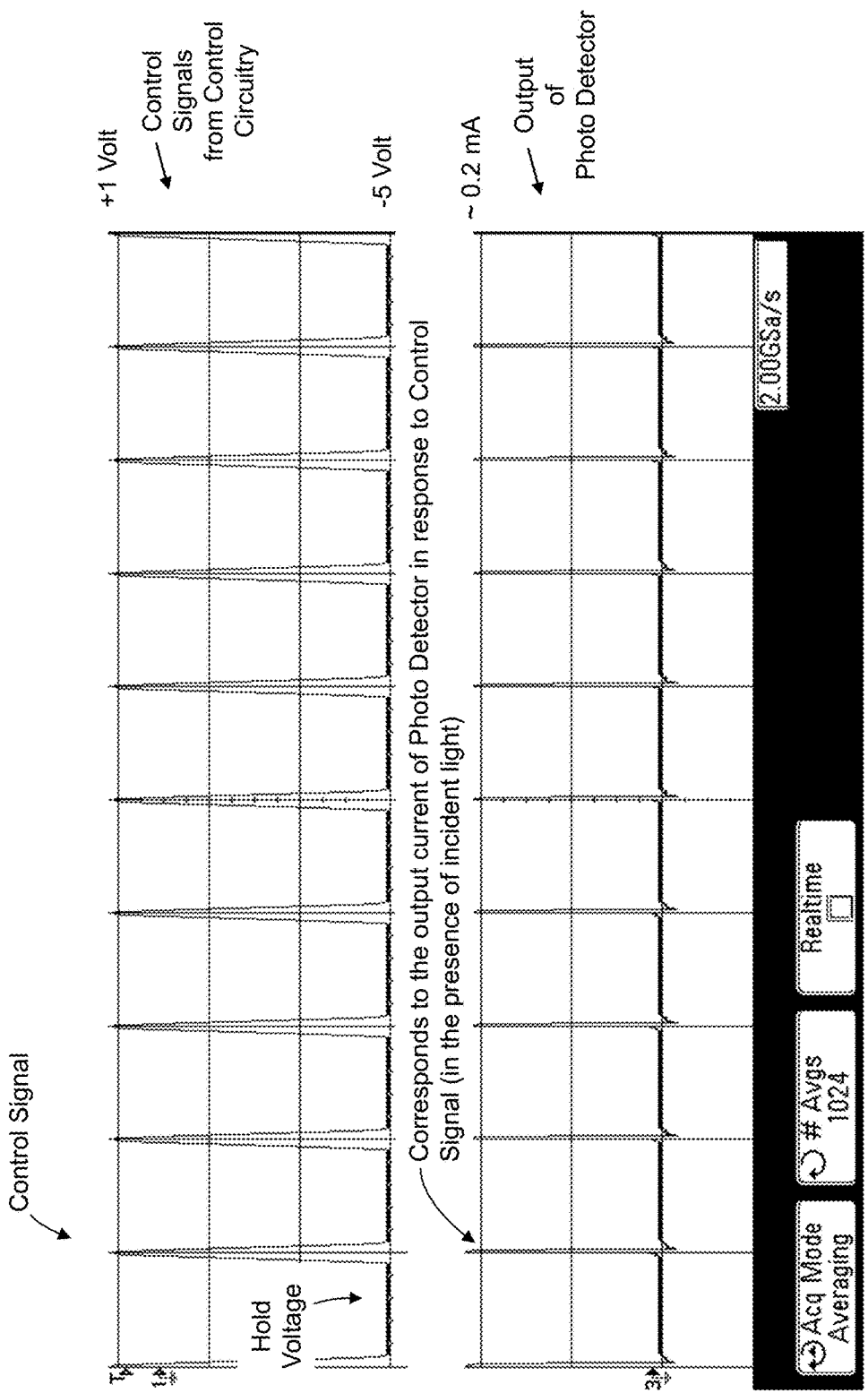
FIG. 2 illustrates exemplary control signals, which may be applied to the photo detector and the responsive output therefrom (notable, the output current of the photo detector may be applied to a 50 ohm impedance attached to the output of the photo detector in order to generate the output waveform)

There are many inventions described and illustrated herein. In one aspect, the present inventions are directed to a method of controlling a photo detector and/or array of photo detectors. With reference to FIG. 1, in a first embodiment, the system includes a photo detector, control circuitry to generate control signals and apply such control signals to the photo detector, which, in response, detects light incident thereon, and a signal detector according to an aspect of the present inventions. FIG. 2 illustrates the control signals and the response thereto by the photo detector (when light is incident thereon).

Notably, the present inventions may employ any photo diode or detector to implement the present inventions including the photo detector architectures of the '891 application. For example, with reference to FIGS. 3A-3C (which corresponds to the embodiment of FIGS. 10A-10C of the '891 application), the photo detector includes at least one control node or gate (illustrated in the exemplary embodiment as Gate 1), a light absorbing region, a first doped region (illustrated in the exemplary embodiment as p+ region) and a second doped region (illustrated as contact region). The contact region may be disposed and/or formed in the substrate region and on the major surface containing the p+ region(s) and the gates; and, in operation, may be an output of the photo detector. As mentioned herein, the contact region (regions) may be p+ or n+ region (regions).

The photo detector may be fabricated in or on silicon, (for example, a standard bulk silicon), silicon-germanium, gallium-arsenide or an insulator (for example, glass or the like) or fabricated in or on a semiconductor-on-insulator (SOI) substrate (for example, a silicon or germanium region/layer/material disposed on or over an insulator region/layer/material (for example, a silicon oxide, silicon nitride and/or combination thereof). Briefly, in this embodiment, the control nodes or gates (hereinafter "gates") may be comprised of a conductive type material (conductor or doped semiconductor), for example, a metal (for example, aluminum or copper), metal compound and/or a doped semiconductor (for example, silicon doped with donor or acceptor impurities). The gates may be spaced from the body region via an insulator or dielectric material (for example, silicon oxide, silicon nitride or combinations or composites thereof, for example, ONO).

The light absorbing region may be fabricated in or on the substrate. In one embodiment the body region may be an intrinsic or doped semiconductor (for example, intrinsic/undoped silicon, germanium or silicon-carbide or a lightly doped (with donor or acceptor impurities) silicon, germanium or silicon-carbide). Indeed, the light absorbing region may be one or more materials from the Group IV semiconductor including silicon, germanium, silicon carbide and/or combinations thereof (for example, silicon-germanium). The light absorbing region body may be an intrinsic material or a material having impurities, for example, n-type or p-type material(s).

As noted above, the photo detector includes at least one doped region—see, p+ regions. The doped semiconductor regions may be disposed and/or formed in or on the substrate. For example, the p-type semiconductor material may be formed in the substrate by doping the semiconductor with a p-type impurity (for example, boron). Notably, the doped semiconductor regions (p+ regions) may also be control nodes of the photo detector and, in operation, an output of the photo detector.

The contact region may be formed in the substrate region (for example, via conventional lithographic, etching and deposition techniques) and may be comprised of a conductive type material (conductor or semiconductor), for example, a metal (for example, aluminum or copper), metal compound and/or a doped semiconductor (for example, silicon, silicon-germanium or gallium arsenide doped with donor or acceptor impurities). The contact region may be an acceptor type material such as p+ doped silicon, germanium, silicon-germanium, silicon-carbide or gallium arsenide. Indeed, in one embodiment, the contact region may be a p+ type material consisting of one or more materials from the Group IV semiconductor including silicon, germanium, silicon carbide and/or combinations thereof.

In another embodiment, the contact region may be formed from a portion of the substrate region. For example, in one embodiment, using conventional lithographic and deposition techniques, the substrate may be doped with acceptor type dopants forming, for example, p+ doped silicon, germanium, silicon-germanium, silicon-carbide or gallium arsenide. In one embodiment, the dopant may be boron or aluminum to provide or incorporate atoms (acceptors) into a selected portion of the substrate region in order to increase the number of free charge carriers (in this case positive carriers or holes).

Notably, the substrate region photo detector in the exemplary embodiment may be a semiconductor on insulator (SOI) substrate (for example, a silicon or germanium region/layer/material disposed on or over an insulator region/layer/material (for example, a silicon oxide, silicon nitride and/or combination thereof) or a silicon, (for example, a standard bulk silicon), silicon-germanium, gallium-arsenide and/or combination thereof.

Importantly, the photo detector may be fabricated using any materials and/or techniques now known, described herein, and/or later developed.

Briefly, in response to incident light, electron-hole pairs form and may be separated by an electric field (formed by applying selected voltages to the contact region (for example, a negative voltage ($V_C<0V$)), gates (for example, greater than 4V ($V_{G1}>4V$)) and p+ region (for example, $V_1=+3V$)) wherein positive carriers (i.e., holes) flow to the p+ contact region and the negative carriers (i.e., electrons) flow to portions of the body region near and/or beneath the gates. Electrons accumulate near and/or beneath the gates and, in response thereto, positive carriers (i.e., holes) from the p+ region juxtaposed the gates, flow to the contract region (here a p+ contact region). As excess electrons accumulate in the body region located near and/or beneath the gates, the electron barrier (band gap) may be lowered therein. This results in an additional and/or greater hole current flow from the p+ regions through a portion of the substrate region to the contact region. That is, an additional and/or greater hole current may be created and flows from the p+ regions through a portion of the body region and the light absorbing region to the p+ contact region thereby increasing the magnitude of the output current. In this way, the photo detector may be in a conductive state or mode which may provide a large internal current gain. The current flows between the p+ region and the contact region and an output current upon detecting or in response to the incident light.

Figure 3A:
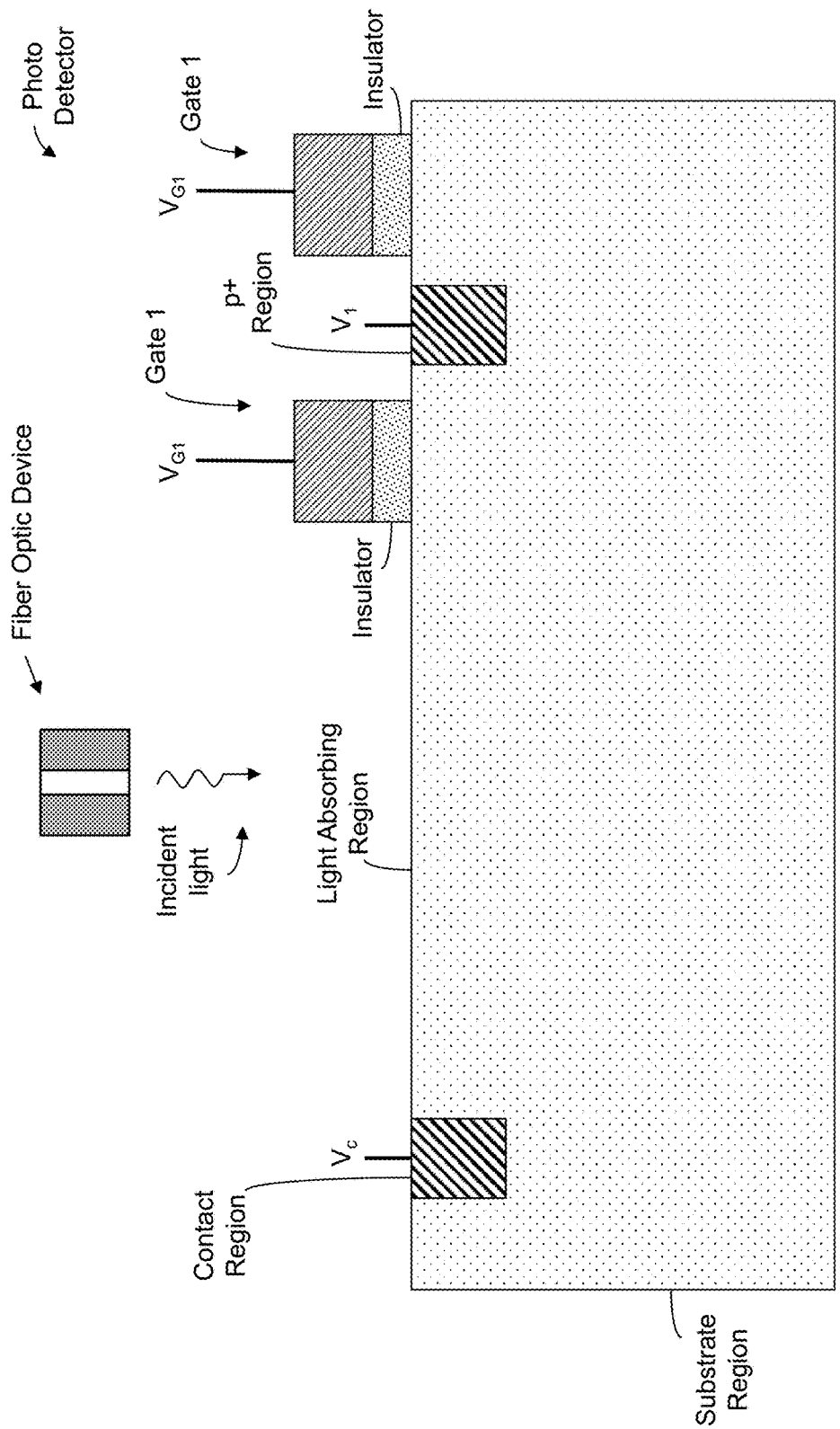
FIG. 3A is a cross-sectional view of an exemplary monolithic light sensor or photo detector described and illustrated in the '891 application (see, FIG. 10A thereof) wherein the contact region of this illustrative sensor may be disposed on a top side (major surface) of the bulk substrate wafer/die.
Figure 3B:
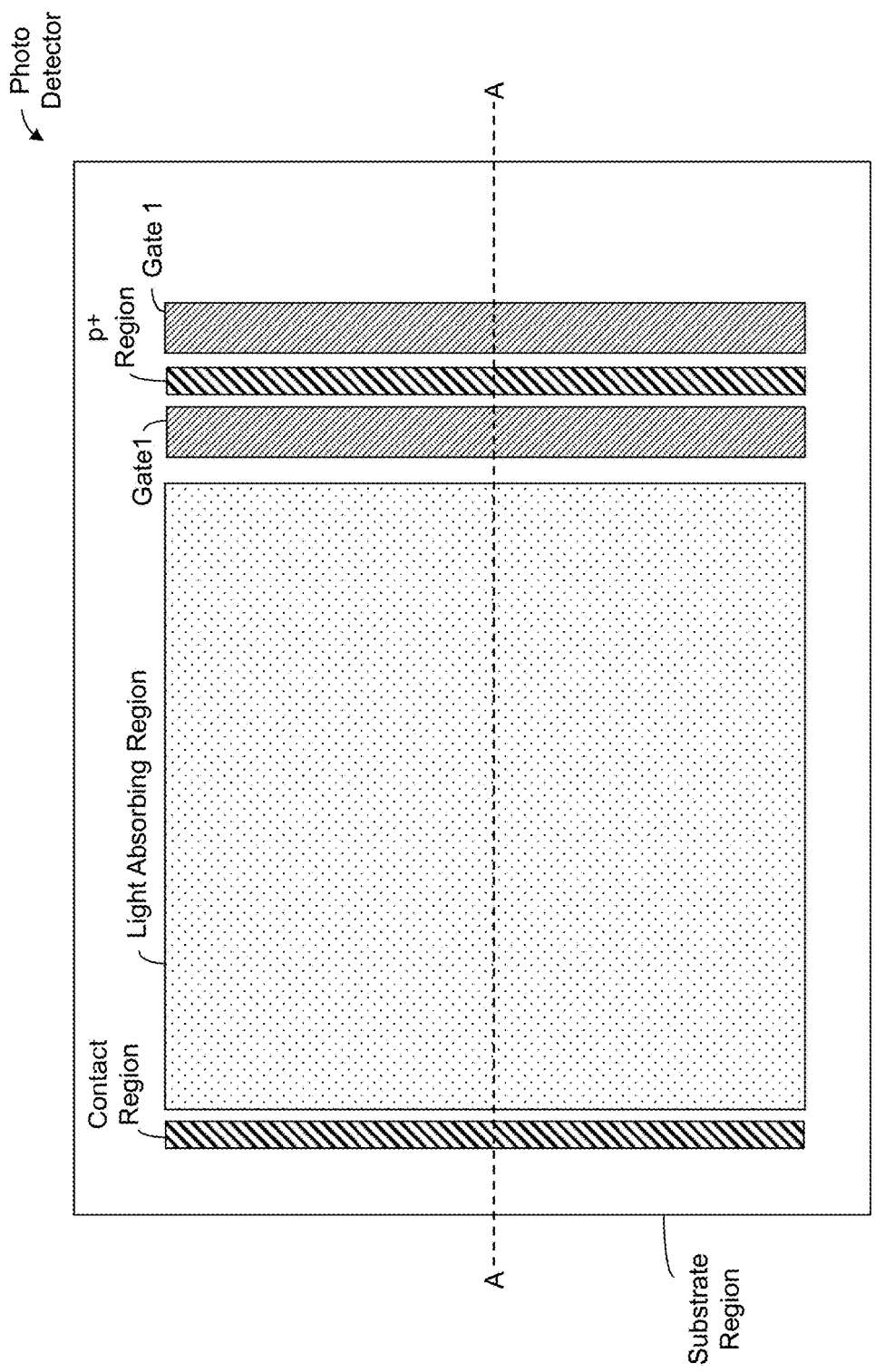
FIGS. 3B and 3C illustrate exemplary top views of the cross-sectional view of the photo detector of FIG. 3A wherein dotted lines A-A indicate the location of the cross-sectional view of FIG. 3A wherein such photo detector and top views of the cross-sectional view of the photo detector of FIG. 3A are described and illustrated in the '891 application (see, FIGS. 10B and 10C thereof); although the contact region of this exemplary embodiment of FIGS. 3A-3C is often described as a p+ region, in another embodiment, the contact region may be an n+ region.
Figure 3C:
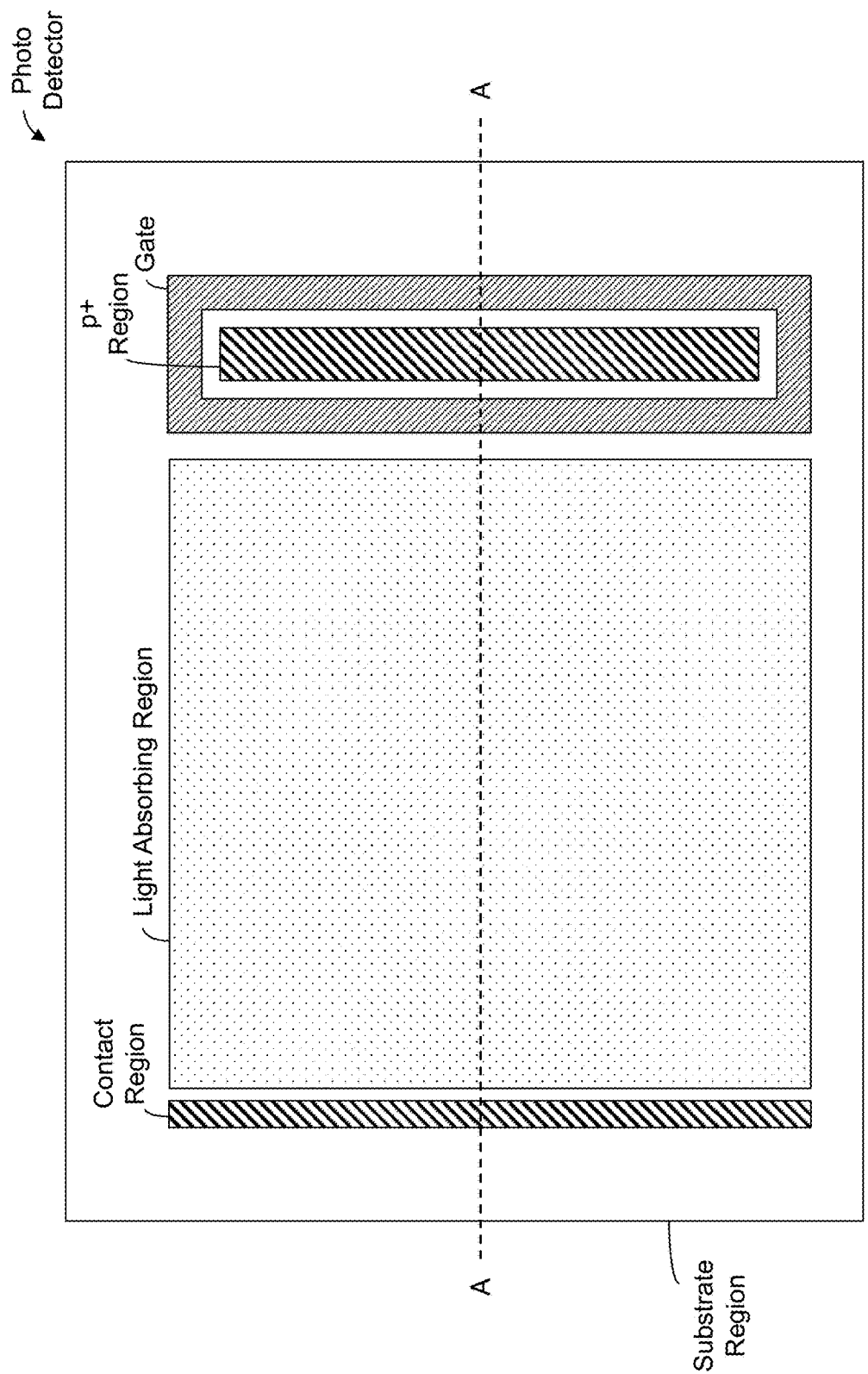
Figure 5:
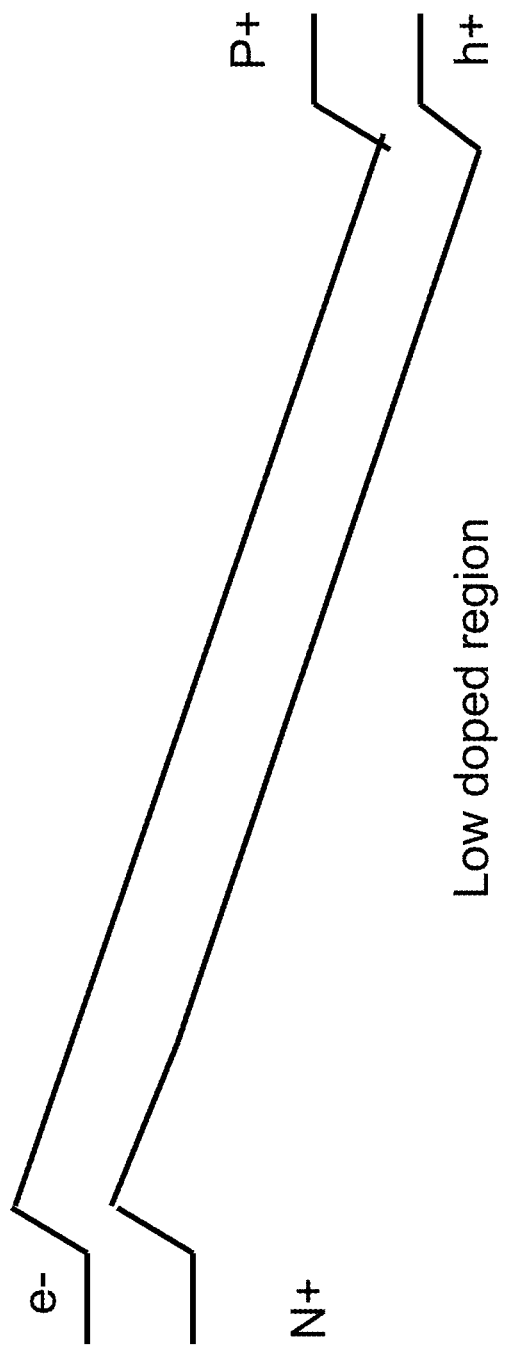
Figure 6:
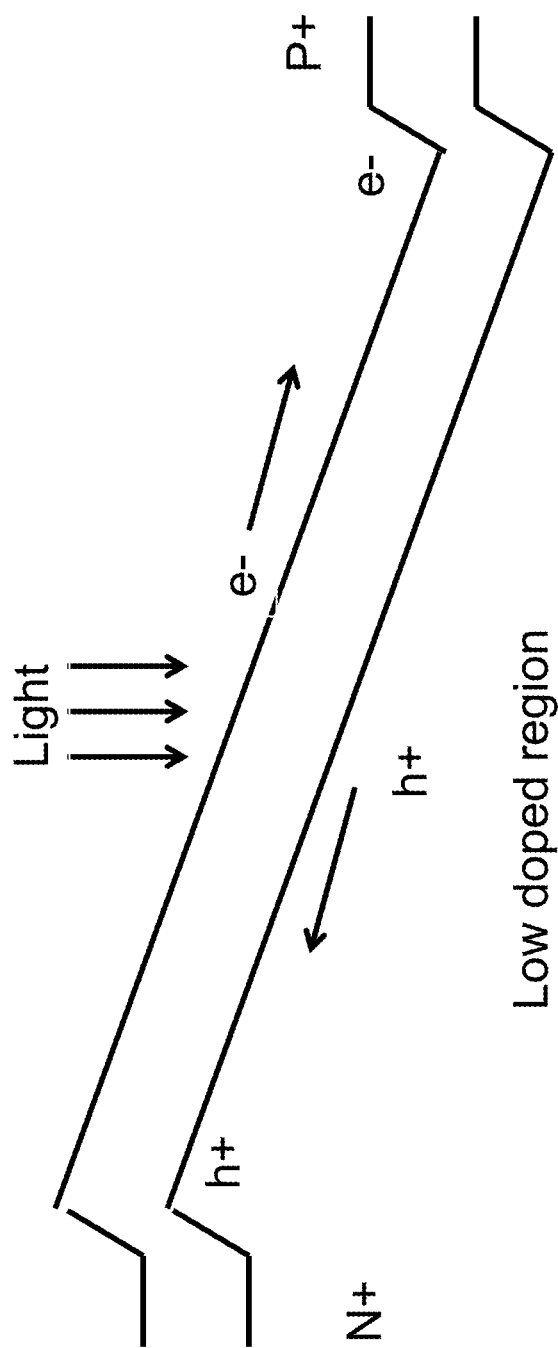
Figure 7:
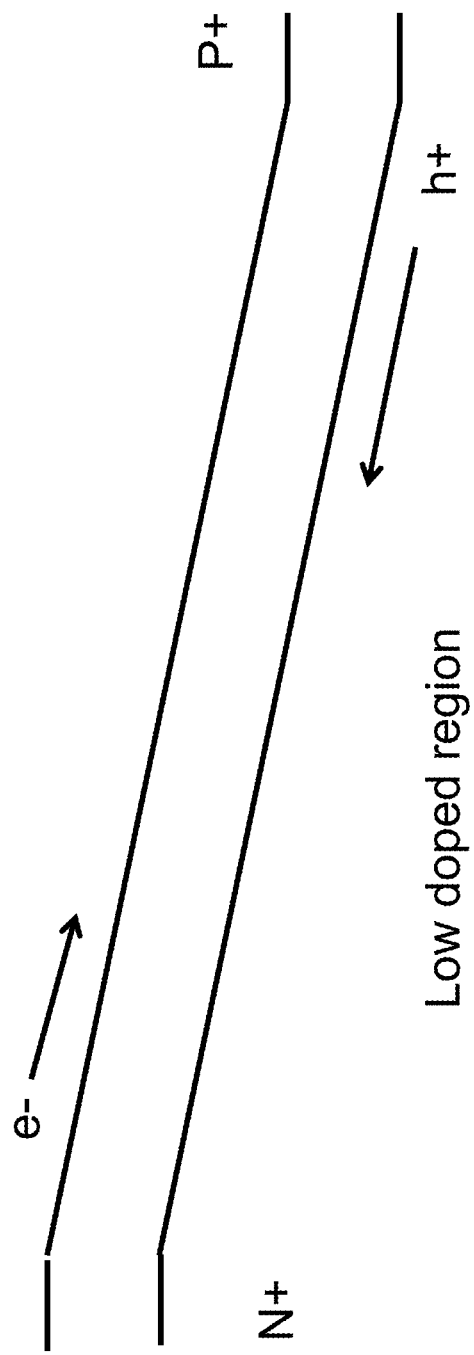

FIGS. 3B and 3C illustrate exemplary top views of the cross-sectional views of the photo detectors of FIG. 3A wherein dotted lines A-A in FIGS. 3B and 3C indicate the location of the cross-sectional views of FIG. 3A. Notably, although the contact regions of the exemplary embodiments of FIGS. 3A-3C have been described as a p+ region, in another embodiment, the contact region may be an n+ type.

With reference to FIGS. 2-7, in one embodiment, the circuitry and techniques of the present inventions may maintain the photo detector in a non-detection state via application of a reverse bias voltage being applied to the photo detector (i.e., no detection control signal applied to the photo detector). In this regard, the photo detector may be in a non-detection state via application of the hold voltage wherein charge carriers may be "removed" from low-doped region. In one exemplary embodiment, the hold voltage may be −5V. (See, FIGS. 2 and 4). Notably, in the non-detection state, little to no current flows through the photo detector regardless of the presence of incident light. Moreover, in operation, in the absence of incident light, little to no current flows through the photo detector regardless of the state of the photo detector and/or control signals.

The circuitry and techniques of the present inventions may place the photo detector in a ready state via application of a detect voltage wherein potential barriers adjacent to the n+ and p+ regions block or prevent current flow (for example, significant current flow). (See, FIG. 5). The detect voltage, for example, +1V in this exemplary embodiment, places the photo detector in a forward bias state. Here, there is no light incident on the photo detector and, as such, little to no current flows through the photo detector.

When light is incident on the photo detector, carriers generated by light accumulate in the regions adjacent to the n+ and p+ regions thereby reducing potential barriers adjacent to the n+ and p+ regions. (See, FIG. 6). In response, a substantial current flows between n+ and p+ regions in the presence of light incident on the photo detector. Under these circumstances, the barriers eventually disappear and the forward current flows. (See, for example, FIGS. 2 and 7).

The illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to n+ region and p+ region) may become or may be positive and negative.

Moreover, the detection time or triggering time of the photo detectors of the present inventions may be programmable or tunable, for example, to meet or accommodate response time specifications as well as power consumption specification. In one embodiment, the voltages applied to the n+ region and p+ region may be adjusted to decrease the response time of the photo detector—for example, by increasing the electric field within the body region. Here, the electric field between the n+ region and p+ region and associated region may be adjusted (for example, increased) to adjust the response time (for example, decrease) of the photo detector. In another embodiment, the voltages applied to the n+ region and p+ region may be adjusted to reduce the power consumption of the photo detector. Thus, the response time and/or power consumption may be controlled, adjusted and/or programmed to, for example, accommodate desired/required specifications of the photo detector. All permutations response time and/or power consumption, and combinations of thereof, are intended to fall within the scope of the present inventions.

In addition thereto, or in lieu thereof, in one embodiment, the photo detector may be placed in a predetermined or non-detection state before sensing the light (or data) via application of a hold voltage. For example, carriers may be removed from the low-doped region prior to sensing so that the concentration of carriers in that region at the initiation of sensing may be below a predetermined value. In one embodiment, the photo detector may be placed in a predetermined or non-detection state by applying a reverse bias voltage to the first and second doped regions to remove carriers from the body region. Establishing the photo detector in a predetermined or non-detection state (for example, periodically) before sensing may enhance or increase the stability and/or accuracy of the photo detector during sensing.

In one embodiment, the photo detector includes at least two doped regions—a p+ region and an n+ region. The doped semiconductor regions may be disposed and/or formed in or on the substrate and juxtaposed the low doped region. For example, the p-type semiconductor material may be formed in the substrate by doping the semiconductor with a p-type impurity (for example, boron).

The low-doped region may be fabricated in or on the substrate. In one embodiment, the body region may be an intrinsic or doped semiconductor (for example, intrinsic/undoped silicon, germanium or silicon-carbide or a lightly doped (with donor or acceptor impurities) silicon, germanium or silicon-carbide). Indeed, the low-doped region may be one or more materials from the Group IV semiconductor including silicon, germanium, silicon carbide and/or combinations thereof (for example, silicon-germanium). The low-doped region may be an intrinsic material or a material having impurities, for example, n-type or p-type material(s).

Importantly, the photo detector may be fabricated using any materials and/or techniques now known, described herein, and/or later developed.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It should be understood that other embodiments may be utilized and operational changes may be made without departing from the scope of the present inventions. As such, the scope of the inventions should not be limited solely to the description above because the description of the above embodiments has been presented for the purposes of illustration and description.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, many of those permutations and combinations will not be discussed and/or illustrated separately herein.

Notably, the photo detectors of the present inventions may be implemented in a discrete device (for example, discrete photon receiver element) as well as in conjunction with any type of integrated circuitry (for example, integrated CMOS photon receiver circuitry), whether now known or later developed; all such configurations are intended to fall within the scope of the present inventions. Further, any manufacturing technique, whether now known or later developed, may be employed to fabricate the photo detector and/or photo detector-integrated circuit device of the present inventions; all such techniques are intended to fall within the scope of the present inventions.

Figure 8:
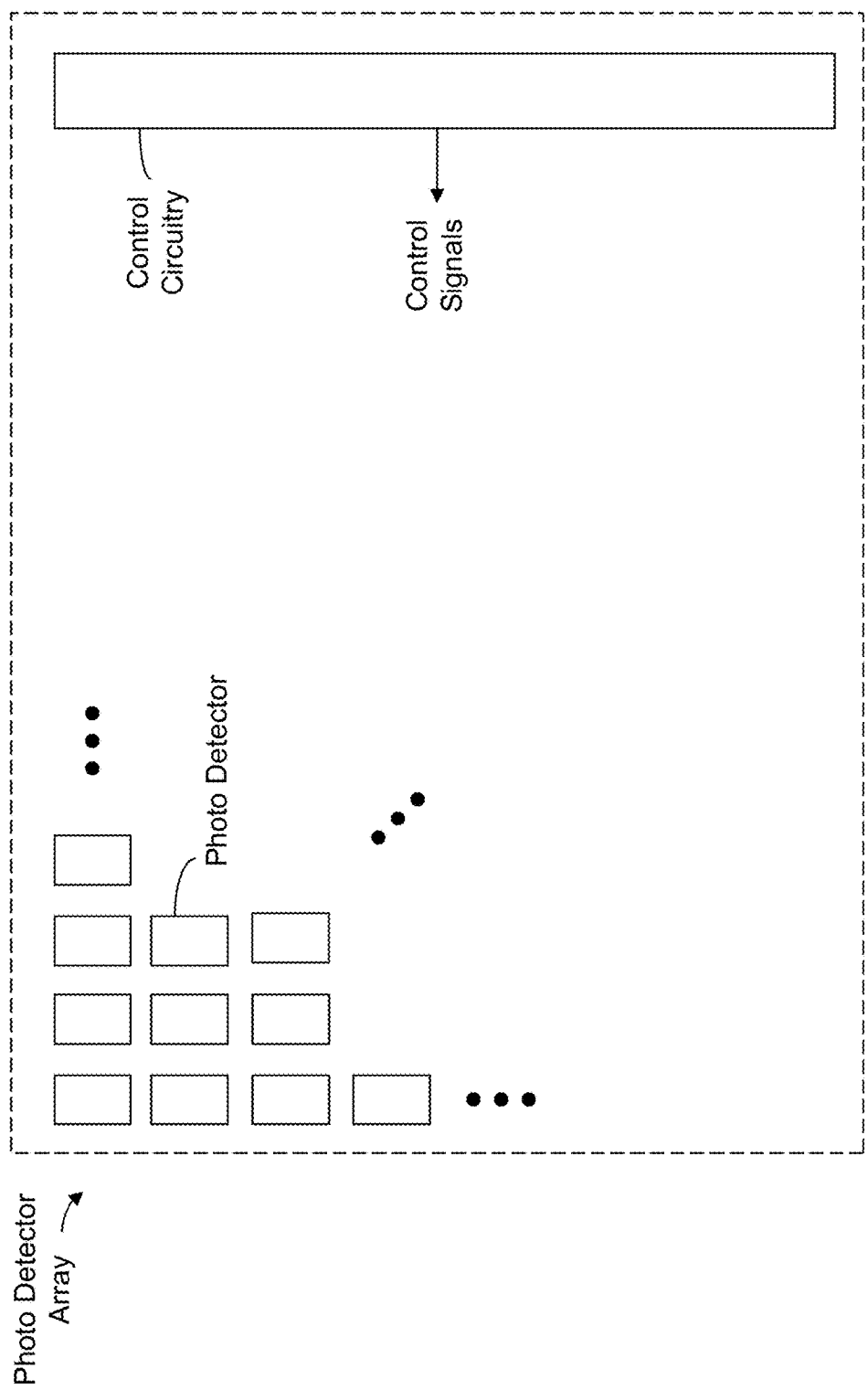
FIG. 8 illustrates an array of photo detector according to another aspect of the invention, wherein the photo detectors may be implemented via any of the embodiments described and/or illustrated herein; the array may include, in addition to the array of sensors, control circuitry to manage the acquisition, capture and/or sensing operations of the photo detectors of the array—for example, the control circuitry (which may be integrated on the same substrate as the sensors/detectors) may control or enable/disable the photo detectors or photo detectors in a manner so that data acquisition or sensing correlates to the data rate of the transmission; the photo detector or photo detector array may be coupled to a plurality of fiber optic output devices wherein each fiber optic device may be associated with one or more photo detectors of the array and the control circuitry may control or enable/disable the subset of photo detectors in accordance with the associated output of the fiber optic device.

In another aspect, the present inventions relate to an array of photo detectors according to any of the embodiments described and/or illustrated herein. The array may include, in addition to the array of photo detectors, control circuitry to manage the acquisition, capture and/or sensing operations of the photo detectors of the array. (See, for example, FIG. 8). For example, the control circuitry may control or enable/disable the photo detectors in a manner so that data acquisition or sensing correlates to the data rate of the transmission. In another embodiment, the photo detector array may be coupled to a plurality of fiber optic output devices wherein each fiber optic device may be associated with one or more photo detectors of the array and the control circuitry may control or enable/disable the subset of photo detectors in accordance with the associated output of the fiber optic device.

The photo detector array may be formed from a plurality of discrete devices and/or from a plurality of photo detectors integrated on a die wherein the photo detector array portion includes a plurality of photo detectors to acquire, capture, convert and/or sense the incident light from one or more associated fiber optic output(s). The photo detectors may be configured and/or arranged in any array architecture as well as in conjunction with any type of integrated circuitry, whether now known or later developed; all such configurations are intended to fall within the scope of the present inventions. Further, any manufacturing technique, whether now known or later developed, may be employed to fabricate the array (which includes a plurality of photo detectors) and/or photo detector array-integrated circuit device embodiments of the present inventions; all such techniques are intended to fall within the scope of the present inventions.

Figure 9:
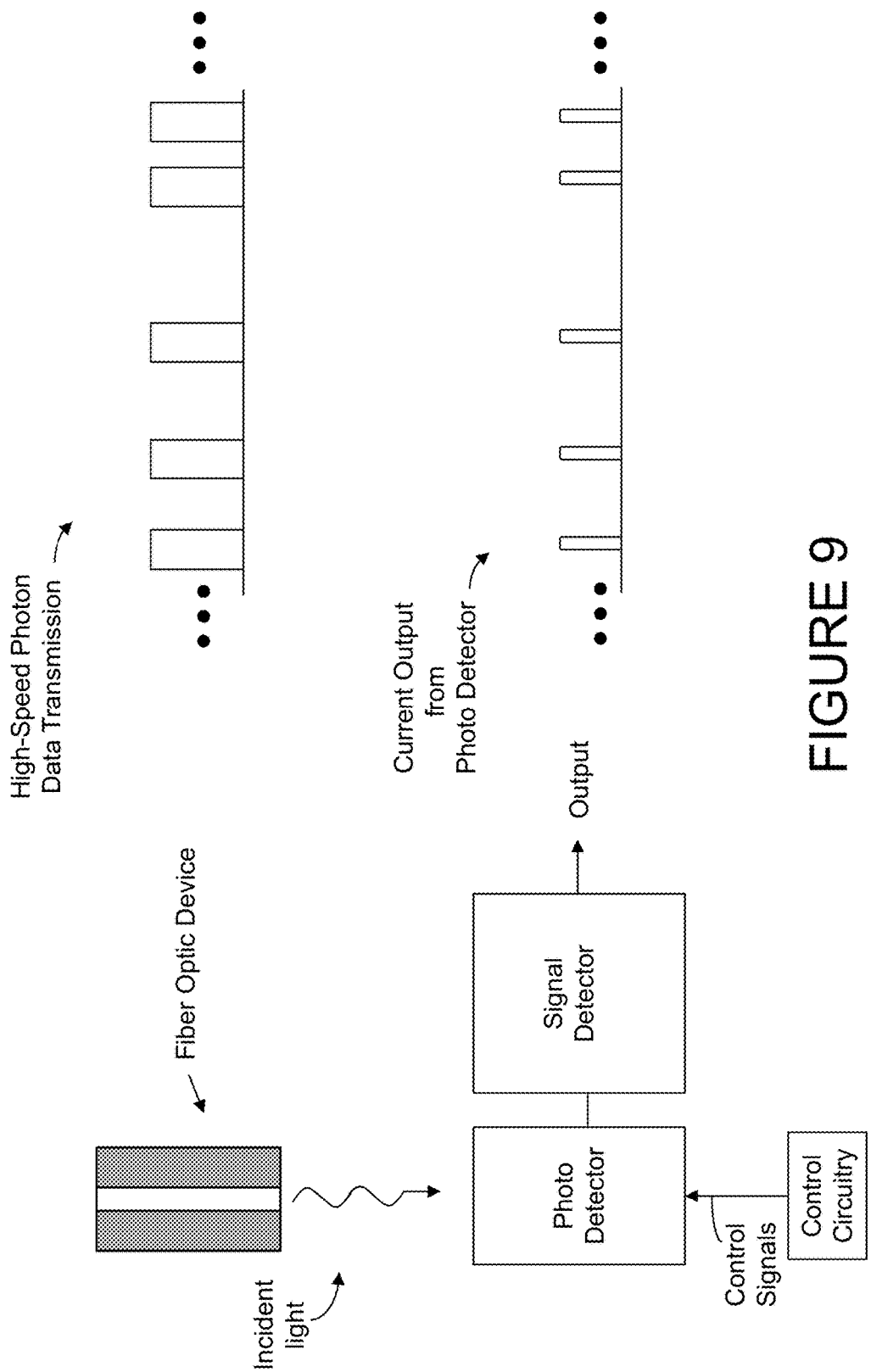
FIG. 9 illustrates the photo detector (in block diagram form) implemented in high-speed data transmission environment that employs photon data transmission (for example, via a fiber optic); the light sensor or photo detector may be implemented via any of the embodiments described and/or illustrated herein and may be coupled to a current amplifier or sensor (and other circuitry) to measure/condition the current output by the sensor (for example, output via the contact region and doped regions in response to the detection of light/data); notably, the current sensor may be a high-speed sense amplifier or the like—wherein all current sensing circuitry and architectures, now known or later developed, are intended to fall within the scope of the present inventions; moreover, the light sensor or photo detector may be discrete devices or integrated with the current amplifier or sensor (and/or other circuitry) as an integrated circuit.

As noted above, the present inventions may be implemented in high-speed data transmission that employs photon data transmission (for example, via a fiber optic). With reference to FIG. 9, the photo detector may be coupled to a signal detector (current detector and/or other circuitry) to measure/condition the current output by the photo detector (for example, output via the p+ and n+ doped regions in response to the detection of light/data in the exemplary embodiments illustrated in FIGS. 1, 2, 8 and 9). Notably, the current photo detector may be a high-speed current detector or the like. All current sensing circuitry and architectures, now known or later developed, are intended to fall within the scope of the present inventions.

Further, the p+ and n+ regions in the embodiments described and/or illustrated herein may be formed by or in a semiconductor (for example, silicon doped with acceptor/donor impurities).

Notably, the photo detector, photo detector array and/or die/device (including the photo detector and/or photo detector array) may include an anti-reflective material disposed there over or thereon. In one embodiment, an anti-reflective material may be disposed over or on the light absorbing region of the photo detector or photo detectors (of the array of photo detectors). In another embodiment, an anti-reflective material may be disposed on or over the entire structure, or a significant portion thereof.

As noted above, the present inventions may be implemented in a discrete photo detector or in an integrated circuit device having a photon receiver section (which may include one or more photo detectors (including an array of photo detectors)). Moreover, the photo detectors of the present inventions may be implemented in the standard planar technology (as illustrated herein) or any 3D technology (for example, planar or vertical type), or pillar architectures). The body region of the photo detector may or may not be electrically floating in view of the insulation or non-conductive region (for example, in bulk-type material/substrate). As illustrated herein, the photo detector may be formed on an SOI substrate or bulk silicon substrate.

As mentioned above, the present inventions may employ any of the photo diode or photo detector to implement the present inventions including the photo diode or photo detector layouts/architectures of the '891 application. An exemplary photo detector layouts/architectures of the '891 application is discussed above and illustrated in FIGS. 3A-3C. Other photo detector layouts/architectures of the '891 application are discussed immediately below.

Figure 10A:
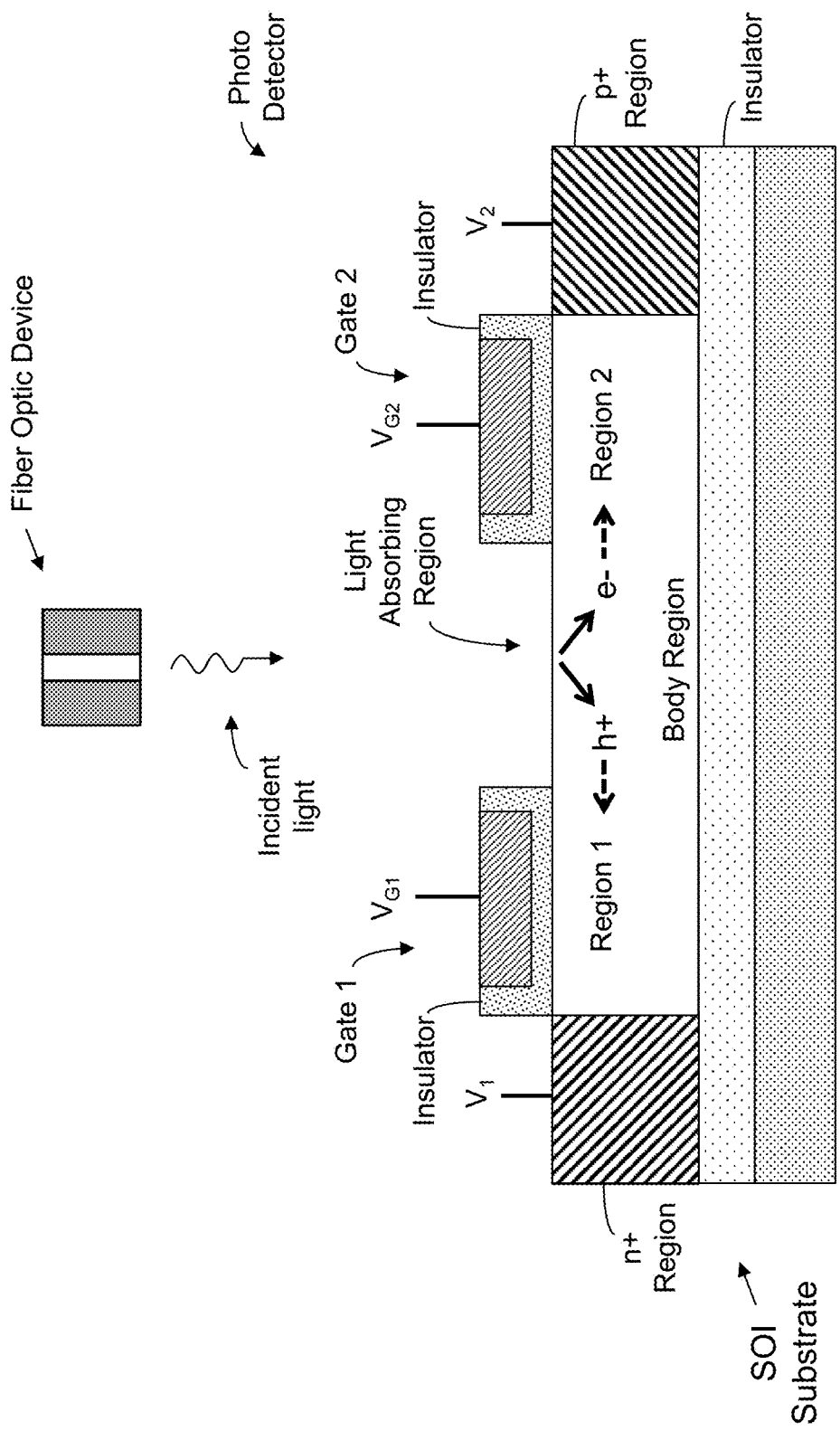
FIG. 10A is a cross-sectional view of an exemplary monolithic light sensor or photo detector described and illustrated in the '891 application wherein the sensor, in this illustrated embodiment, may be disposed in or on a semiconductor-on-insulator substrate (SOI substrate), for example, a silicon-on-insulator.
Figure 10B:
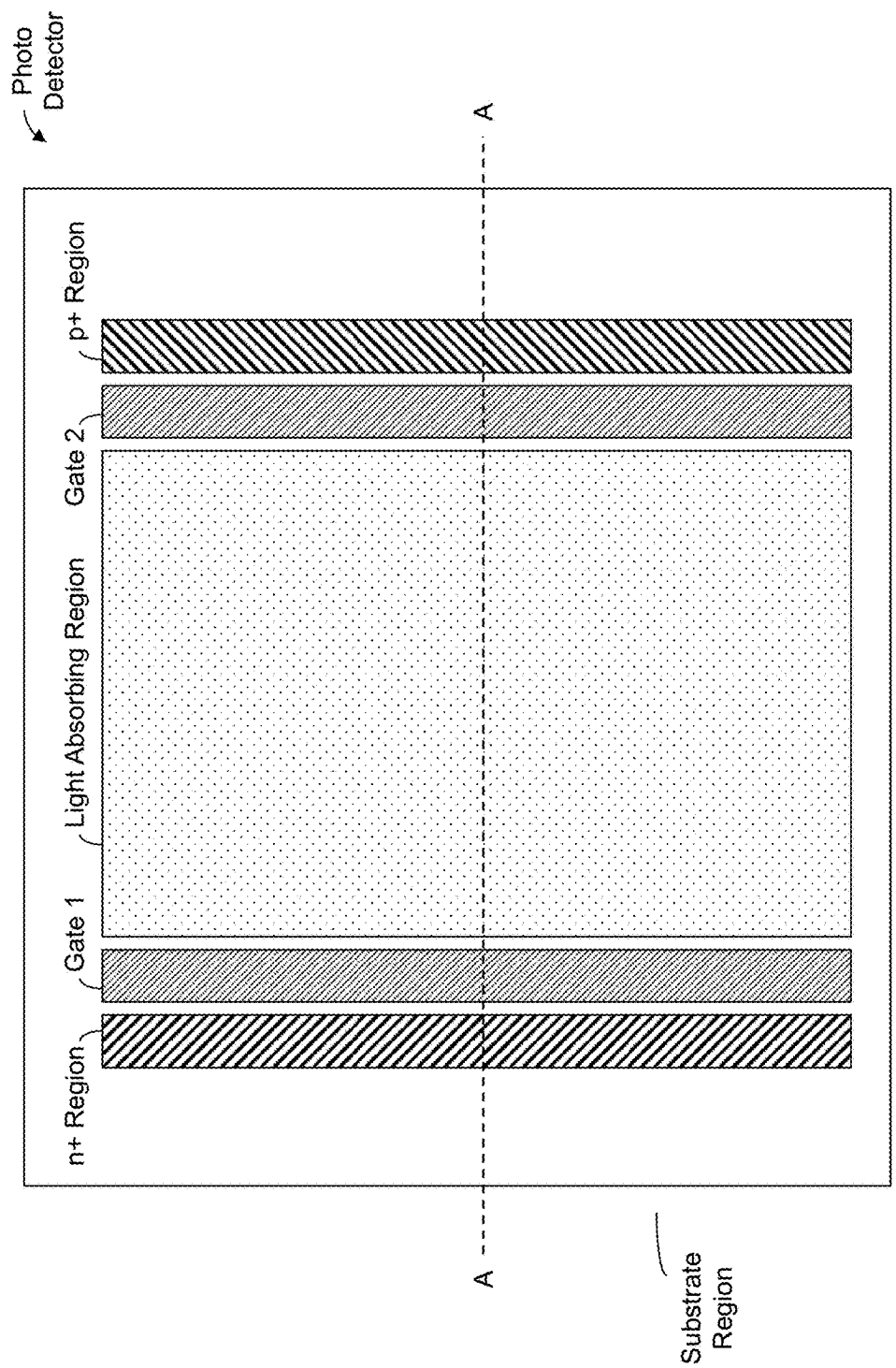
FIGS. 10B and 10C are illustrative top views of the exemplary monolithic photo detector of FIG. 1A described and illustrated in the '891 application; notably, with respect to FIG. 1C, gates 1 and 2 may be interconnected as a unitary structure which is identified or designated "Gate"
Figure 10C:
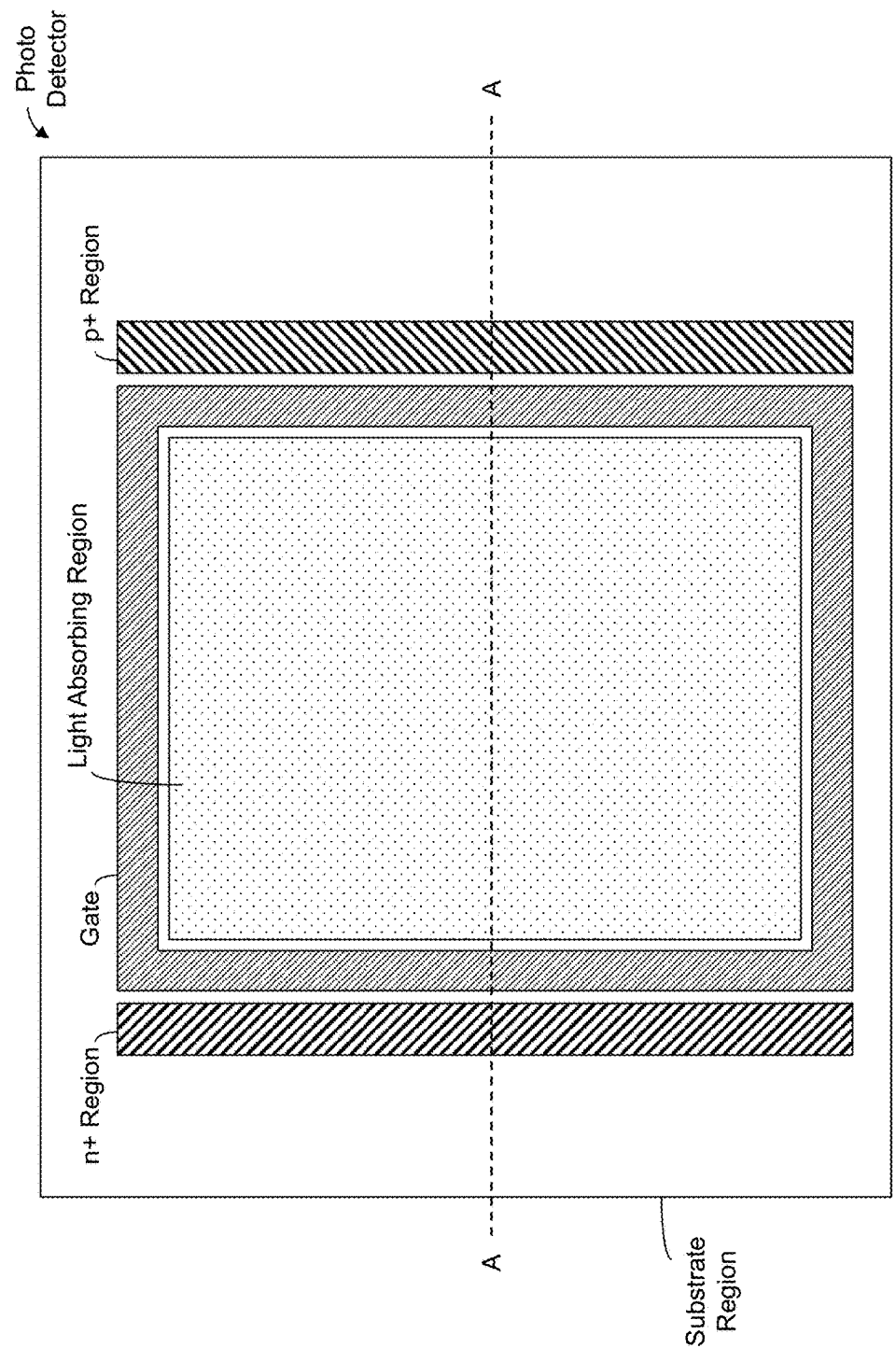

With reference to FIG. 10A, in one embodiment, a photo detector includes at least two control nodes or gates (illustrated in the exemplary embodiment as Gate 1 and Gate 2), a light absorbing region, a body region, a first doped region (illustrated in the exemplary embodiment as n+ region) and a second doped region (illustrated in the exemplary embodiment as p+ region). The photo detector, in this exemplary embodiment, may be fabricated in or on a semiconductor on insulator (SOI) substrate (for example, a silicon or germanium region/layer/material disposed on or over an insulator region/layer/material (for example, a silicon oxide, silicon nitride and/or combination thereof).

Briefly, in one embodiment, the control nodes or gates (hereinafter "gates") may be comprised of a conductive type material (conductor or semiconductor), for example, a metal (for example, aluminum or copper), metal compound and/or a doped semiconductor (for example, silicon doped with donor or acceptor impurities). The gates may be spaced from the body region via an insulator or dielectric material (for example, silicon oxide, silicon nitride or combinations or composites thereof, for example, ONO).

The body region may be an intrinsic or doped semiconductor (for example, intrinsic/undoped silicon or germanium or a lightly doped (with donor or acceptor impurities) silicon or germanium) including an intrinsic material or a material having impurities, for example, n-type or p-type materials. Indeed, the body region may be one or more materials from the Group IV semiconductor including silicon, germanium, silicon carbide and/or combinations thereof.

The photo detector according to this embodiment includes at least two doped semiconductor regions including n+ and p+ regions. These doped semiconductor regions may be formed within a semiconductor layer consisting of the body region. For example, the n-type semiconductor material may be formed from or by doping such semiconductor layer (for example, silicon layer) with an n-type impurity (for example, phosphorus or arsenic). The p-type semiconductor material may be formed from or by doping such semiconductor with a p-type impurity (for example, boron). Notably, the doped semiconductor regions (n+ and p+ regions) may be outputs of the photo detector.

Importantly, the photo detector may be fabricated using any materials and/or techniques now known, described herein, and/or later developed.

With continued reference to FIG. 10A, in operation, the photo detector may be enabled to detect incident light via application of selected or predetermined voltages to the gates and the doped regions (here, n+ and p+ regions). In one embodiment, a negative voltage applied to Gate 1 (for example, −2V), a negative or zero voltage may be applied to the n+ region, a positive voltage applied to Gate 2 (for example, 2V) and a positive voltage (for example, 1V) may be applied to the p+ region. Under these conditions and in this state, in response to light (for example, light which is output from a fiber optic device) incident on or applied to the light absorbing region of the photo detector, current flows between the n+ and p+ regions. That is, the applied or incident light may generate electron-hole pairs in the body region of the photo detector—where the electrons and holes of such pairs may be separated by an electric field within the body region. As noted above, the voltages (for example, static or fixed voltages) applied to the gates, n+ and p+ regions may create or provide the electric field within the body region.

Figure 12:
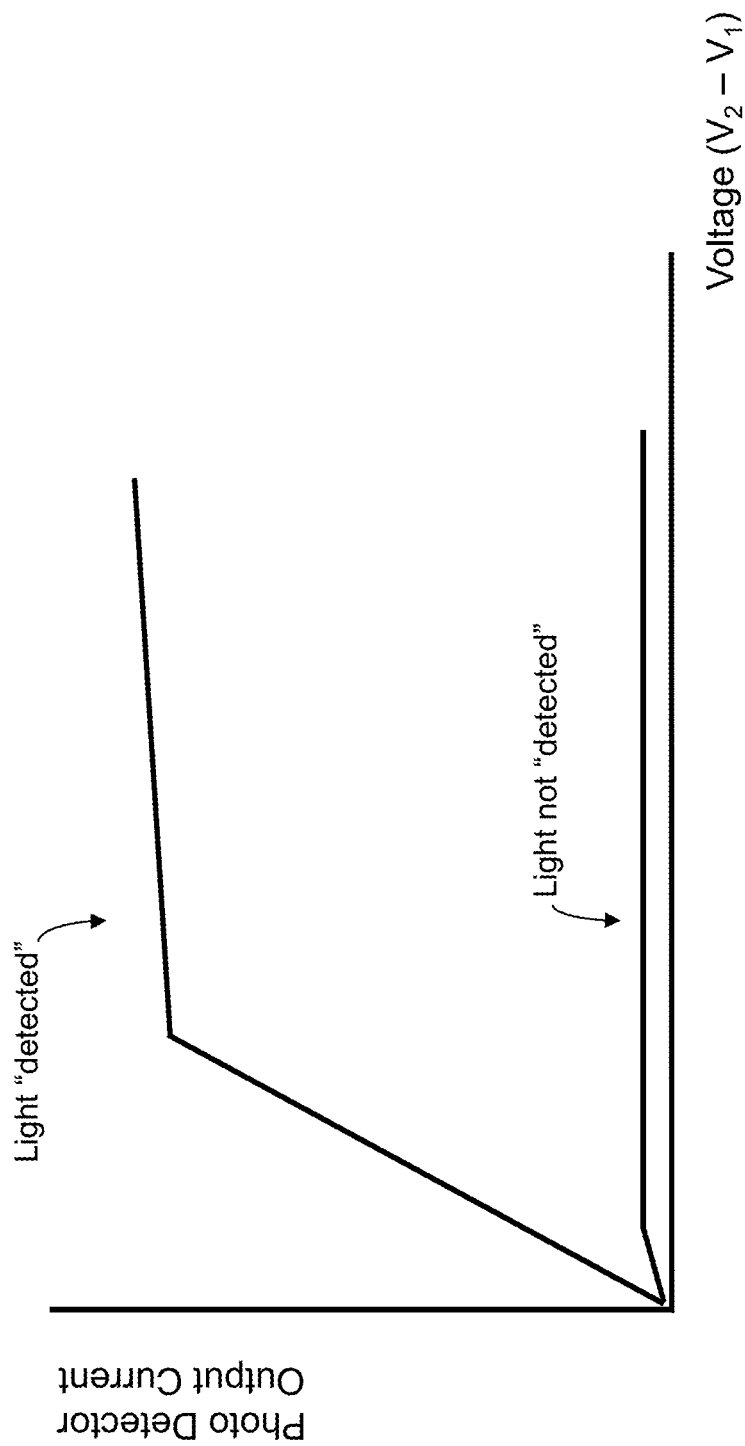
FIG. 12 is a graphical illustration of the relative output current of the light sensor or photo detector when the sensor detect light (i.e., light is "on") and when the sensor does not detect light (i.e., light is "off") in accordance with a change in voltage applied to the n+ and p+ regions.

In particular, positive carriers (i.e., holes) move towards the region 1, disposed under Gate 1, and negative carriers (i.e., electrons) move towards the region 2, disposed under Gate 2. The excess of holes in the region 1 will induce a lowering of the barrier to electron movement (band gap) and electron current flow from n+ region. Similarly, excess of electrons in the region 2 may provide, induce or cause a lowering of the hole barrier and hole current flowing from p+ region. (Compare, FIG. 11A and FIG. 11B). Under these circumstances, the photo detector may be in a conductive state or mode which may provide a large internal current gain. Additionally, a positive feedback mechanism may accelerate accumulation of excess carriers under the respective gates, which, in turn, may reduce the potential barriers related corresponding to such regions and cause a current to flow between the p+ and n+ regions of the photo detector and an output current upon detecting or in response to the incident light. (See, for example, FIG. 12).

Notably, in the absence of incident light, little to no current may flow between the p+ and n+ regions due to the barrier generated or caused by the voltages applied to Gates 1 and/or 2. (See, for example, FIGS. 11A and 12). Moreover, the photo detector may be disabled via removing/changing the voltages applied to one or more of Gate 1, n+ region, p+ region and/or Gate 2, and/or applying opposite polarity voltages to one or more of Gate 1, n+ region, p+ region and/or Gate 2. For example, increasing the amplitude on one or both of the voltages applied to the gates may place the sensor in a non-conductive state.

The illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to Gate 1, n+ region, p+ region and/or Gate 2) may become or may be positive and negative.

Moreover, the detection time or triggering time of the photo detectors may be programmable or tunable, for example, to meet or accommodate response time specifications as well as power consumption specification. In one embodiment, the voltages applied to the gates may be adjusted to increase the response time of the photo detector—for example, by increasing the electric field within the body region. Here, the electric field between the gate and associated region may be adjusted (for example, increased) to adjust the response time (for example, increase) of the photo detector. In another embodiment, the voltages applied to the gates may be adjusted to reduce the power consumption of the photo detector. Thus, the response time and/or power consumption may be controlled, adjusted and/or programmed to, for example, accommodate desired/required specifications of the photo detector. All permutations response time and/or power consumption, and combinations of thereof, are intended to fall within the scope of the present inventions.

In addition thereto, or in lieu thereof, in one embodiment, the photo detector may be placed in a predetermined state before sensing the light (or data). For example, carriers may be removed from the body region prior to sensing so that the concentration of carriers in the body region (and beneath the gates (Regions 1 and 2)) at the initiation of sensing may be below a predetermined value. In one embodiment, the photo detector may be placed in a predetermined state by applying the same voltage to the first and second doped regions (i.e., $V_1=V_2$) and applying voltage pulses to the gates Gate 1 and Gate 2 to remove carriers from the body region thereby providing depletion regions under gates Gate 1 and Gate 2. Establishing the photo detector in a predetermined state (for example, periodically) before sensing may enhance or increase the stability and/or accuracy of the photo detector during sensing.

Figure 13A:
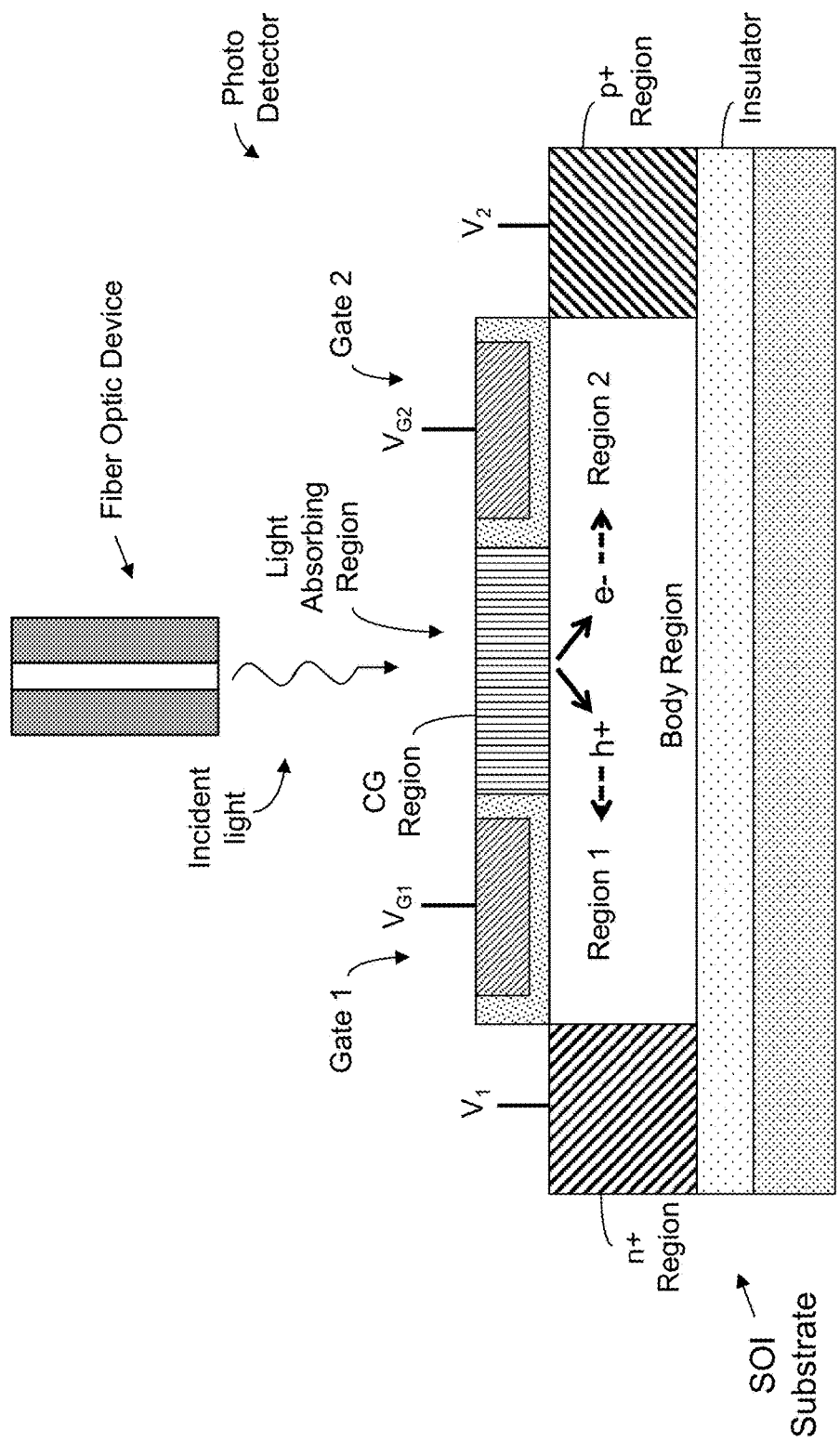
FIG. 13A is a cross-sectional view of another exemplary monolithic light sensor or photo detector according to another embodiment described and illustrated in the '891 application, wherein the sensor, in this illustrative embodiment, is disposed in or on an SOI substrate and includes a carrier generation region (CG region) disposed between control nodes or gates (illustrated in the exemplary embodiment as Gate 1 and Gate 2); the CG region may include a material which facilitates greater/higher generation of carriers in response to incident light wherein, in one embodiment, the CG region includes a material which generates more electron-hole carriers, relative to the sensor embodiment of FIG. 10A, in response to incident light; in one embodiment, the CG region includes germanium, gallium-arsenide or silicon-germanium, or combinations thereof (for example, both germanium and gallium-arsenide), and/or a highly doped semiconductor material (for example, highly doped silicon) which may be more responsive to photons than a similar undoped or a lightly doped semiconductor material.

With reference to FIG. 13A, in another embodiment, the photo detector includes a carrier generation region (CG region) in addition to at least two control nodes or gates (illustrated in the exemplary embodiment as Gate 1 and Gate 2), a light absorbing region, a body region, a first doped region (illustrated in the exemplary embodiment as n+ region) and a second doped region (illustrated in the exemplary embodiment as p+ region). The CG region may include a material which facilitates greater/higher generation of carriers in response to incident light. That is, in one embodiment, the CG region includes a material which generates more electron-hole carriers, relative to the embodiment illustrated in FIG. 10A, in response to incident light. For example, in one embodiment, the CG region includes germanium, gallium-arsenide or silicon-germanium, or combinations thereof (for example, both germanium and gallium-arsenide). The CG region may also include a highly doped semiconductor material (for example, highly doped silicon) which may be more responsive to photons than a similar undoped or a lightly doped semiconductor material.

In this embodiment, in response to incident light, electrons and holes may be created in the CG region and thereafter then move into the body region (due to the electric field formed by the voltages applied to the gates, n+ region and p+ region. Then, as described above with respect to the photo detector of FIG. 10A, the electrons and holes may be "separated" within the body region by an electric field provided by the voltages applied to the gates, n+ region and p+ region. Notably, the operation thereafter is substantially the same as described above with respect to the photo detector of FIG. 10A and, as such, for the sake of brevity will not be repeated.

The CG region in this embodiment facilitates greater/ higher generation of carriers in response to incident light having the same or lower photon energy. As such, the photo detector of FIG. 13A may detect light (photon transmission) having a lower energy in connection with the transmission thereof.

In another embodiment, the CG region includes a material that may be less responsive to photon energy. In this embodiment, the CG region includes a material which generates fewer electron-hole carriers, relative to the embodiment illustrated in FIG. 10A, in response to incident light. For example, in one embodiment, the CG region includes amorphous silicon or lightly doped polycrystalline silicon. The photo detector of this embodiment may be less susceptible to noise that may be present on or in the incident light (data).

Figure 13B:
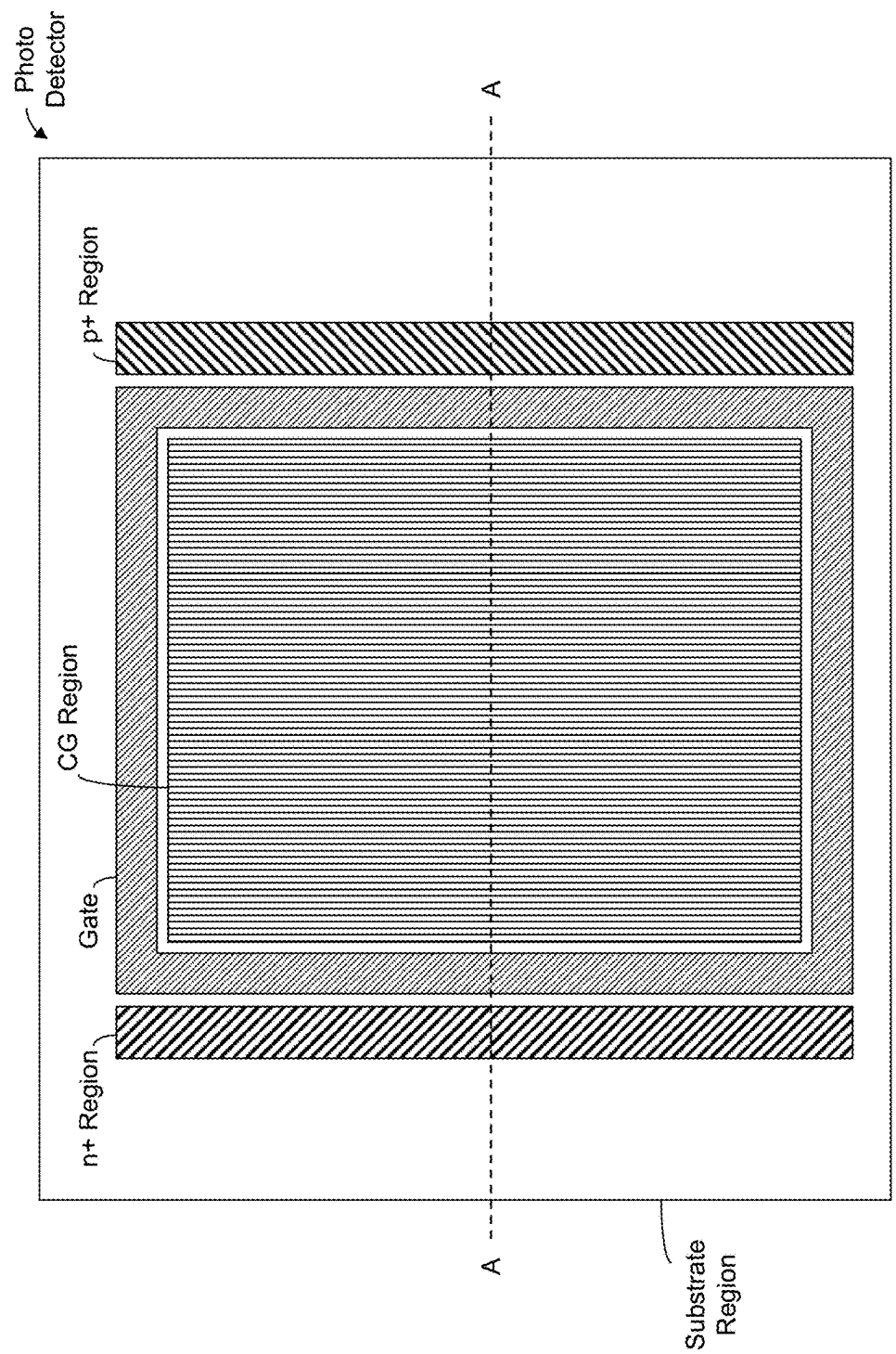
FIGS. 13B and 13C are illustrative top views of the exemplary monolithic photo detector of FIG. 13A according to certain aspects and embodiments described and illustrated in the '891 application.
Figure 13C:
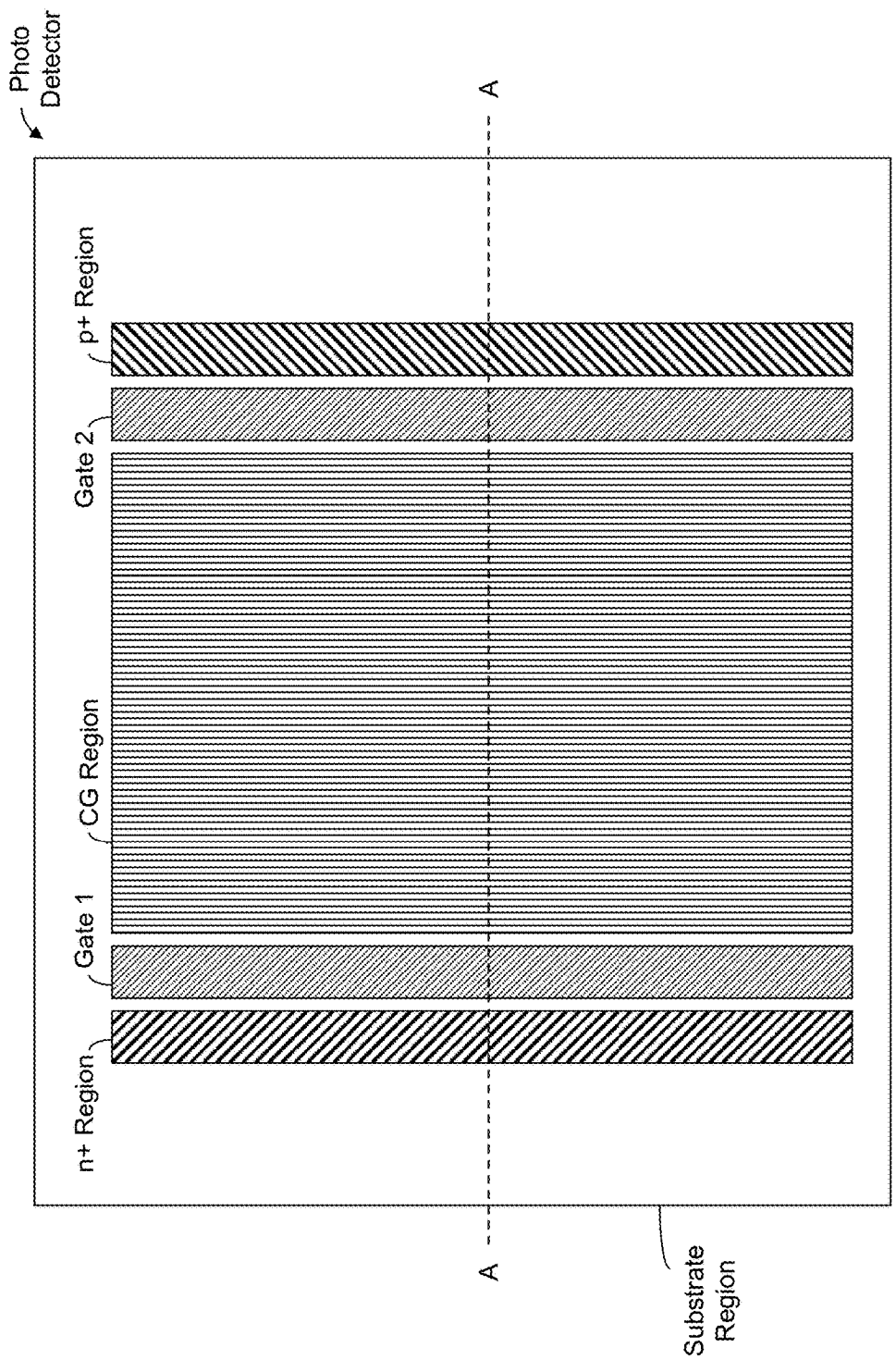

Notably, FIGS. 13B and 13C illustrate exemplary top views of the cross-sectional views of the photo detectors of FIG. 13A wherein dotted lines A-A indicate the location of the cross-sectional views of FIGS. 13B and 13C. With respect to FIG. 13B, gates 1 and 2 may be interconnected as one structure.

Figure 14A:
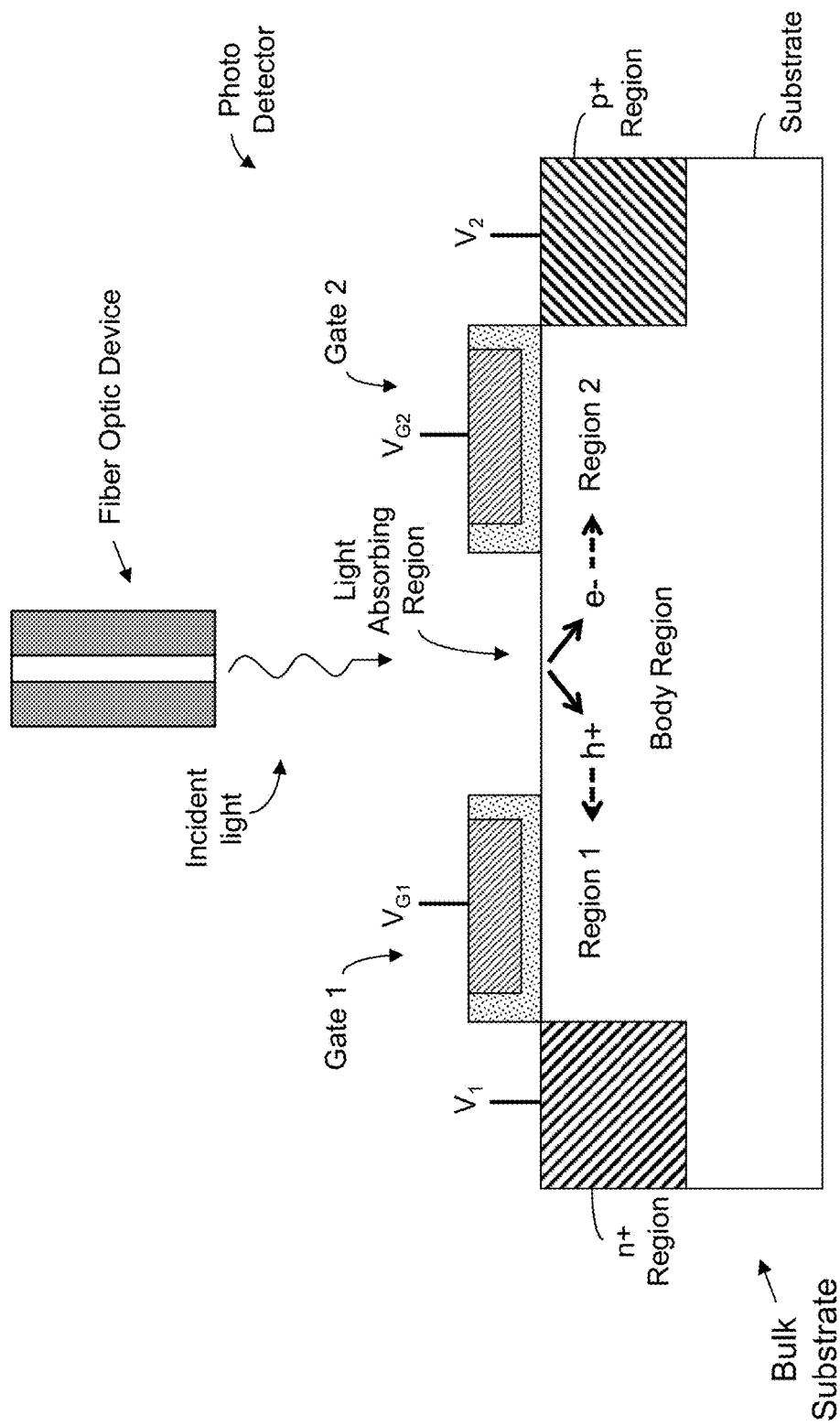
FIGS. 14A and 14B are cross-sectional views of exemplary monolithic light sensor or photo detector according to another embodiment described and illustrated in the '891 application wherein the photo detector, however in these illustrated embodiments (and unlike the embodiments of FIGS. 10A and 13A), the sensors may be disposed in or on a bulk substrate (for example, one or more materials from the Group IV semiconductor including silicon (such as, bulk-silicon substrate), germanium, and silicon carbide)
Figure 14B:
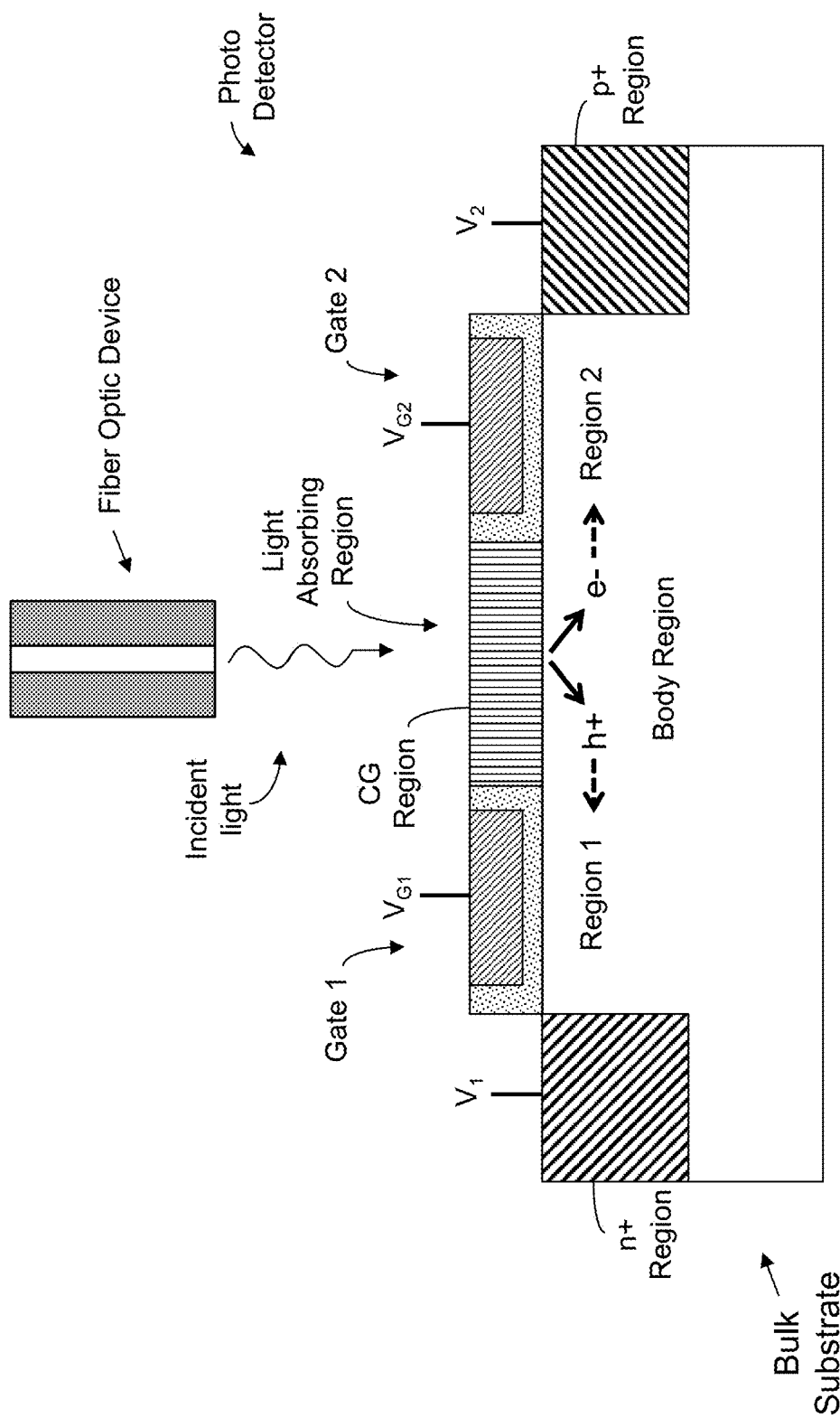

With reference to FIGS. 14A and 14B, in yet another embodiment, the photo detector may be fabricated on or in a bulk wafer/substrate. The discussion above pertaining to the materials, fabrication and operation, in relation to the embodiments corresponding to the SOI wafer/substrate, are entirely applicable here. That is, with reference to FIGS. 14A and 14B, a photo detector according to this embodiment includes at least two control nodes or gates (illustrated in the exemplary embodiment as Gate 1 and Gate 2), a light absorbing region, a body region, a first doped region (illustrated in the exemplary embodiment as n+ region) and a second doped region (illustrated in the exemplary embodiment as p+ region). The photo detector, in this exemplary embodiment, may be fabricated in or on a bulk semiconductor wafer/substrate (for example, undoped or lightly doped silicon, germanium, or gallium arsenide.

Notably, where the photo detector is fabricated in or on a bulk semiconductor wafer/substrate, the low or lightly doped silicon substrate may "appear" as a dielectric in those instances where the photo detector device operates at high frequencies. As such, in operation, a significant majority of the carriers may be maintained in a region of the body near the surface of the device closest to the incident light. In this way, a current may be formed between the n+ and p+ regions in the body region immediately below the gates.

As mentioned above, the detection time or triggering time of the exemplary photo detectors of FIGS. 14A and 14B may be programmable or tunable, for example, to meet or accommodate response time specifications as well as power consumption specification. In one embodiment, the voltages applied to the gates may be adjusted to increase the response time of the photo detector (for example, by increasing the electric field). In another embodiment, the voltages applied to the gates may be adjusted to reduce the power consumption of the photo detector. All permutations and combinations thereof are intended to fall within the scope of the present inventions.

With reference to FIGS. 15A and 15B, a photo detector according to another embodiment includes at least one control node or gate (the exemplary cross-sectional view of the photo detector of FIGS. 15A and 15B illustrates two control nodes or gates—see, Gate 1 and Gate 2), a light absorbing region, a body region, and at least one doped impurity region (the exemplary embodiment of FIGS. 15A and 15B again illustrate two doped regions—see p+ regions) which may be disposed in a positional relationship to one or more control nodes or gates. The photo detector also includes a contact region which, in operation, may be an output of the photo detector. The photo detector in the exemplary embodiment of FIG. 15A may be fabricated in or on a semiconductor on insulator (SOI) substrate (for example, a silicon or germanium region/layer/material disposed on or over an insulator region/layer/material (for example, a silicon oxide, silicon nitride and/or combination thereof). The photo detector in the exemplary embodiment of FIG. 15B may be fabricated on silicon, (for example, a standard bulk silicon), silicon-germanium, gallium-arsenide or an insulator (for example, glass or the like).

Briefly, in one embodiment, the control nodes or gates (hereinafter "gates") may be comprised of a conductive type material (conductor or doped semiconductor), for example, a metal (for example, aluminum or copper), metal compound and/or a doped semiconductor (for example, silicon doped with donor or acceptor impurities). The gates may be spaced from the body region via an insulator or dielectric material (for example, silicon oxide, silicon nitride or combinations or composites thereof, for example, ONO).

The body region may be fabricated in or on the substrate. In one embodiment the body region may be an intrinsic or doped semiconductor (for example, intrinsic/undoped silicon, germanium or silicon-carbide or a lightly doped (with donor or acceptor impurities) silicon, germanium or silicon-carbide). Indeed, the body region may be one or more materials from the Group IV semiconductor including silicon, germanium, silicon carbide and/or combinations thereof (for example, silicon-germanium). The body may be an intrinsic material or a material having impurities, for example, n-type or p-type material(s).

As noted above, the photo detector includes at least one doped region—see, p+ regions. The doped semiconductor regions may be disposed and/or formed in or on the substrate and juxtaposed the body region. For example, the p-type semiconductor material may be formed in the substrate by doping the semiconductor with a p-type impurity (for example, boron). Notably, the doped semiconductor regions (p+ regions) may also be control nodes of the photo detector and, in operation, an output of the photo detector.

The light absorbing region, in one embodiment, may be disposed and/or formed on the substrate and may be comprised of a material having a high electron mobility, for example, germanium, silicon-germanium or gallium arsenide. In this way, in operation, electrons which are displaced from certain orbitals, in response to impinging light or photons, may more readily or easily move within the light absorbing region.

Figure 15A:
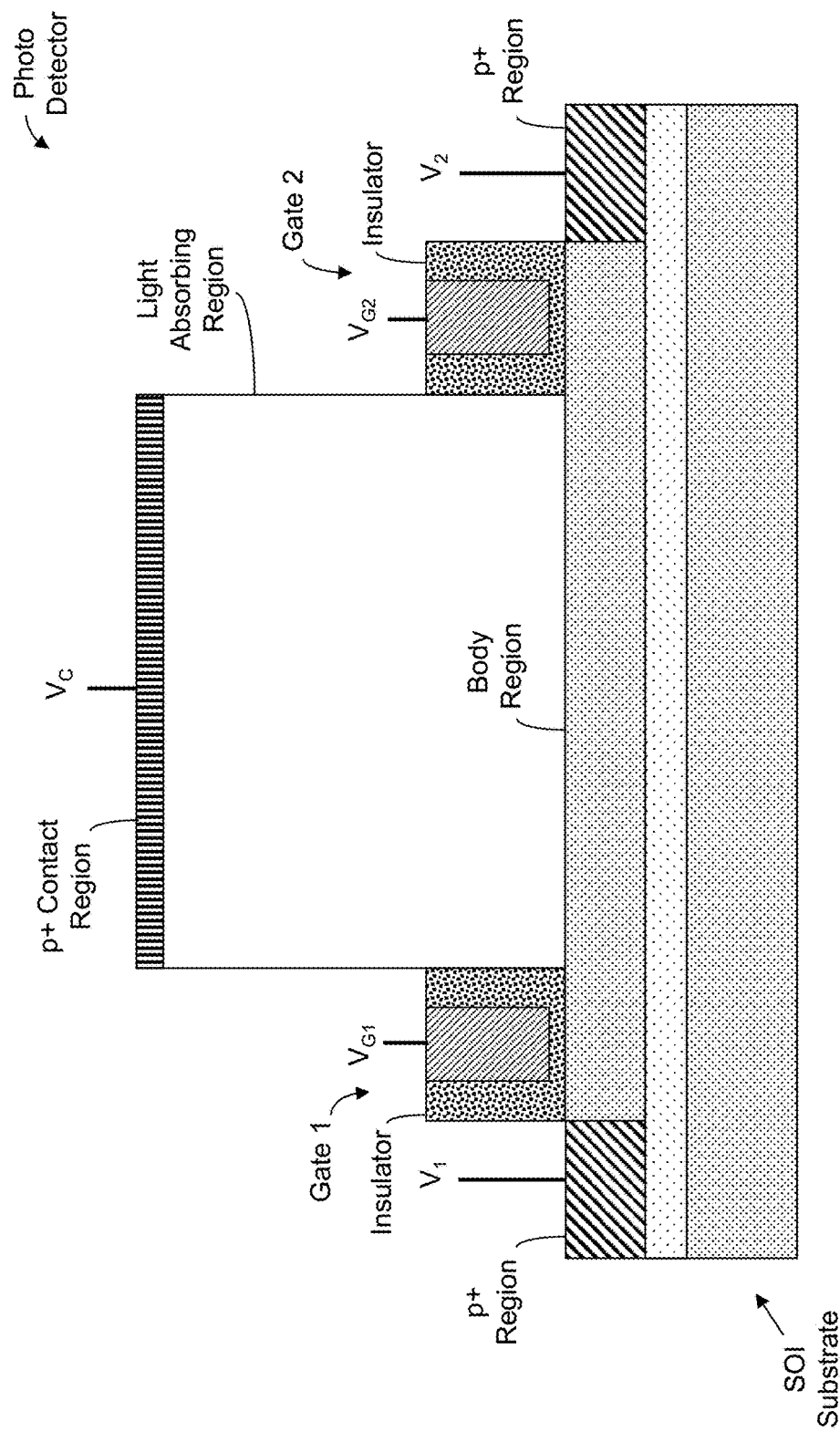
FIGS. 15A and 15B are cross-sectional views of monolithic photo detectors or photo detectors according to another embodiment described and illustrated in the '891 application wherein the sensor in illustrated embodiment of FIG. 15A may be disposed in or on a SOI substrate, for example, a silicon-on-insulator, and in the illustrated the embodiment of FIG. 15B may be disposed in or on a bulk substrate.
Figure 15B:
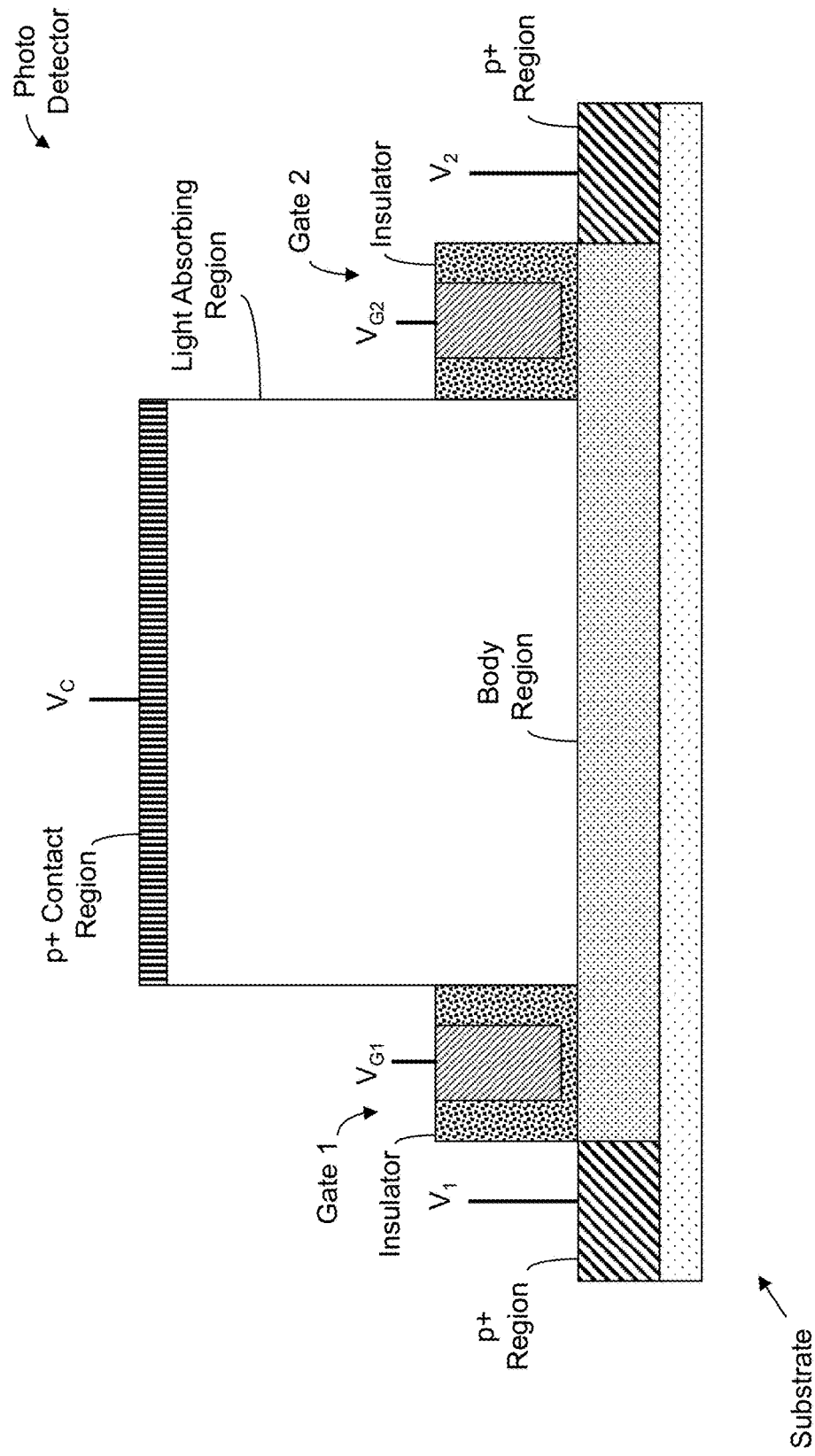

With continued reference to FIGS. 15A and 15B, the contact region may be disposed and/or formed on or in the contact region and may be comprised of a conductive type material (conductor or semiconductor), for example, a metal (for example, aluminum or copper), metal compound and/or a doped semiconductor (for example, silicon, silicon-germanium or gallium arsenide doped with donor or acceptor impurities). In one embodiment, the contact region may be an acceptor type material such as p-type semiconductor material formed from or by doping a semiconductor with a p-type impurity (for example, boron, germanium, silicon-germanium, silicon-carbide or gallium arsenide. Indeed, in one embodiment, the contact region may be a p+ type material consisting of one or more materials from the Group IV semiconductor including silicon, germanium, silicon carbide and/or combinations thereof.

Importantly, the photo detector may be fabricated using any materials and/or techniques now known, described herein, and/or later developed.

Figure 15C:
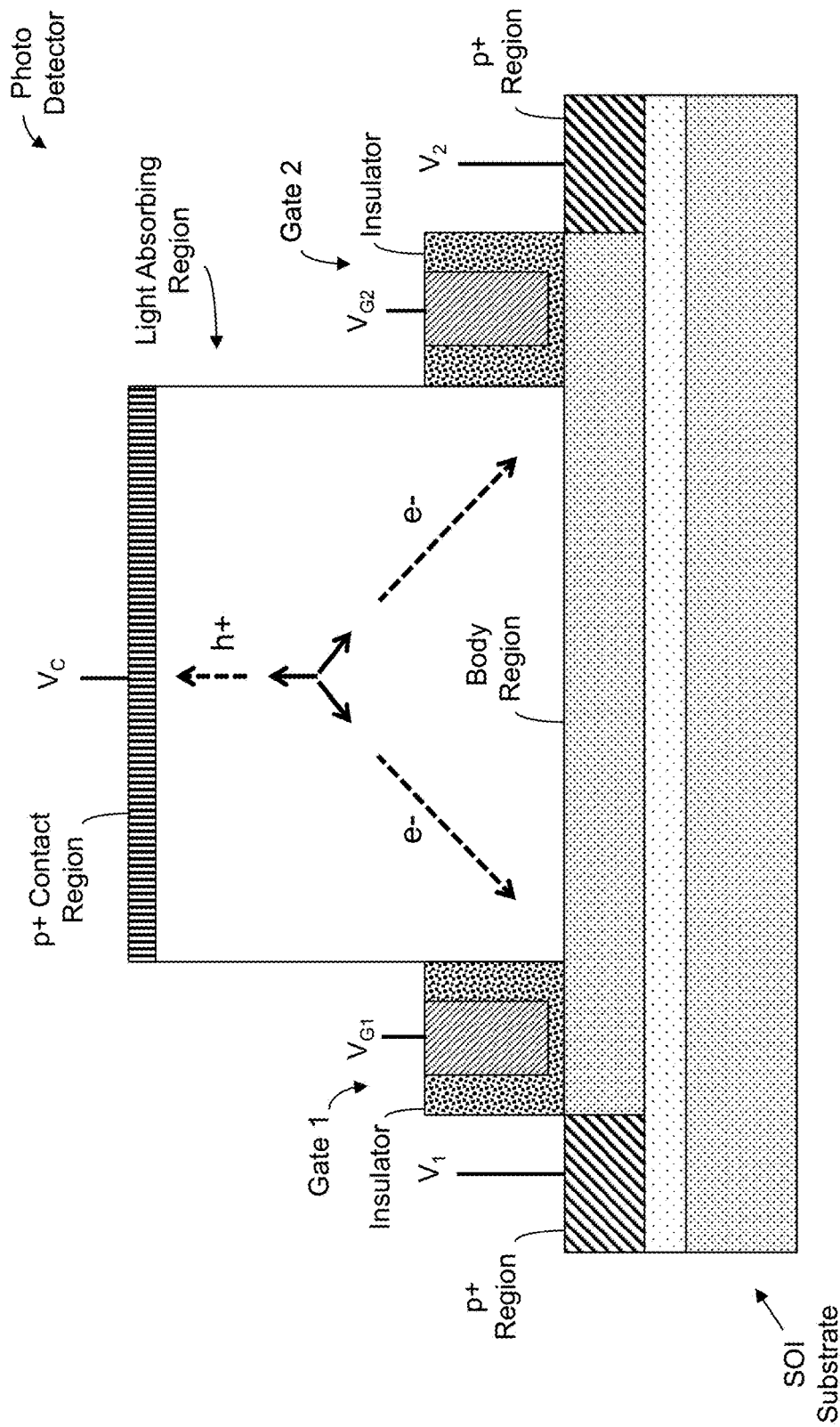
FIGS. 15C-15E are cross-section al views of the general operation of the photo detectors of FIGS. 15A and 15B, in accordance with an embodiment described and illustrated in the '891 application, wherein applying selected or predetermined voltages to the gates, the doped regions (in this illustrated embodiment, p+ regions) and contact region (in this embodiment, a p+ contact region) of the photo detector facilitates detection of light incident on the sensor.

With reference to FIG. 15C, in operation, the photo detector detects incident light via application of selected or predetermined voltages to the gates, the doped regions (in this illustrated embodiment, p+ regions) and contact region (in this embodiment, a p+ contact region). In one embodiment, a positive voltage may be applied to Gates 1 and 2 (for example, $V_{G1}=V_{G2}=+2V$), a positive voltage may be applied to the p+ regions (for example, $V_1=V_2=+1V$), and a negative or ground voltage applied to the p+ contact region (for example, $V_C=0V$). Under these conditions, an electric field forms and some positive carriers (i.e., holes) flow to the contact region and negative carriers (i.e., electrons) flow to the p+ region via the body region. The photo detector may be essentially in a nonconductive state wherein a current between the contact region and the p+ regions may be quite small.

Figure 15D:
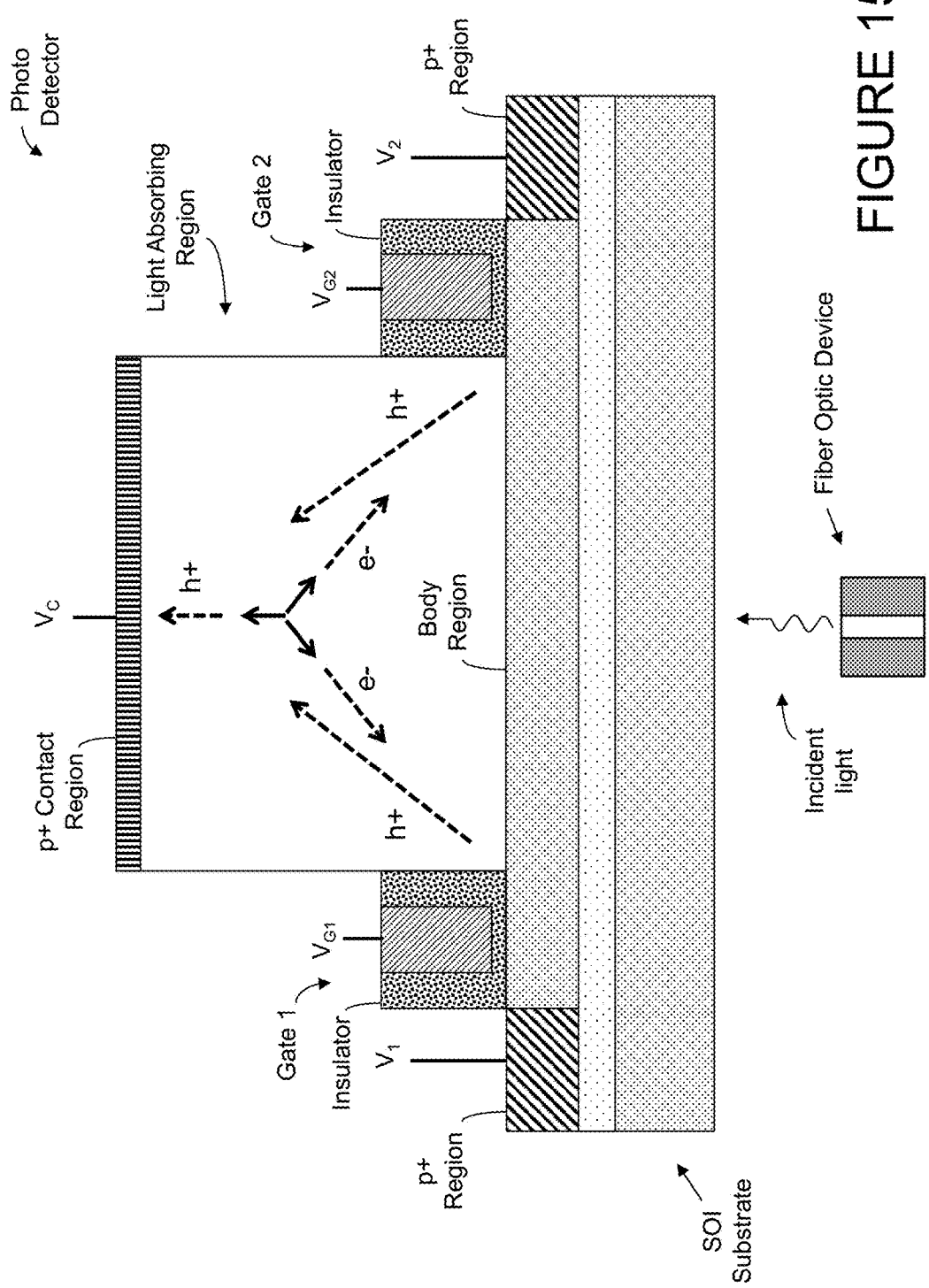
Figure 15E:
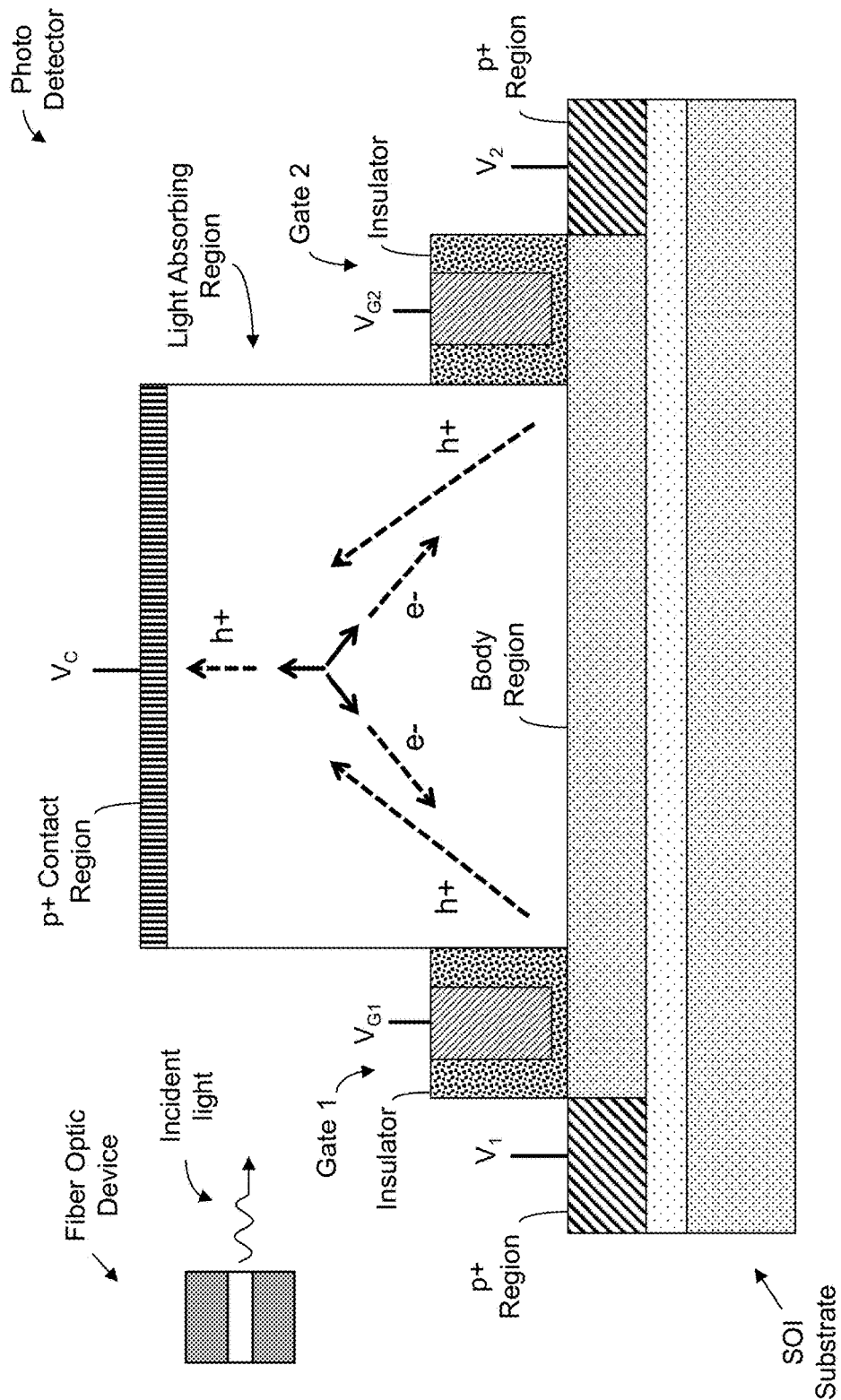

With reference to FIGS. 15D and 15E, in response to light incident on or applied to the light absorbing region of the photo detector (for example, light which is output from a fiber optic device), electron-hole pairs may be generated in the light absorbing region (for example, germanium or silicon-germanium). The electron-hole pairs separate, in the presence of the electric field produced or provided by the voltages (for example, static or fixed voltages) applied to the gates, p+ regions and the p+ contact region. In this regard, holes may be attracted to and flow to the p+ contact region and electrons may be attracted to and flow to the body region and, in particular, to the body region near and/or beneath the gates (i.e., gate 1 and gate 2). That is, the electron-hole pairs may be separated by an electric field and the holes may flow to the p+ contact region and the electrons may flow to portions of the body region near and/or beneath the gates. This may induce or cause the potential barrier lowering for holes in the body region located near and/or beneath the gates as excess electrons accumulate in that region. Under these circumstances, an additional and/or greater hole current may be created and flows from the p+ regions through a portion of the body region and the light absorbing region to the p+ contact region thereby increasing the magnitude of the output current.

Thus, negative carriers (i.e., electrons) accumulate beneath the gates and, in response thereto, positive carriers (i.e., holes) from the p+ regions juxtaposed the gates, flow to the contract region (here a p+ contact region). In this way, the photo detector may be in a conductive state or mode, which may provide a large internal current gain. The current flows between the p+ regions and the contact region and an output current upon detecting or in response to the incident light.

Notably, in the absence of incident light, little to no current flows between the p+ regions and the contact region due to the barrier caused or provided by the voltages applied to the gates. Moreover, the photo detector may be disabled via removing/changing the voltages applied to one or more of Gates 1 and 2, contact region, p+ regions, and/or applying voltages of opposite polarity to one or more of one or more of Gates 1 and 2, contact region, p+ regions. For example, decreasing the voltages applied to the gates and/or p+ regions may place the photo detector in a non-conductive state.

The illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to Gates 1 and 2, p+ regions and/or contact region may become or may be positive and negative.

Moreover, like that described in the previous embodiments, the detection time of the photo detectors may be programmable or tunable, for example, to meet or accommodate response time specifications as well as power consumption specification. In one embodiment, the voltages applied to the gates may be adjusted to increase the response time of the photo detector (for example, by increasing the electric field). In another embodiment, the voltages applied to the gates may be adjusted to reduce the power consumption of the photo detector. Thus, the response time and/or power consumption may be adjusted, for example, to accommodate desired/required specifications. All permutations response time and/or power consumption, and combinations of thereof, are intended to fall within the scope of the present inventions.

In addition thereto, or in lieu thereof, in one embodiment, the photo detector may be placed in a predetermined state before sensing the light (or data). For example, carriers may be removed from the body region prior to sensing so that the concentration of carriers in the body region (and near and/or beneath the gates) at the initiation of sensing may be below a predetermined value. In one embodiment, the photo detector may be placed in a predetermined state by applying predetermined voltages to the p+ regions and applying voltage pulses to the gates to remove carriers from the body region thereby providing depletion regions under gates Gate 1 and Gate 2. Establishing the photo detector in a predetermined state (for example, periodically) before sensing may increase or enhance the stability, response time and/or accuracy of the photo detector during sensing/operation.

Figure 16A:
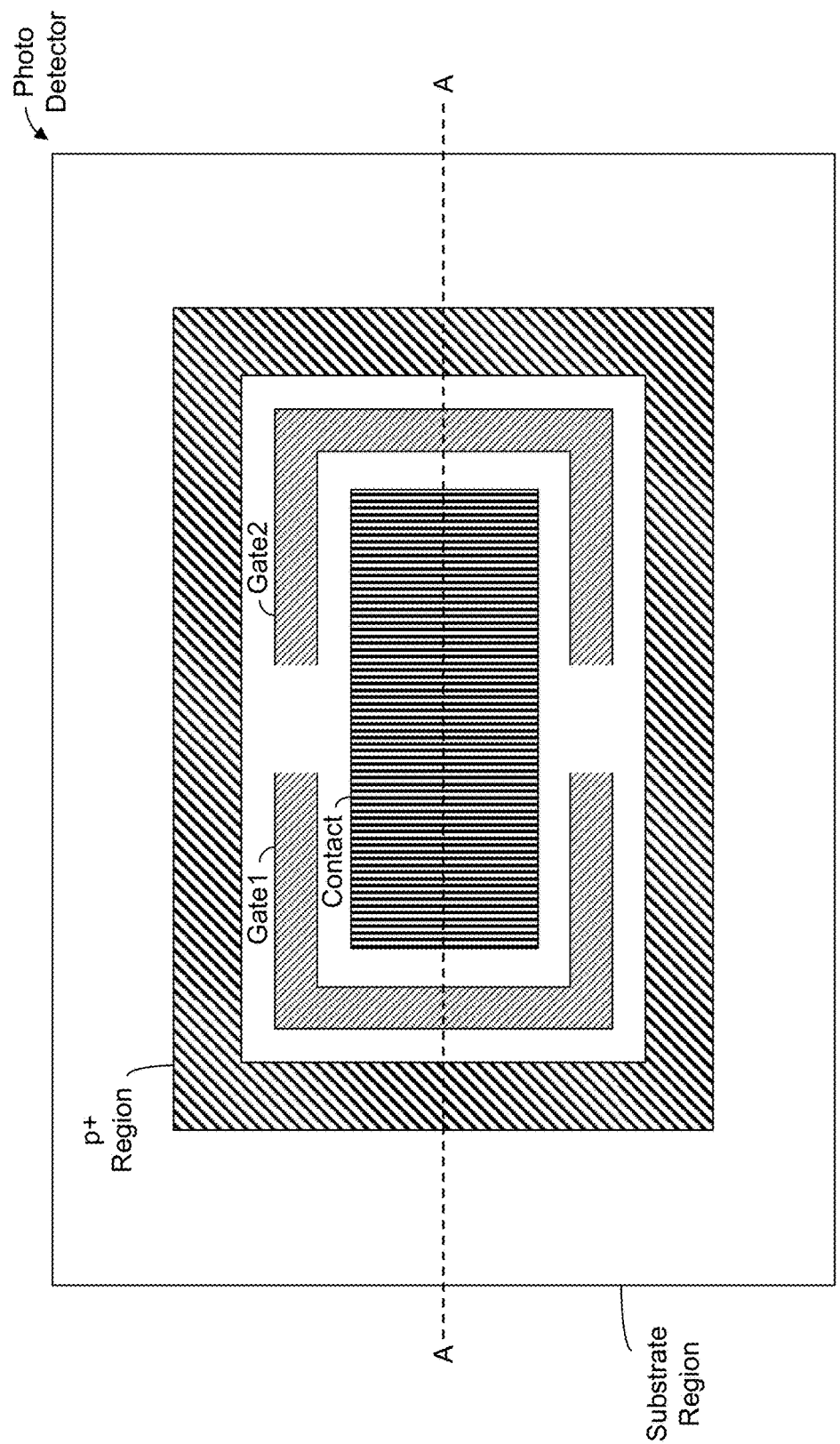
FIGS. 16A-16C illustrate exemplary top views of the cross-sectional views of the sensors of FIGS. 15A-15C wherein dotted lines A-A indicate the location of the cross-sectional views of FIGS. 15A-15C; notably, with respect to FIG. 16C, gates 1 and 2 may be interconnected as a unitary structure which is identified or designated "Gate"
Figure 16B:
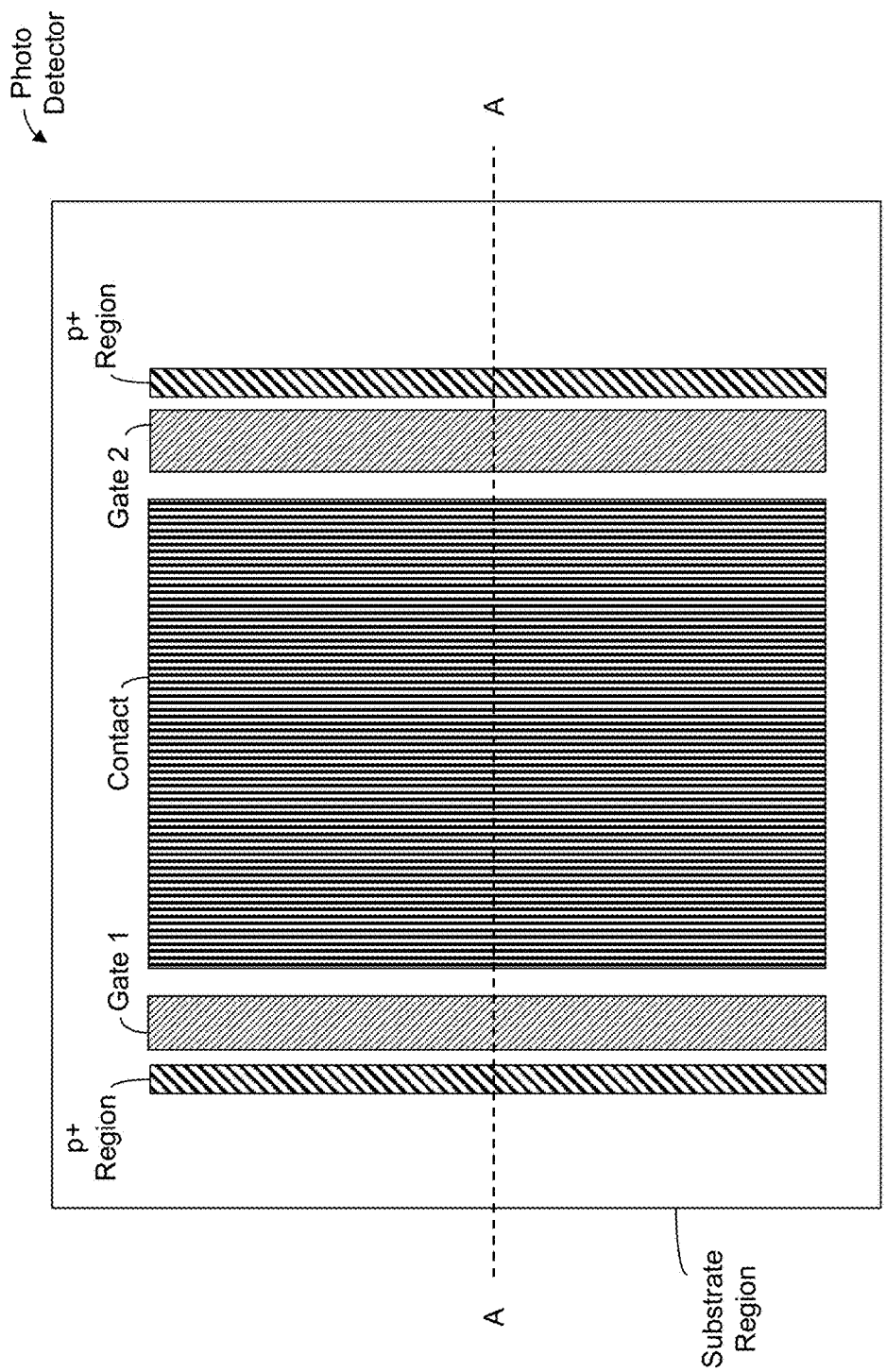
Figure 16C:
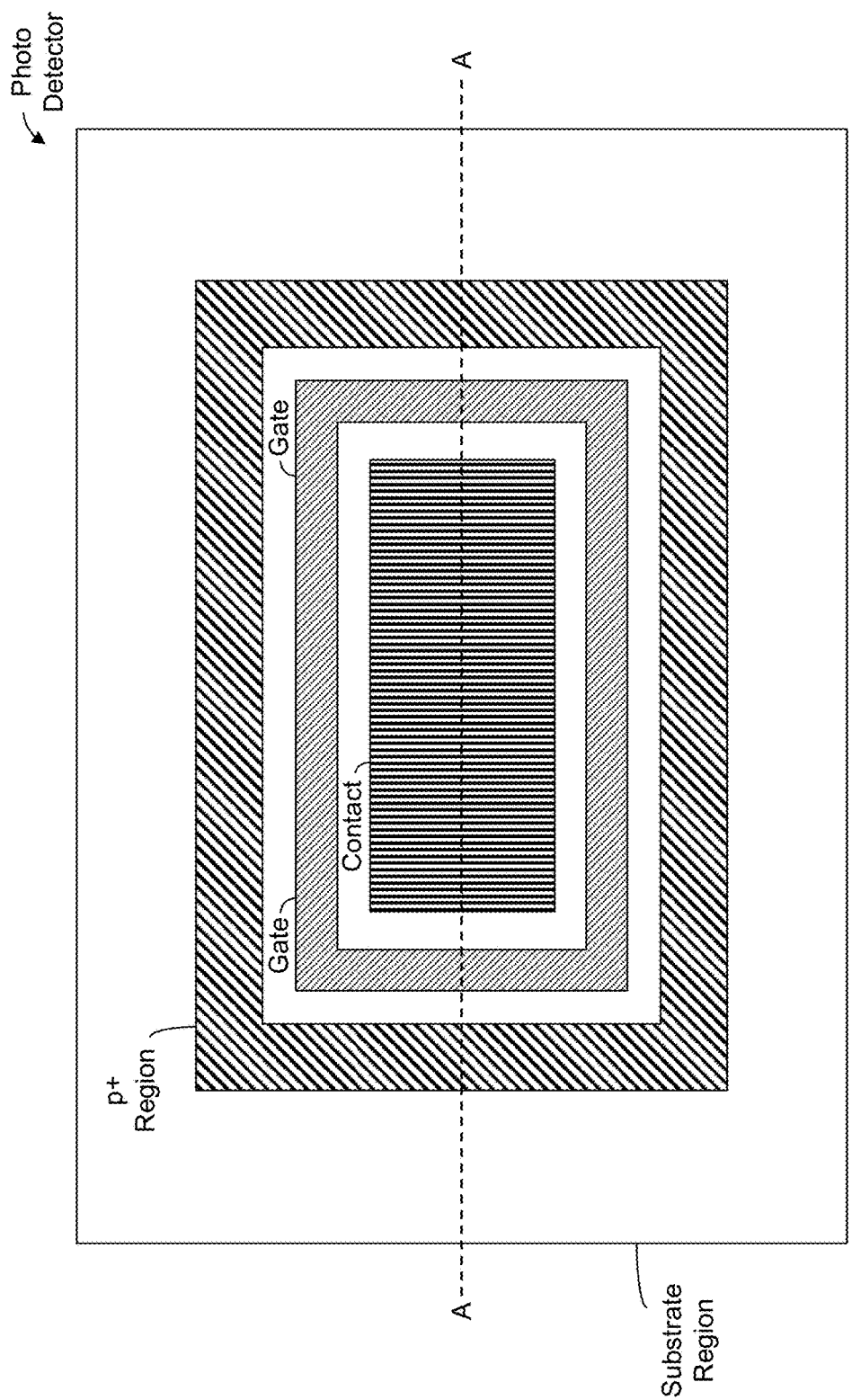

Notably, FIGS. 16A-16C illustrate exemplary top views of the cross-sectional views of the photo detectors of FIGS. 15A-15C wherein dotted lines A-A indicate the location of the cross-sectional views of FIGS. 15A-15C. With respect to FIG. 16C, the gates 1 and 2 may be interconnected as one structure.

Figure 17A:
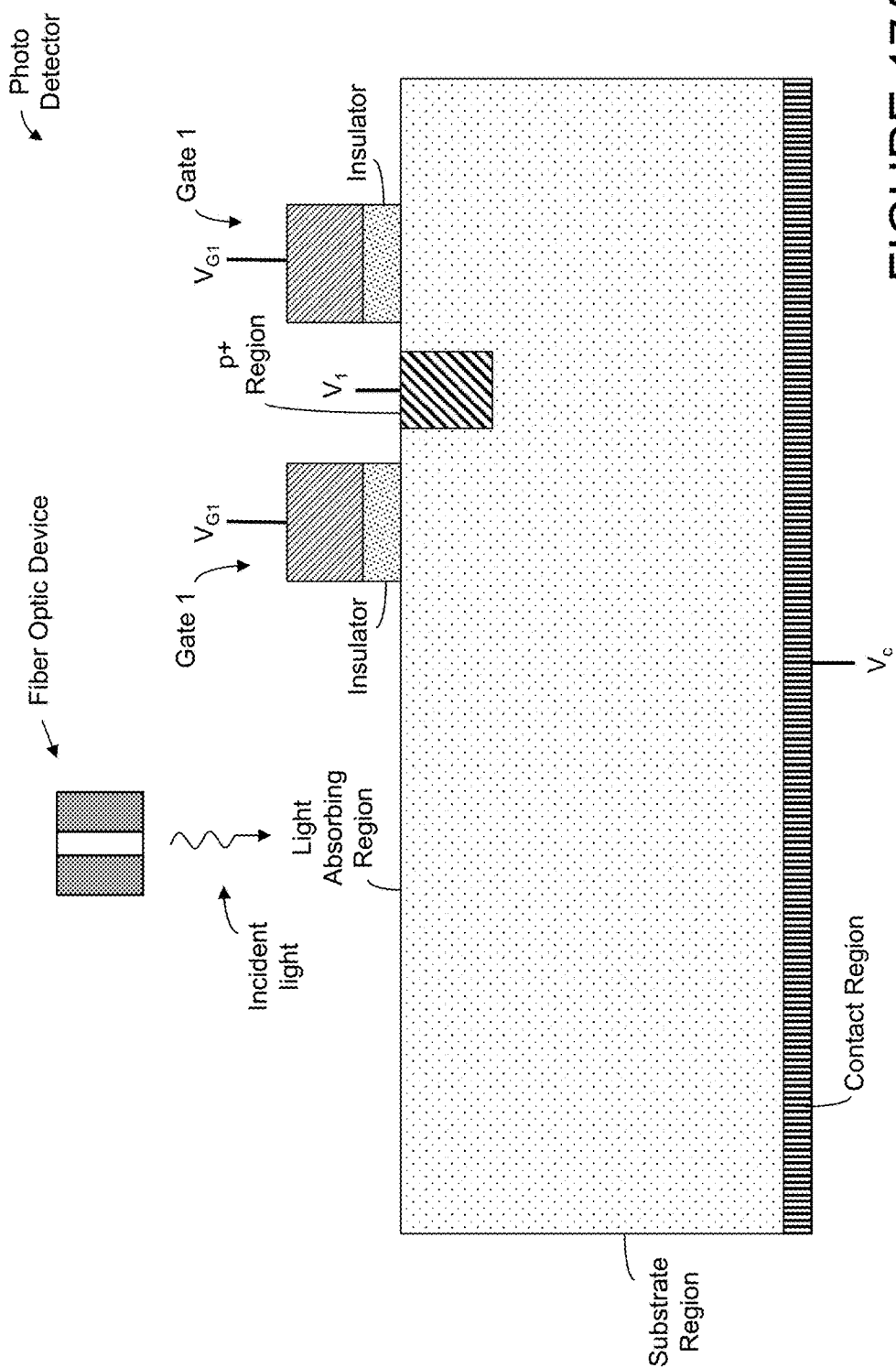
FIG. 17A is a cross-sectional view of a monolithic light sensor or photo detector according to another sensor or detector described and illustrated in the '891 application wherein the contact region of this illustrative photo detector may be disposed on a backside of the bulk substrate wafer/die.

With reference to FIG. 17A, in another embodiment, the photo detector includes a contact region disposed on a backside surface of the substrate region (for example, the major surface which is opposing the major surface upon which the p+ region and gates may be disposed). In this embodiment, the primary light absorbing region may be a portion of the substrate region which, in an exemplary embodiment, may be silicon (for example, a low doped p-type silicon substrate), silicon-germanium or gallium-arsenide or combinations thereof (for example, both germanium and gallium-arsenide). Here, the light absorbing region may be a material which facilitates generation of carriers in response to incident light. The light absorbing region may be a doped or undoped material (for example, a highly doped semiconductor material (for example, highly doped silicon) which may be more responsive to photons than a similar undoped or a lightly doped semiconductor material).

In this embodiment, in response to incident light, electrons and holes may be created in the light absorbing region and may be separated in the presence of an electric field produced or provided by the voltages (for example, static or fixed voltages) applied to the p+ region (for example, $V_1=+3V$), gates (for example, greater than $V_{G1}=+4V$) and the contact region (a negative or ground voltage, $V_C=0V$) wherein, in this exemplary embodiment, the contact region may be a p+ type contact region. Under these circumstances, the holes flow to the p+ contact region and electrons flow to the body region and, in particular, to the body region near and/or beneath the gates (i.e., Gate 1). Like that described above, as excess electrons accumulate in the body region located near and/or beneath the gates, the electron barrier (band gap) may be lowered therein. This results in an additional and/or greater hole current flow from the p+ regions through a portion of the substrate region to the contact region. The operation of the photo detector of FIG. 17A may be substantially the same as described above with respect to the photo detector of FIGS. 15A and 15B. For the sake of brevity, that discussion will not be repeated.

Figure 17B:
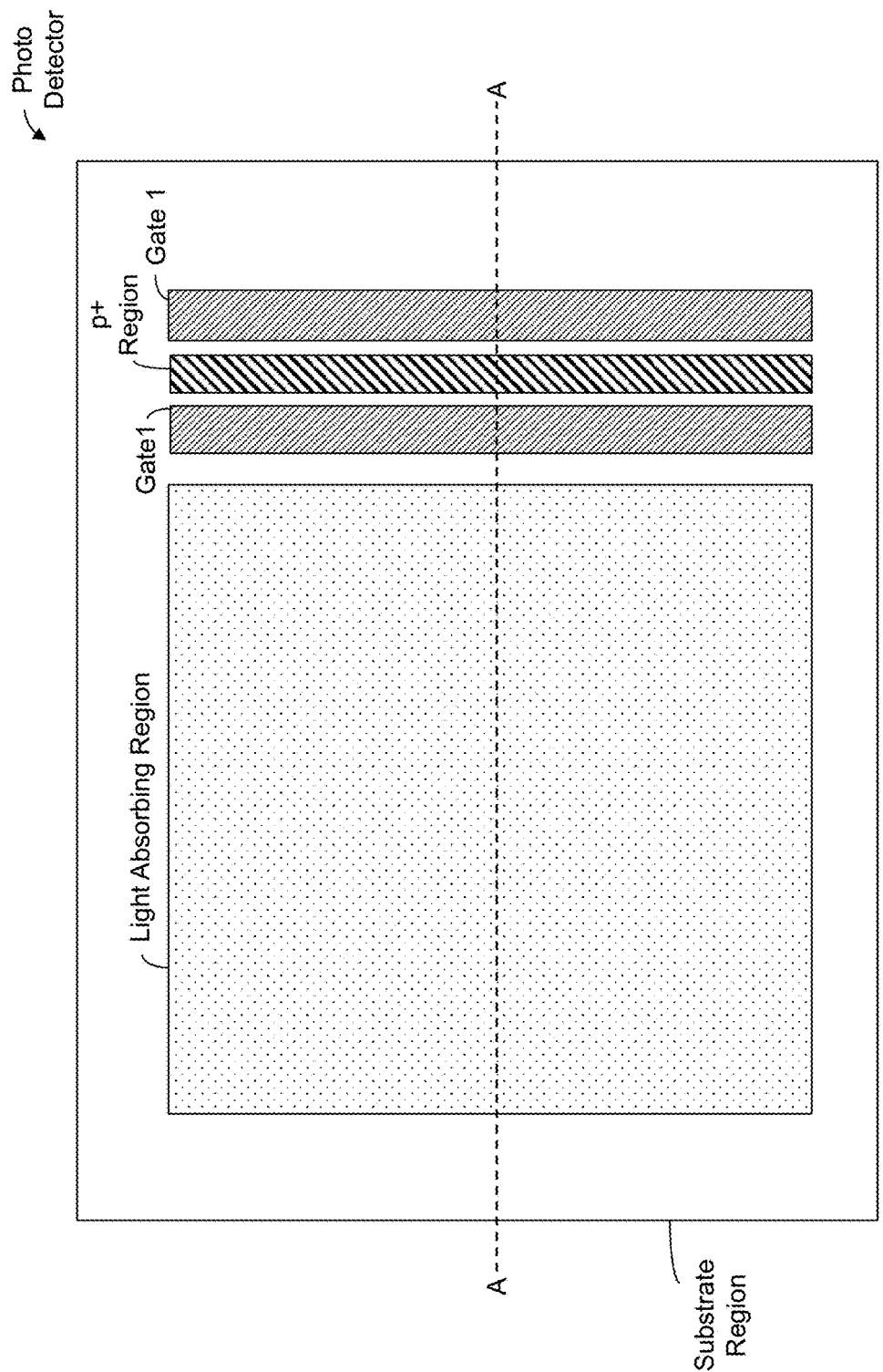
FIGS. 17B and 17C illustrate exemplary top views of the cross-sectional view of the sensor/detector of FIG. 17A wherein dotted lines A-A indicate the location of the cross-sectional view of FIG. 17A.
Figure 17C:
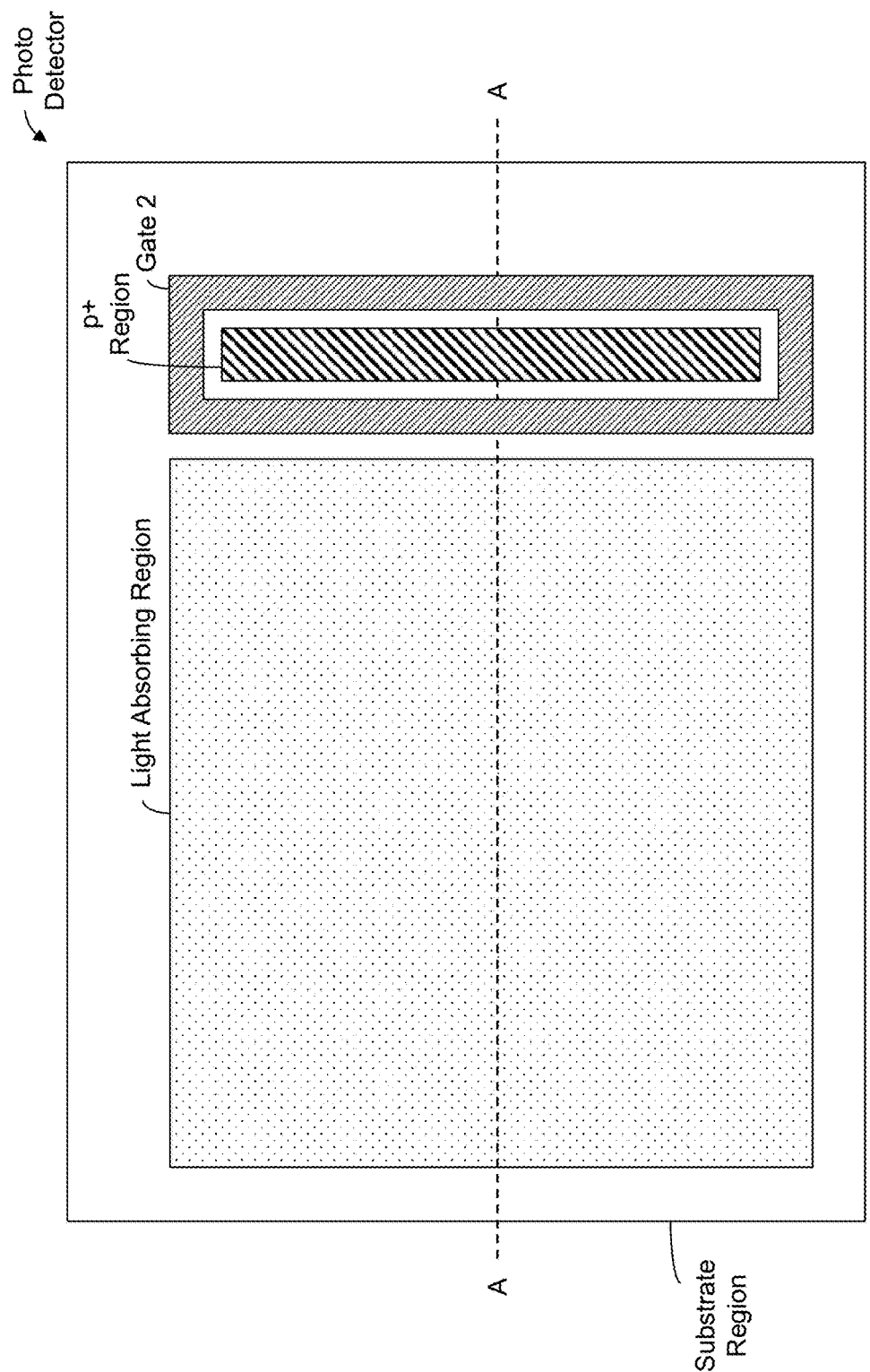

Notably, the materials and configuration of the gates and the doped region (p+ region) may be the same as that described in connection with the embodiment of FIGS. 15A and 15B. Moreover, FIGS. 17B and 17C illustrate exemplary top views of the cross-sectional views of the photo detectors of FIG. 17A wherein dotted lines A-A indicate the location of the cross-sectional views of FIG. 17A.

In one embodiment, the exemplary photo detector of FIG. 17A may include two or more p+ region, each p+ region having associated gates. For example, with reference to FIG. 18A, in yet another embodiment, the photo detector includes at least two doped regions (p+ regions) each having a positional relationship to associated gates or control nodes—namely, gate 1 and gate 2, respectively. The materials and configuration of the gates and the doped region (p+ region) may be the same as that described in connection with the embodiment of FIGS. 15A, 15B and 17A. For the sake of brevity, that discussion will not be repeated.

Figure 18A:
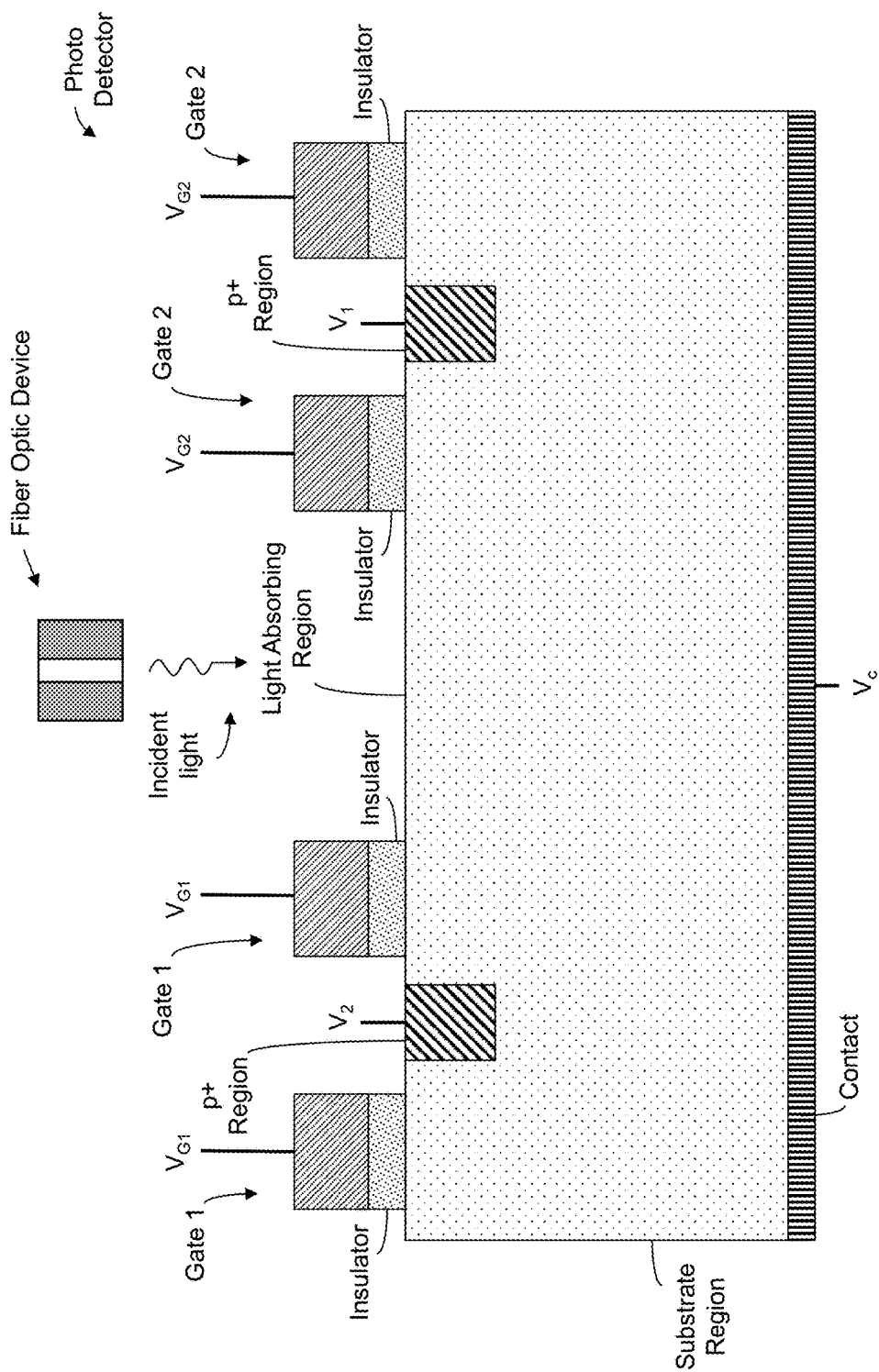
FIG. 18A is a cross-sectional view of a monolithic light sensor or photo detector according to yet another embodiment described and illustrated in the '891 application.

Moreover, the operation of the photo detector of FIG. 18A may be substantially the same as described above with respect to the photo detector of FIG. 17A. That is, in response to incident light, electrons and holes may be created in the light absorbing region and may be separated in the presence of an electric field produced or provided by the voltages (for example, static or fixed voltages) applied to the p+ region (for example, +3V), gates (for example, greater than +4V) and the contact region (a negative or ground voltage). As excess electrons accumulate in the substrate region located near and/or beneath the gates, the potential barrier for holes lowers in that region thereby providing for a hole current which flows from the p+ regions to the contact region. Notably, in this exemplary embodiment, the contact region may again be a p+ type contact region.

Figure 18B:
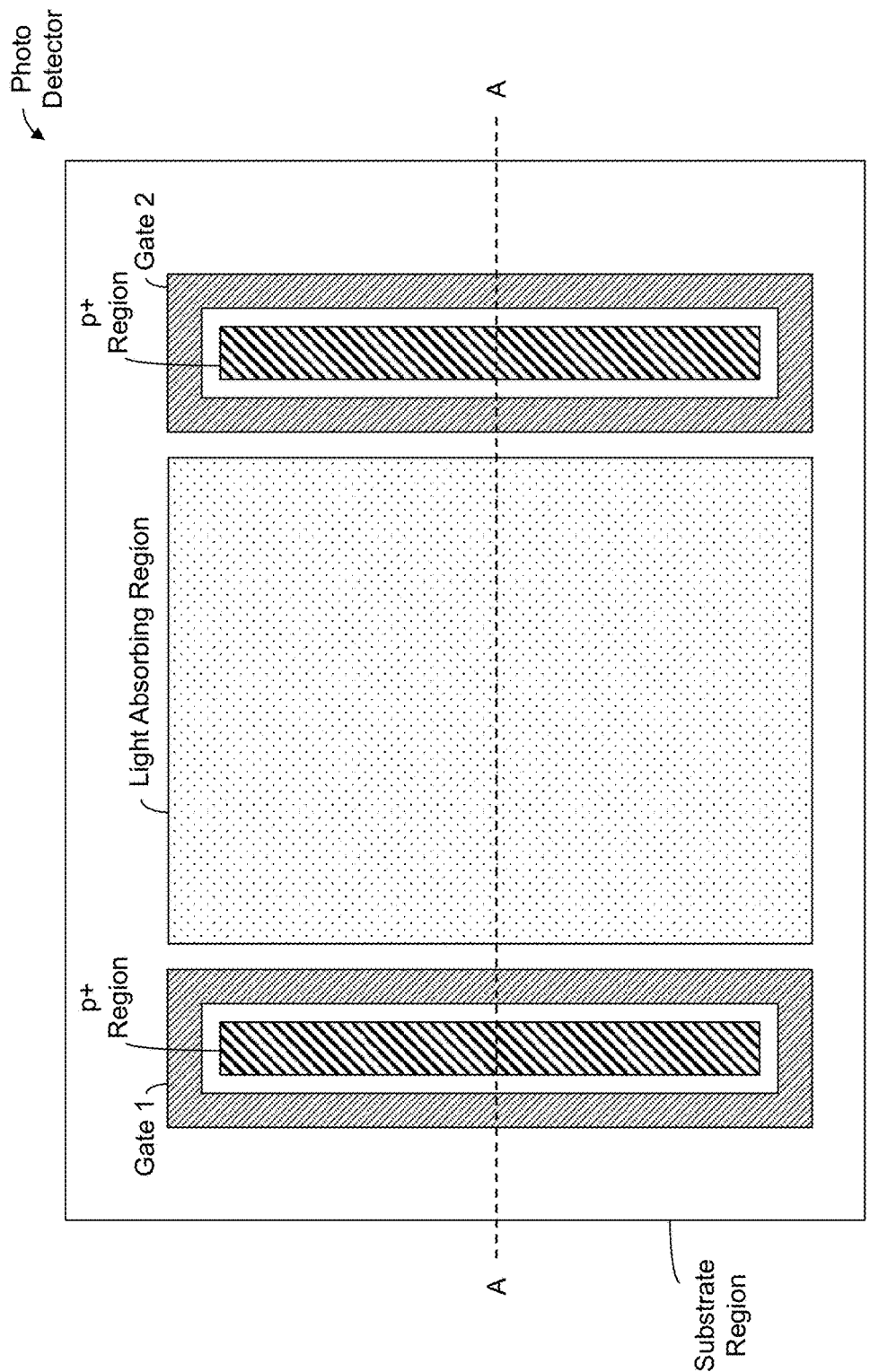
FIGS. 18B-18D illustrate exemplary top views of the cross-sectional view of the photo detector of FIG. 18A wherein dotted lines A-A indicate the location of the cross-sectional view of FIG. 18A; notably, with respect to FIG. 18D, gates 1 and 2 may be interconnected as a unitary structure which is identified or designated "Gate"
Figure 18C:
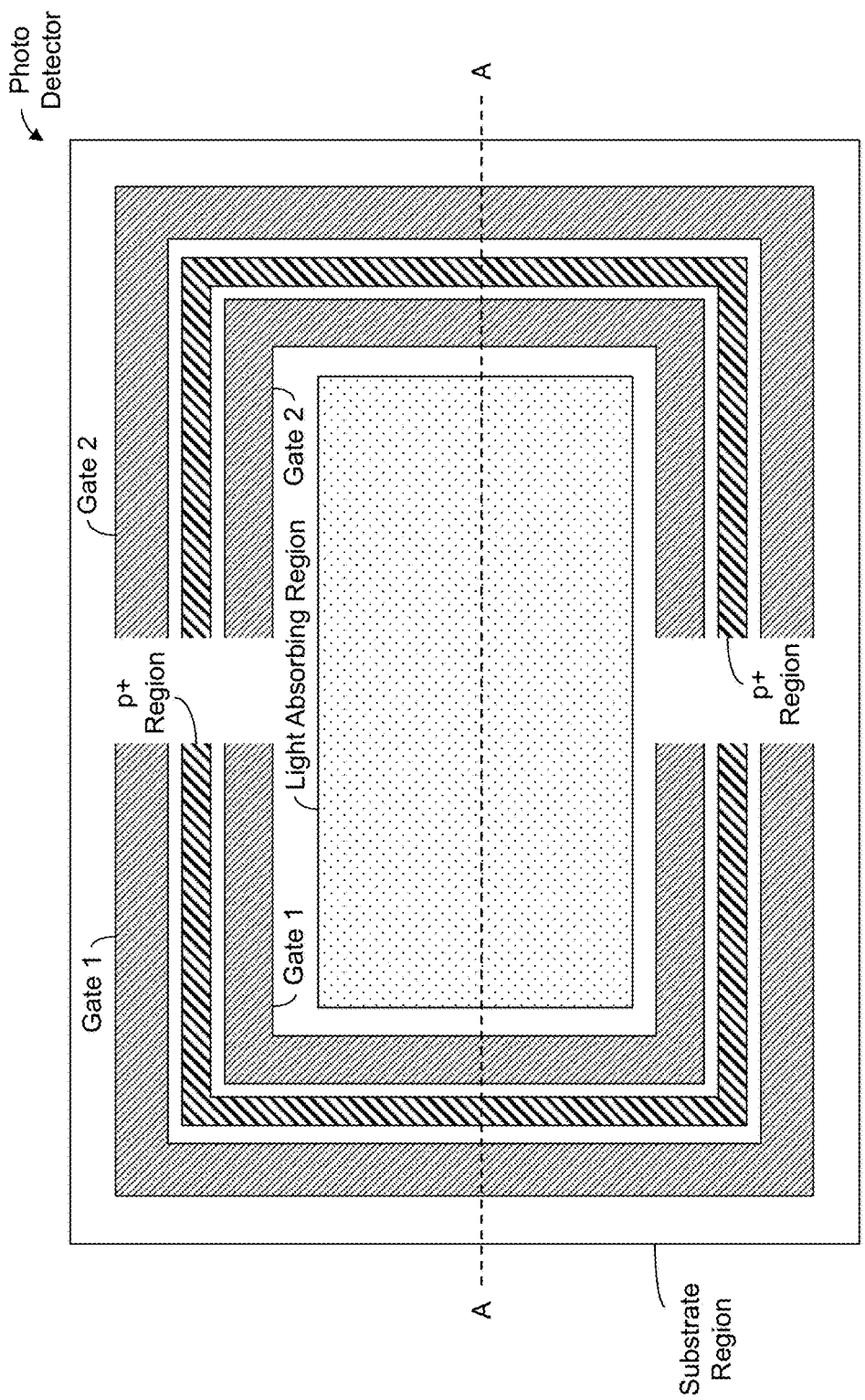
Figure 18D:
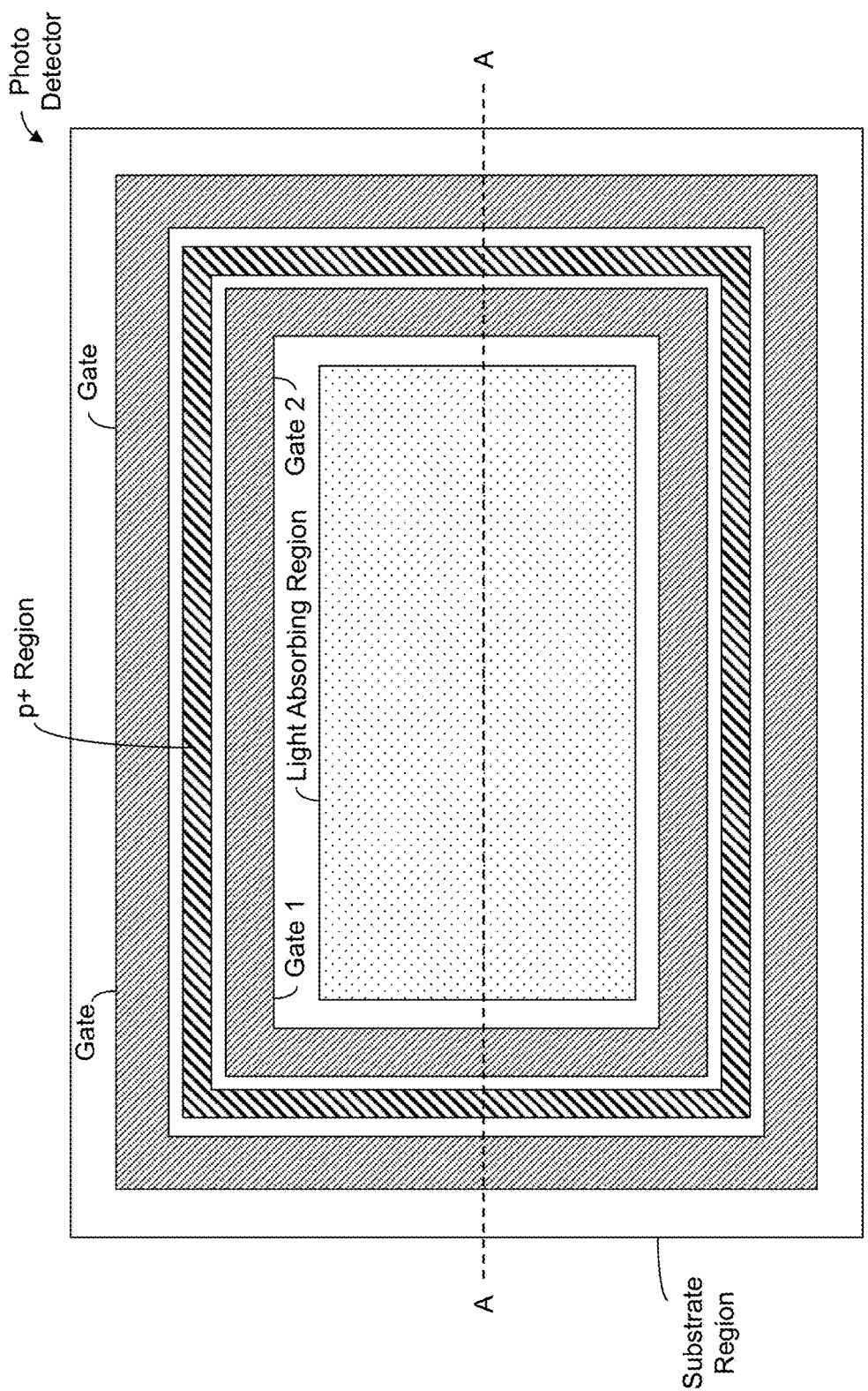

FIGS. 18B and 18C illustrate exemplary top views of the cross-sectional views of the photo detectors of FIG. 18A wherein dotted lines A-A in FIGS. 18B and 18C indicate the location of the cross-sectional views of FIG. 18A. With respect to FIG. 18D, gates 1 and 2 may be interconnected as one structure.

Notably, the exemplary photo detector illustrated in FIG. 18A, relative to the photo detector illustrated in FIG. 17A, may generate a larger current in response to incident light. That is, the plurality of p+ regions (having associated gates juxtaposed thereto) may in combination generate a larger current in response to incident light. Moreover, the photo detector embodiment of FIG. 18A may be employed as a "building block" of an array of photo detectors of a photo detector device wherein the gates may be electrically connected and the outputs may be connected in parallel. Indeed, all of the embodiments herein may be employed as "building blocks" of an array of photo detectors of a photo detector device. In the embodiment of FIG. 18A, it may be preferable that the substrate is low doped and an electric field exists in the region between the contact region and the p+ regions.

Figure 19A:
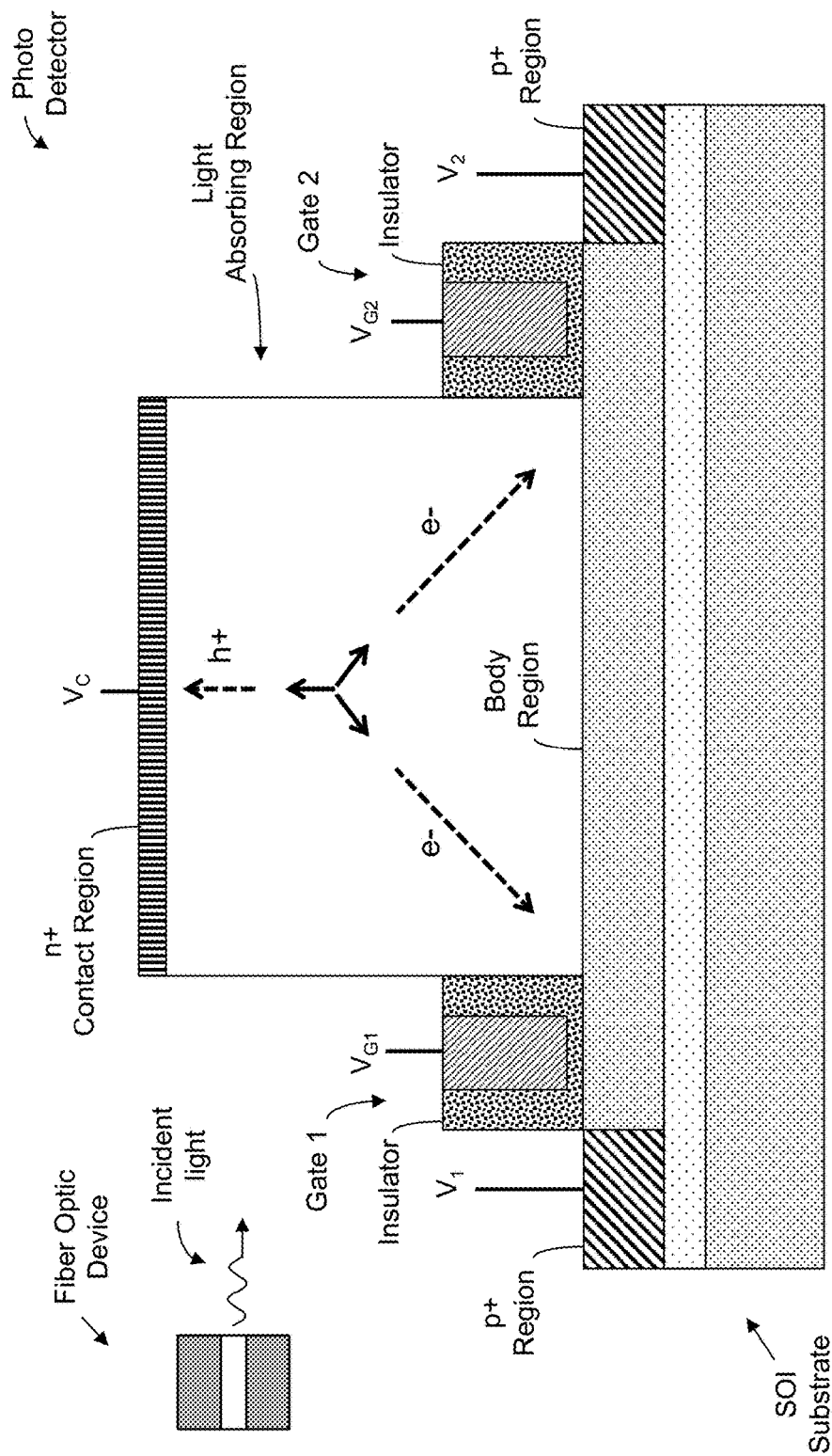
FIGS. 19A and 19B are cross-sectional views of monolithic light sensors or photo detectors according to another embodiment of the photo detectors of illustrated in FIGS. 15A and 15B, respectively, wherein in this embodiment the contact regions may be n+ type material; notably, where the contact region of the embodiment of FIG. 19A or 19B is an n+ type contact region, the sensor may be characterized as an n+pnp+ type structure and the materials, processing, architecture and layout of the sensor may be the same as those of the embodiment of FIGS. 15A and 15B except for the n+ contact region.
Figure 19B:
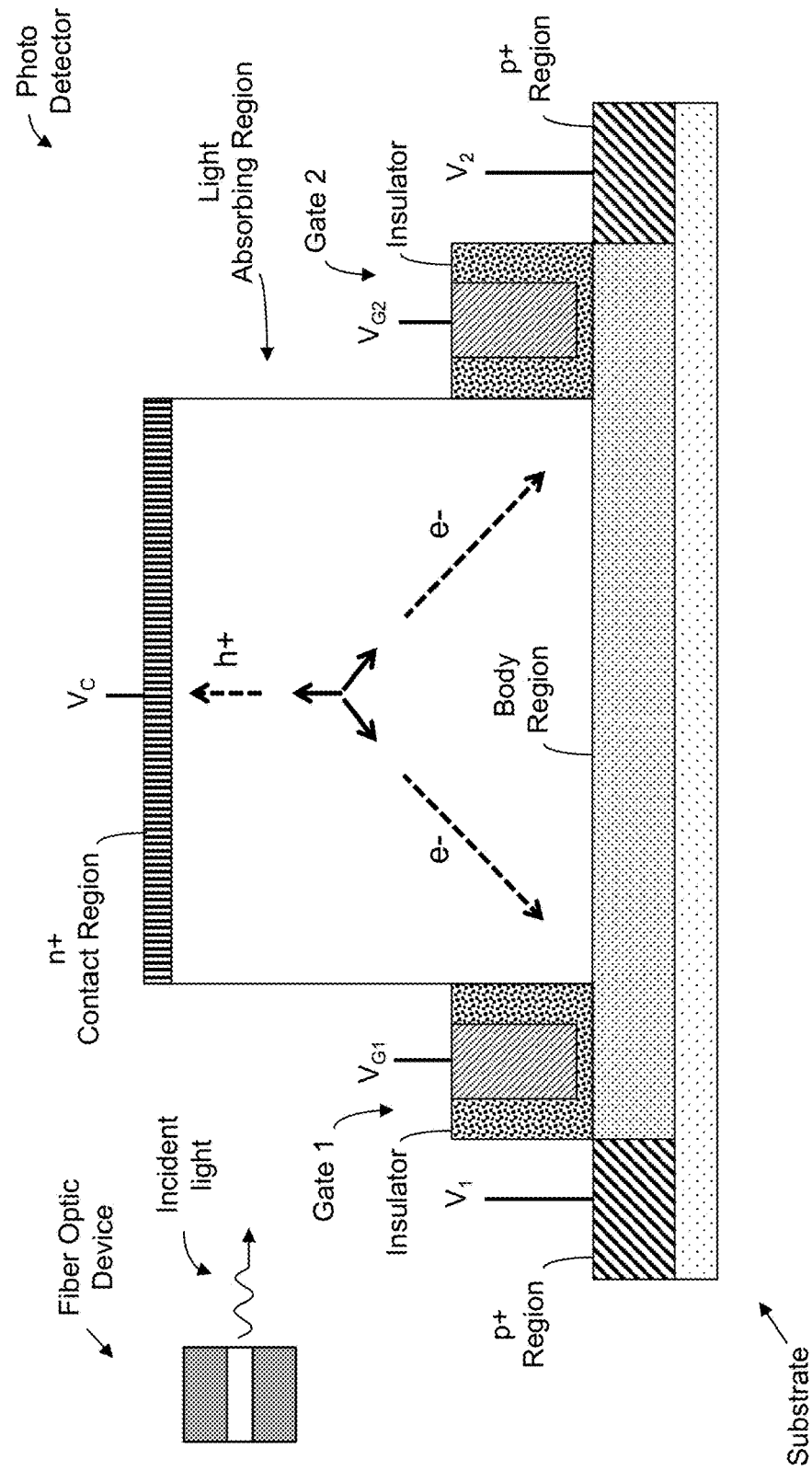
Figure 19C:
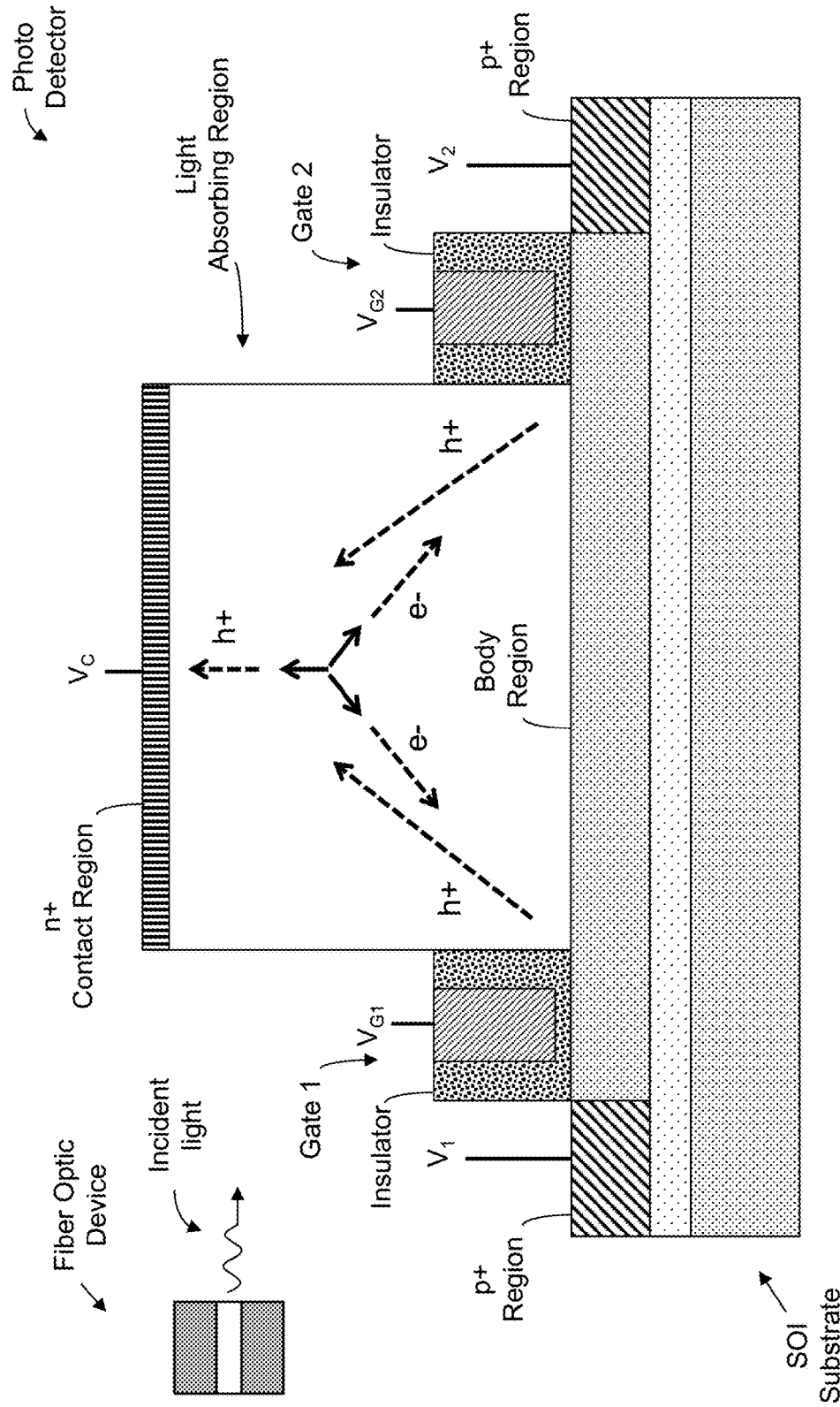
FIGS. 19C and 19D are cross-section al views of the general operation of the sensors or detectors of FIGS. 19A and 19B, in accordance with an embodiment described and illustrated in the '891 application, wherein the sensor detects incident light via application of selected or predetermined voltages to the gates, the doped regions (in this illustrated embodiment, p+ regions) and contact region (in this embodiment, a p+ contact region)
Figure 19D:
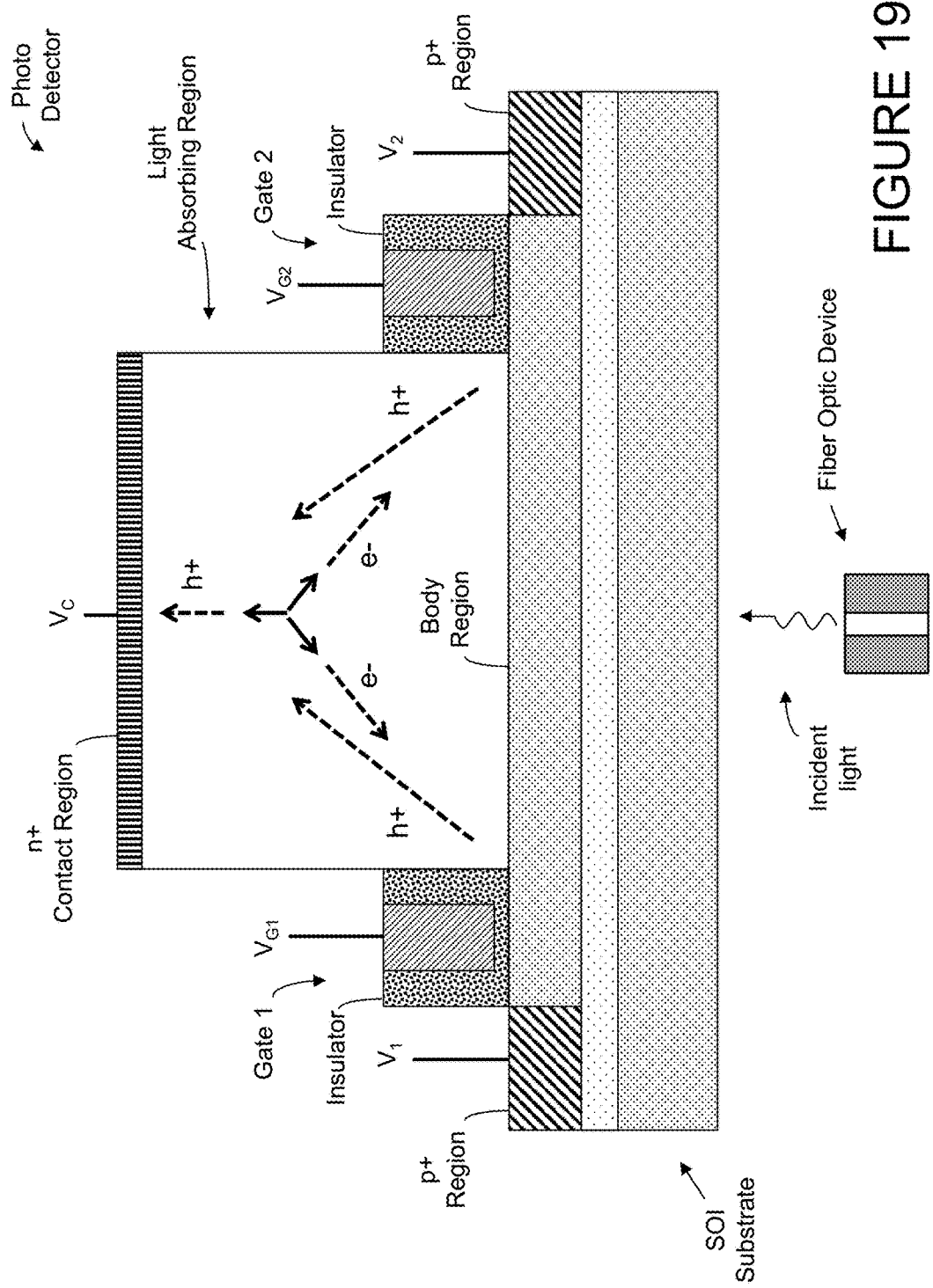

Although the contact regions of the aforementioned embodiments have often been described as a p+ region, in another embodiment, the contact region may be an n+ type. For example, with reference to FIGS. 19A and 19B, where the contact region of the embodiment of FIG. 19A or 19B may be an n+ type contact region, the photo detector may be characterized as an n+pnp+ type structure. Here, the materials, architecture and layout of the photo detector may be the same except for the n+ contact region. Accordingly, the discussion above in connection with FIGS. 15A and 15B (for example, the materials) may be applicable to this embodiment and, for the sake of brevity will not be repeated.

With reference to FIGS. 19A-19D, in operation, in response to incident light, electrons and holes may be created in the light absorbing region and thereafter may be separated where electrons move into the body region (due to the electric field formed by the voltages applied to the gates, n+ contact region, gates and p+ regions), and holes move to the n+ contact region. In one embodiment, the electric field may be provided via a positive voltage applied to Gates 1 and 2 (for example, $V_{G1}=V_{G2}=+2V$), a positive voltage may be applied to the p+ regions (for example, $V_1=V_2=+1V$), and a negative or ground voltage applied to the contact region (in this exemplary embodiment a n+ contact region, $V_C=0V$).

Thus, the electron-hole pairs may be separated by an electric field and the holes may flow to the n+ contact region and the electrons may flow to portions of the body region near and/or beneath the gates. As excess electrons accumulate in the body region located near and/or beneath the gates, the potential barrier for holes lowers in the body region located near and/or beneath the gates providing for an additional and/or greater hole current to flow from the p+ regions to the contact region thereby increasing the magnitude of the output current.

Thus, the photo detectors of FIGS. 19A-19D, in a conductive state or mode, may provide a large internal current gain due to a positive feedback mechanism of accumulation of excess negative carriers under the gates, which, in turn, may reduce the band gaps corresponding to such regions. The current may flow between the p+ regions and the n+ contact region and an output current upon detecting or in response to the incident light.

For FIGS. 22-30, reference numbers refer to the same elements across the figures.

Figure 22A:
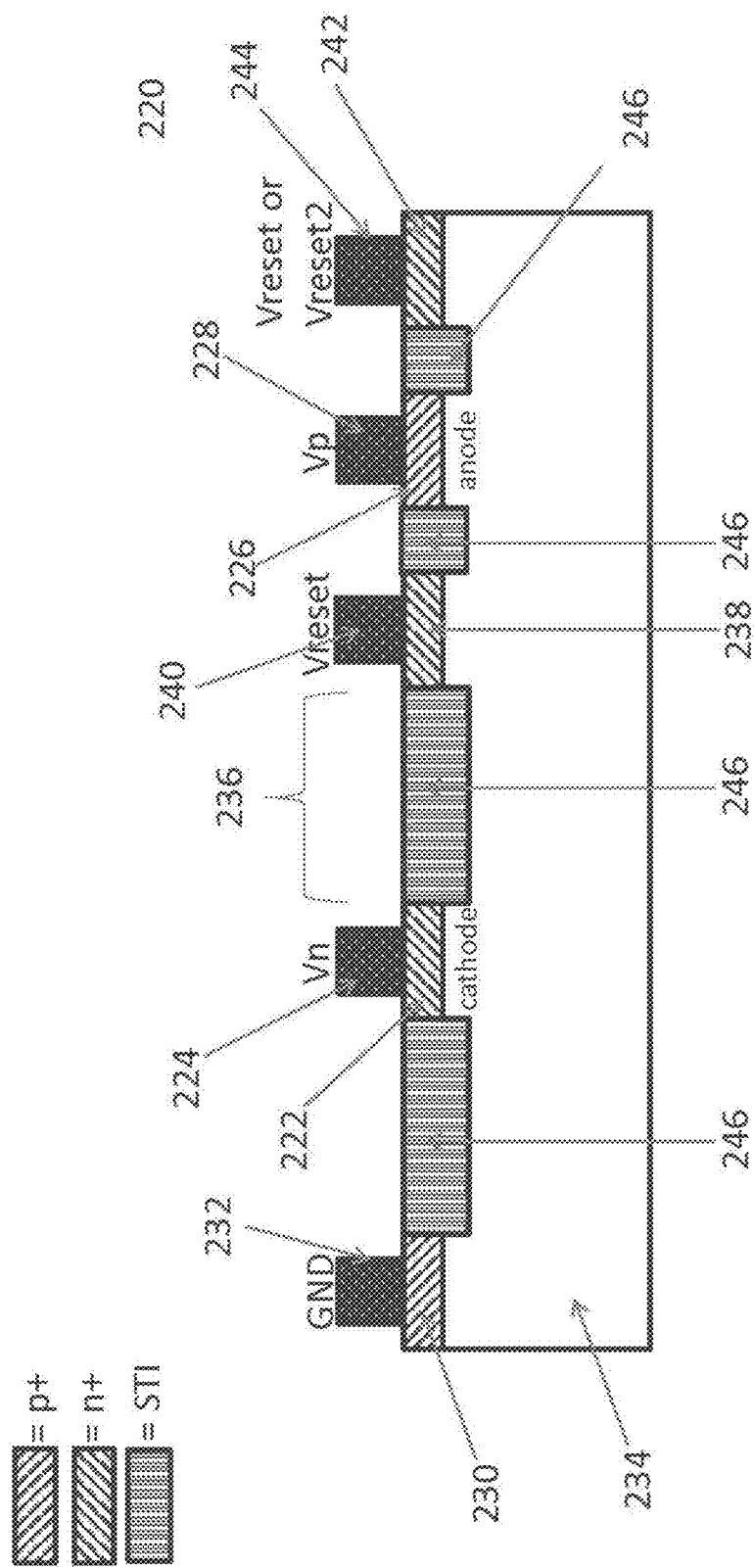
FIG. 22A shows a cross section of a dynamic photodiode with resettable N+ doping according to an embodiment of the present disclosure.

FIG. 22A shows a cross section of a dynamic photodiode (DPD) 220 with resettable N+ doping according to an embodiment of the present disclosure. DPD 220 includes a first doped region 222. First doped region 222 is shown in FIG. 22A as an n+ region, but may alternatively be a p+ region. A first contact 224 may be attached to first doped region 222. First contact 224 may be formed on first doped region 222, and may be made of a conductive or semiconductor material type, such as a metal (e.g., aluminum or copper), a metal compound, and/or a doped semiconductor (e.g., silicon, silicon germanium, or gallium arsenide doped with donor or acceptor impurities). First contact 224 may be a p+ or n+ type material. First contact 224 may be formed and have the same properties as the contact region shown in FIG. 3A, as previously discussed. A voltage Vn may be applied to first contact 224, and thereby applied to first doped region 222. Vn may be a negative voltage or a zero voltage. First doped region 222 functions as a cathode of DPD 220.

DPD 220 further includes a second doped region 226. Second doped region 226 is shown in FIG. 22A as a p+ region, but may alternatively be a n+ region. A second contact 228 may be attached to second doped region 226. Second contact 228 may be formed on second doped region 226 in a similar manner as first contact 224 is formed on first doped region 222. Additionally, second contact 228 may be formed and have the same properties as the contact region shown in FIG. 3A, as previously discussed. A voltage Vp may be applied to second contact 228, and thereby applied to second doped region 226. Vp may be a positive voltage. Second doped region 226 functions as an anode of DPD 220.

DPD 220 may also include a third doped region 230. The third doped region 230 is shown in FIG. 22A as a p+ region, but may alternatively be a n+ region. A third contact 232 may be attached to third doped region 230. Third contact 232 may be formed on third doped region 230 in a similar manner as first contact 224 is formed on first doped region 222. Third contact 232 may be grounded (GND), thereby grounding third doped region 230. The voltage applied to third contact 232 may be used as a reference voltage that voltages provided to the device may be compared to. Thus, voltage measurements of Vn, Vreset, and Vp may be made relative to the voltage at third contact 232.

DPD 220 may also include a substrate region 234. Substrate region 234 may be an intrinsic or doped semiconductor, such as intrinsic silicon, germanium, or silicon carbide, or a lightly doped silicon, germanium, or silicon carbide. Substrate region 234 may be an n-type substrate or p-type substrate. DPD 220 also includes a light absorbing region 236 which absorbs light that may be incident on it. When DPD 220 is active, incident light that is absorbed by light absorbing region 236 may be converted to current, as will be explained below.

DPD 220 may further include first resettable n+ region 238 and second resettable n+ region 242. First resettable n+ region 238 and second resettable n+ region 242 may be located proximate to second doped region 226. For example, the cross section of DPD 220 shown in FIG. 22A shows that second doped region 226 can be located between first resettable n+ region 238 and second resettable n+ region 242. First resettable n+ region 238 and second resettable n+ region 242 may be formed by diffusing an n-type impurity in an n-type material formed in substrate region 234.

A first resettable contact 240 may be attached to first resettable n+ region 238. First resettable contact 240 may be formed on first resettable n+ region 238 in a similar manner as first contact 224 is formed on first doped region 222. Additionally, first resettable contact 240 may be formed and have the same properties as the contact region shown in FIG. 3A, as previously discussed. A voltage Vreset may be applied to first resettable contact 240, and thereby applied to first resettable n+ region 238. In some embodiments, Vreset may be a positive voltage. For example, in some embodiments, Vreset may be tuned to a value between 1 volt to 3.3 volts, inclusive. Alternatively, no voltage may be applied to resettable contact 240, and an open circuit may be formed.

A second resettable contact 244 may be attached to second resettable n+ region 242. Second resettable contact 244 may be formed on second resettable n+ region 242 in a similar manner as first contact 224 is formed on first doped region 222. Additionally, second resettable contact 244 may be formed and have the same properties as the contact region shown in FIG. 3A, as previously discussed. The voltage Vreset may be applied to second resettable contact 244, and thereby applied to second resettable n+ region 242, as shown in FIG. 22A. Alternatively, a different voltage to Vreset, such as Vreset2 may be applied to second resettable contact 244, and thereby applied to second resettable n+ region 242.

Shallow trench isolation (STI) regions 246 may be located between regions 230, 222, 238, 226, and 242 of DPD 220. STI regions 246 prevent current leakage between each of regions 230, 222, 238, 226, and 242. DPD 220 may alternatively not include STI regions 246.

In some embodiments, DPD 220 as shown in FIG. 22A may function as follows. First resettable n+ region 238 and second resettable n+ region 242 create a potential barrier at the junction with second doped region 226. Voltage Vn may be set to a negative voltage, voltage Vp may be set to a positive voltage, and third doped region 230 may be grounded. Vreset may initially be set to zero and contacts 240 and 244 may be set as open circuits. Under such conditions, DPD 220 may be in a sensing mode and forward biased. In response to incident light on light absorbing region 236, electron hole pairs form in substrate region 234. The electron-hole pairs may be separated by an electric field in substrate region 234 created by voltages Vp and Vn. Holes in substrate region 234 move toward first doped region 222 and electrons in substrate region 234 move toward second doped region 226. In particular, electrons accumulate in substrate region 234 near and/or beneath first resettable n+ region 238 and second resettable n+ region 242, and holes from second doped region 226 flow toward first doped region 222. As excess electrons accumulate in substrate region 234 near and/or beneath first resettable n+ region 238 and second resettable n+ region 242, the potential barrier may be lowered. This lowering may result in additional and/or greater hole current flow from second doped region 226 to first doped region 222, and the magnitude of output current may be increased. DPD 220 thereby outputs a current upon detecting or in response to the incident light.

When a positive voltage is applied as Vreset, DPD 220 may be in reset mode and reverse biased. In reset mode, little to no current may flow through substrate region 234 regardless of if incident light is present on absorbing region 236. Electrons that accumulated in substrate region 234 near and/or beneath first resettable n+ region 238 and second resettable n+ region 242, and holes from second doped region 226 that flowed toward first doped region 222 may be removed from substrate region 234. Thus, DPD 220 may be reset and not produce an output current until it is forward biased and placed into sensing mode.

Therefore, first resettable n+ region 238 and second resettable n+ region 242 may provide a potential barrier in DPD 220 without the use of a gate. This may be advantageous because it may provide for simpler fabrication. Additionally, these regions may provide a deep depletion region for equivalent doping, which may result in the potential barrier having improved performance.

Figure 22B:
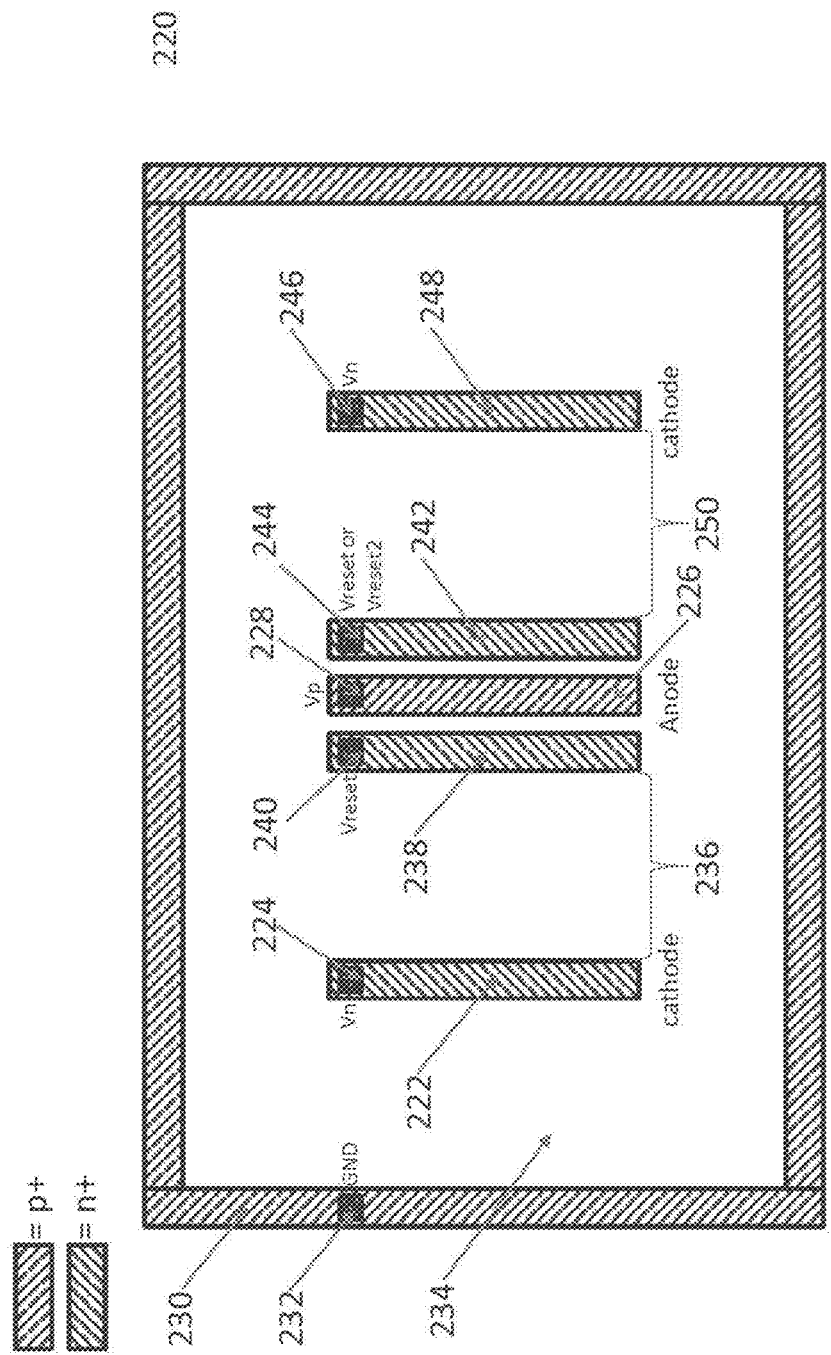
FIG. 22B shows the dynamic photodiode with resettable N+ doping in a linear arrangement from a top view according to an embodiment of the present disclosure.

FIG. 22B shows DPD 220 in a linear arrangement from a top view according to an embodiment of the present disclosure. It should be noted that FIG. 22B is an expanded view of the cross section in FIG. 22A, and shows an additional doped region 248 and absorbing region 250. When DPD 220 is active, incident light that is absorbed by light absorbing region 250 may be converted into current in a similar manner as explained above with reference to FIG. 22A.

Doped region 248 is shown in FIG. 22B as an n+ region, but may alternatively be a p+ region. A contact 246 may be attached to doped region 248. Contact 246 may be formed on doped region 248, and may be a made of a conductive or semiconductor material type, such as a metal (e.g., aluminum or copper), a metal compound, and/or a doped semiconductor (e.g., silicon, silicon germanium, or gallium arsenide doped with donor or acceptor impurities). Contact 246 may be a p+ or n+ type material. Contact 246 may be formed and have the same properties as the contact region shown in FIG. 3A, as previously discussed. The voltage Vn may be applied to contact 246, and thereby applied to doped region 248. Vn may be a negative voltage or a zero voltage. Doped region 248 functions as an additional cathode of DPD 220. As shown in FIG. 22B, absorbing region 250 may be located between second resettable n+ region 242 and doped region 248.

As shown in FIG. 22B, regions 222, 238, 226, 242, and 248 may be arranged in a linear formation, and may be substantially parallel to each other. The length and width of each region 222, 238, 226, 242, and 248 may be the same, or may vary. Additionally, contacts 224, 240, 228, 244, and 246 may be located closer to an end of its respective region as shown in FIG. 22B, or may alternatively be located centrally within its respective region. The distance between each region may be varied. For example, the distance between region 238 and region 226 may be the same as the distance between region 226 and region 242, or the distance between region 238 and region 226 may be different than the distance between region 226 and region 242. Moreover, the distance between region 222 and region 238 may be the same as the distance between region 242 and region 248, or the distance between region 222 and region 238 may be different than the distance between region 242 and region 248. Therefore, absorbing regions 236 and 250 may have the same or different sized area of DPD 220.

Third doped region 230 surrounds regions 222, 238, 226, 242, and 248. As shown in FIG. 22B, region 230 may extend around the edges of DPD 220.

Alternatively, region 230 may be located a distance from the edges of DPD 220. The width of region 230 may be substantially uniform around DPD 220, or may vary around DPD 220. Contact 232 is shown in FIG. 22B as being located closer to a left edge portion of DPD 220, but may alternatively be located closer to any of the other edges of DPD 220. The linear arrangement of FIG. 22B may be advantageous because it may provide long-form regions that may improve device performance.

Figure 22C:
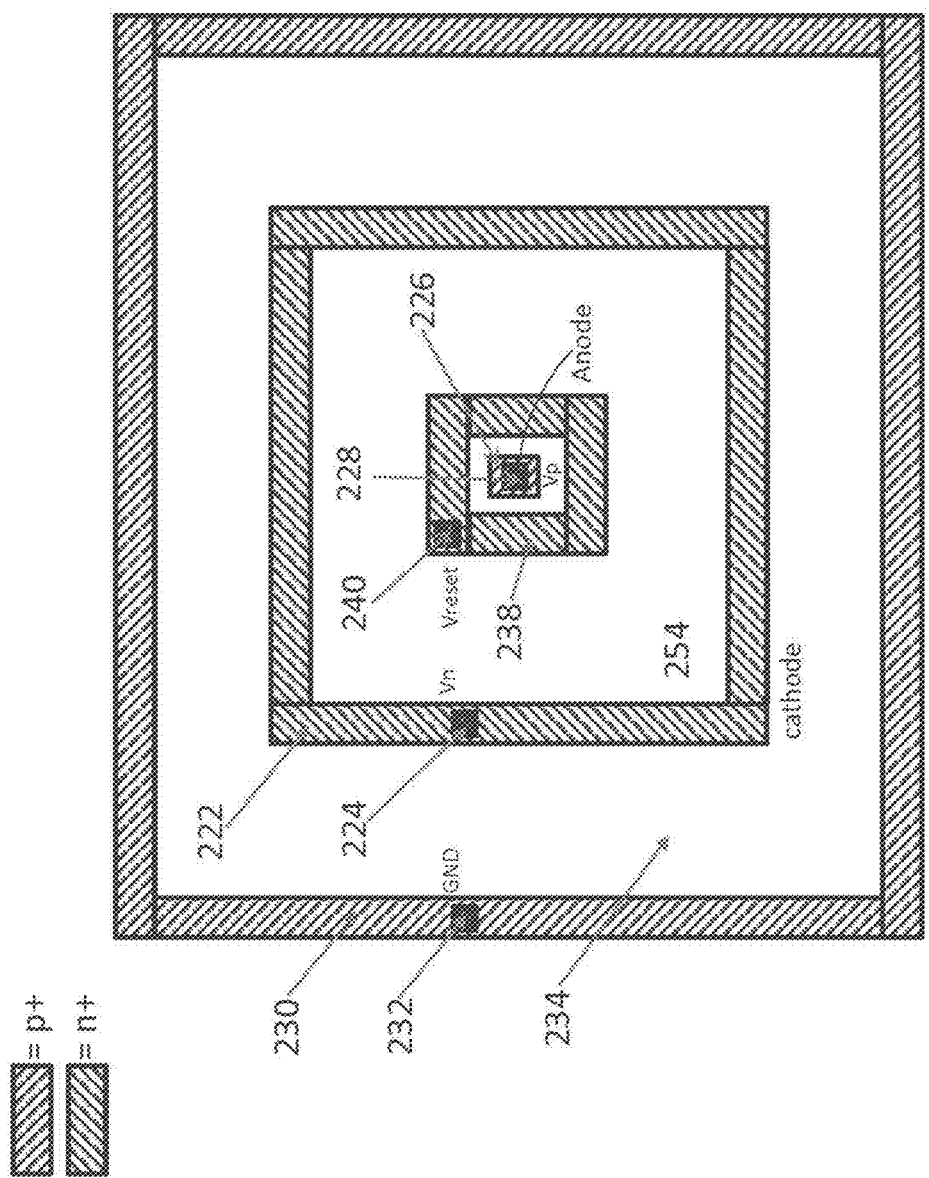
FIG. 22C shows a dynamic photodiode with resettable N+ doping in a surrounding arrangement from a top view according to an embodiment of the present disclosure.

FIG. 22C shows a DPD 252 with resettable N+ doping in a surrounding arrangement from a top view according to an embodiment of the present disclosure. DPD 252 shown in FIG. 22C features many of the same elements of DPD 220, but includes a light absorbing region 254.

As shown in FIG. 22C, region 222 surrounds region 238. Region 222 forms a continuous region around region 238. The width of region 222 may be substantially uniform, or may vary. Moreover, region 222 may be curved circularly around region 238, or may be formed by linear edges that surround region 238 (as shown in FIG. 22C). Contact 224 may be located at any location of region 222, and may provide voltage Vn to region 222.

Light absorbing region 254 may be located between regions 222 and region 238. Light absorbing region 254 may vary in size based on the width of region 222 and 238, and how close regions 222 and 238 may be arranged next to each other. When DPD 252 is active, incident light that is absorbed by light absorbing region 254 may be converted to current in a manner as explained above with reference to DPD 220.

Region 238 surrounds region 226 and forms a continuous region around region 226. The width of region 238 may be substantially uniform, or may vary. Moreover, region 238 may be curved circularly around region 226, or may be formed by linear edges that surround region 226 (as shown in FIG. 22C). Contact 240 may be located at any location of region 238, and may provide voltage Vreset to region 238. Region 226 includes contact 228, which may provide voltage Vp to region 226. Therefore, FIG. 22C shows that an anode may be formed by region 226, and a cathode may be formed by region 222.

The surrounding arrangement of FIG. 22C may be advantageous because it may provide improved potential barriers in the device.

Figure 23A:
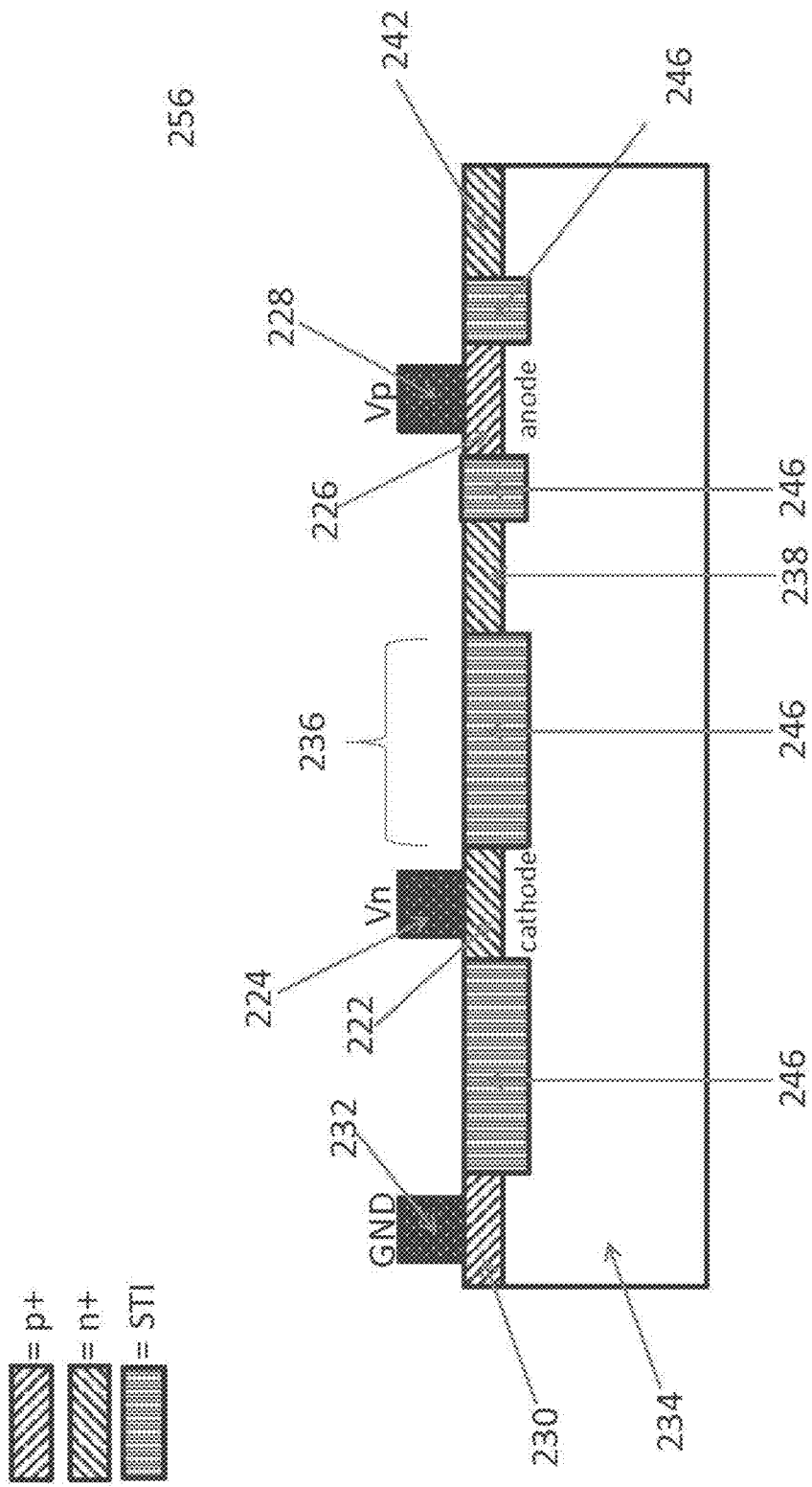
FIG. 23A shows a cross section of dynamic photodiode with floating N+ doping according to an embodiment of the present disclosure.

FIG. 23A shows a cross section of a DPD 256 with floating N+ doping according to an embodiment of the present disclosure. As shown in FIG. 23A, DPD 256 features the same elements as DPD 220, but does not include contacts 240 and 244. Thus, regions 238 and 242 may be floating regions that may not be connected to contacts. Regions 238 and 242 are shown in FIG. 23A as being floating N+ diffusion regions. However, regions 238 and 242 may alternatively be floating P+ diffused regions.

By removing contacts 240 and 244, DPD 256 features a lower capacitance compared to DPD 220. This reduction in capacitance may be caused by the lack of contacts. Having a lower capacitance may be beneficial because it may result in a more sensitive device.

Figure 23B:
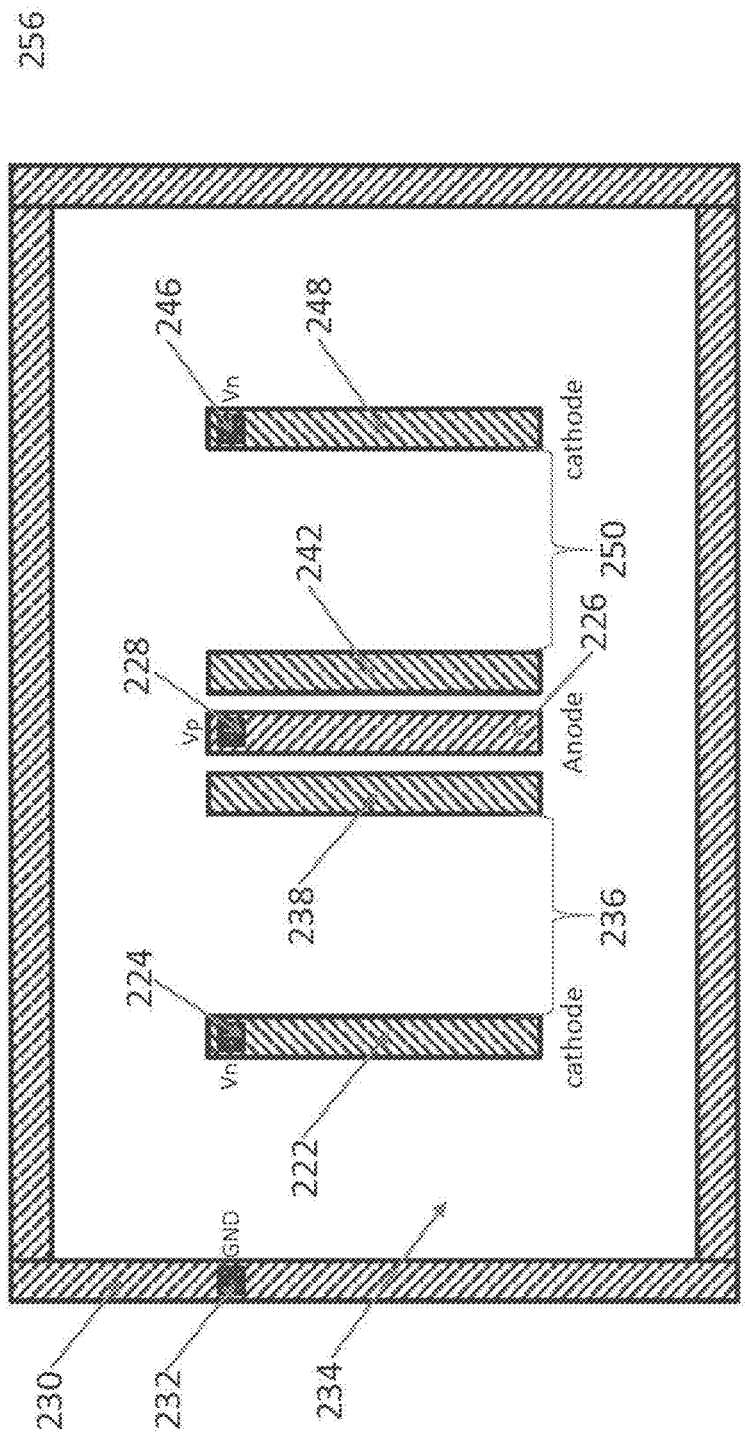
FIG. 23B shows the dynamic photodiode with floating N+ doping in a linear arrangement from a top view according to an embodiment of the present disclosure.

FIG. 23B shows DPD 256 in a linear arrangement from a top view according to an embodiment of the present disclosure. As shown in FIG. 23B, DPD 256 features the same elements as DPD 220, but does not include contacts 240 and 244. Elements of FIG. 23B may be the same as the elements discussed above with reference to FIG. 22B, so additional explanation of them with reference to FIG. 23B is not included for brevity.

Figure 23C:
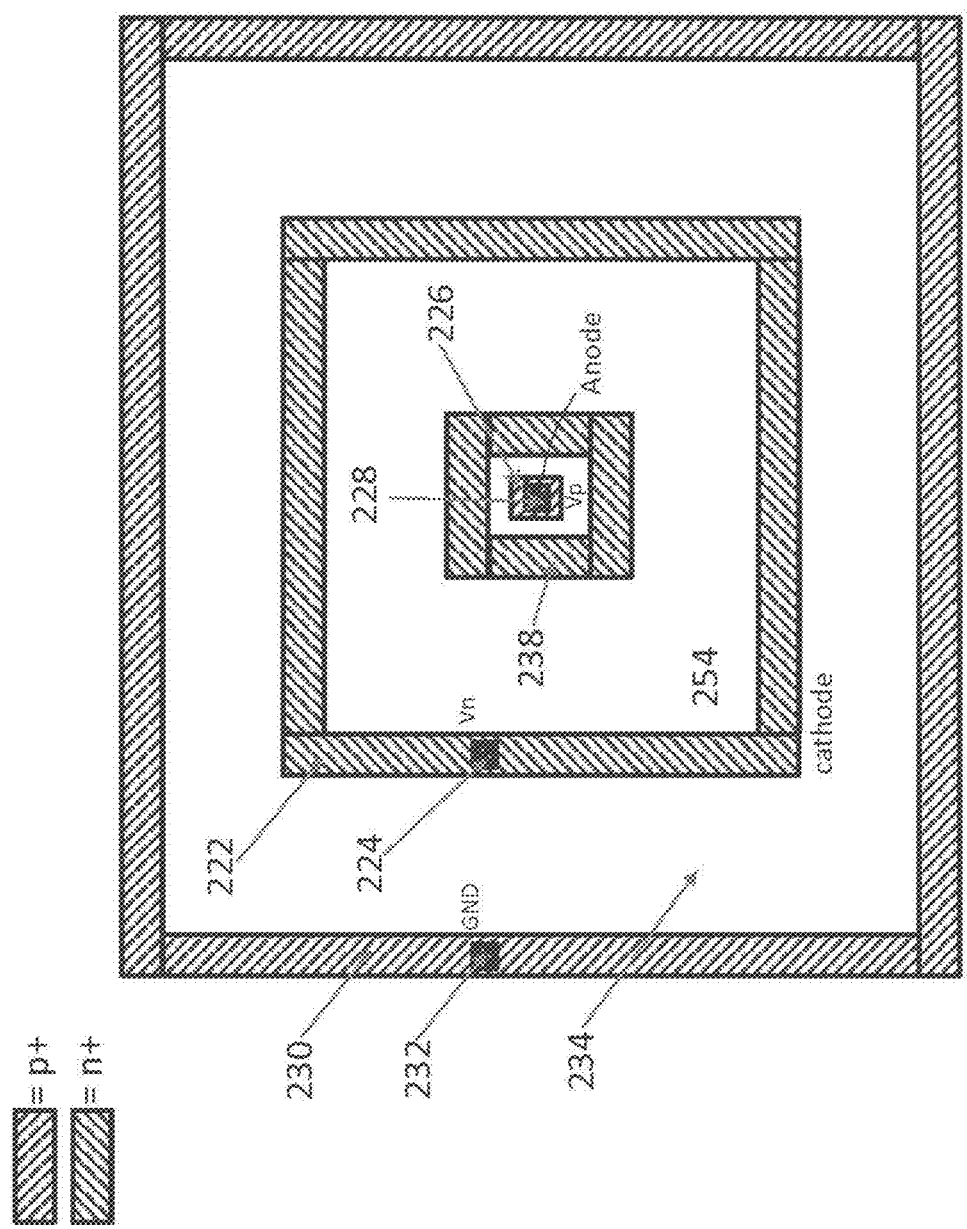
FIG. 23C shows a dynamic photodiode with floating N+ doping in a surrounding arrangement from a top view according to an embodiment of the present disclosure.

FIG. 23C shows a DPD 258 with floating N+ doping in a surrounding arrangement from a top view according to an embodiment of the present disclosure. As shown in FIG. 23C, DPD 258 features the same elements as DPD 252 from FIG. 22C, but does not include contact 240. Elements of FIG. 23C may be the same as the elements discussed above with reference to FIG. 22C, so additional explanation of them with reference to FIG. 23C is not included for brevity.

Figure 24A:
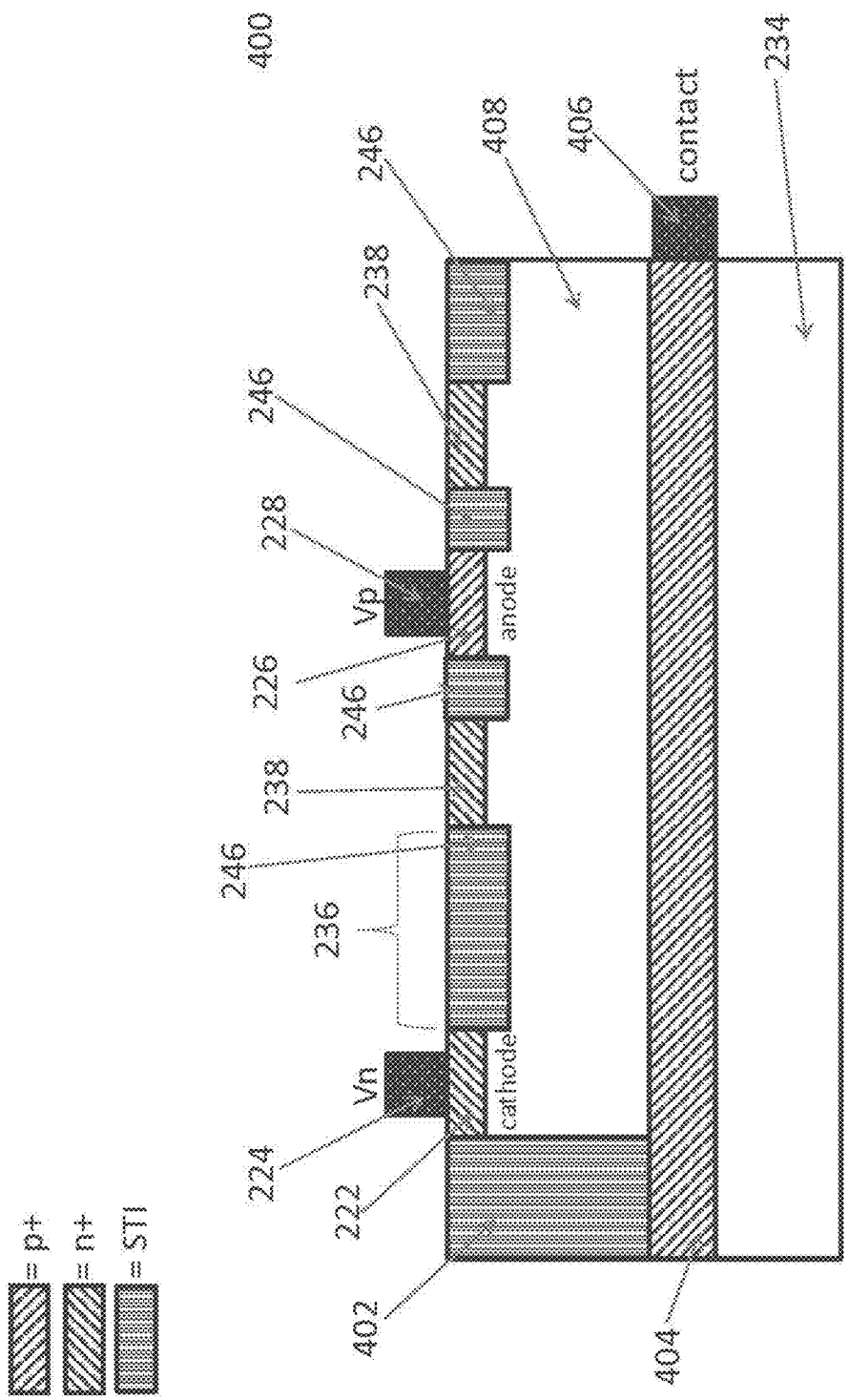
FIG. 24A shows a cross section of a dynamic photodiode with a trench according to an embodiment of the present disclosure

FIG. 24A shows a cross section of a DPD 400 with a trench according to an embodiment of the present disclosure. As shown in FIG. 24, DPD 400 features the same elements as DPD 256. However, DPD 400 also includes trench 402, layer 404, contact 406, and region 408. Trench 402 may be located next to region 222. Layer 404 may be located beneath region 234, and also contacts a lower region of trench 402. Layer 404 may be a p+ or n+ region. Contact 406 may be similar to contacts 224 and 228, and may be grounded or have a voltage applied to it. Region 408 may be a p-type or n-type region. DPD 400 may provide reduced cross-talk associated with the device.

Figure 24B:
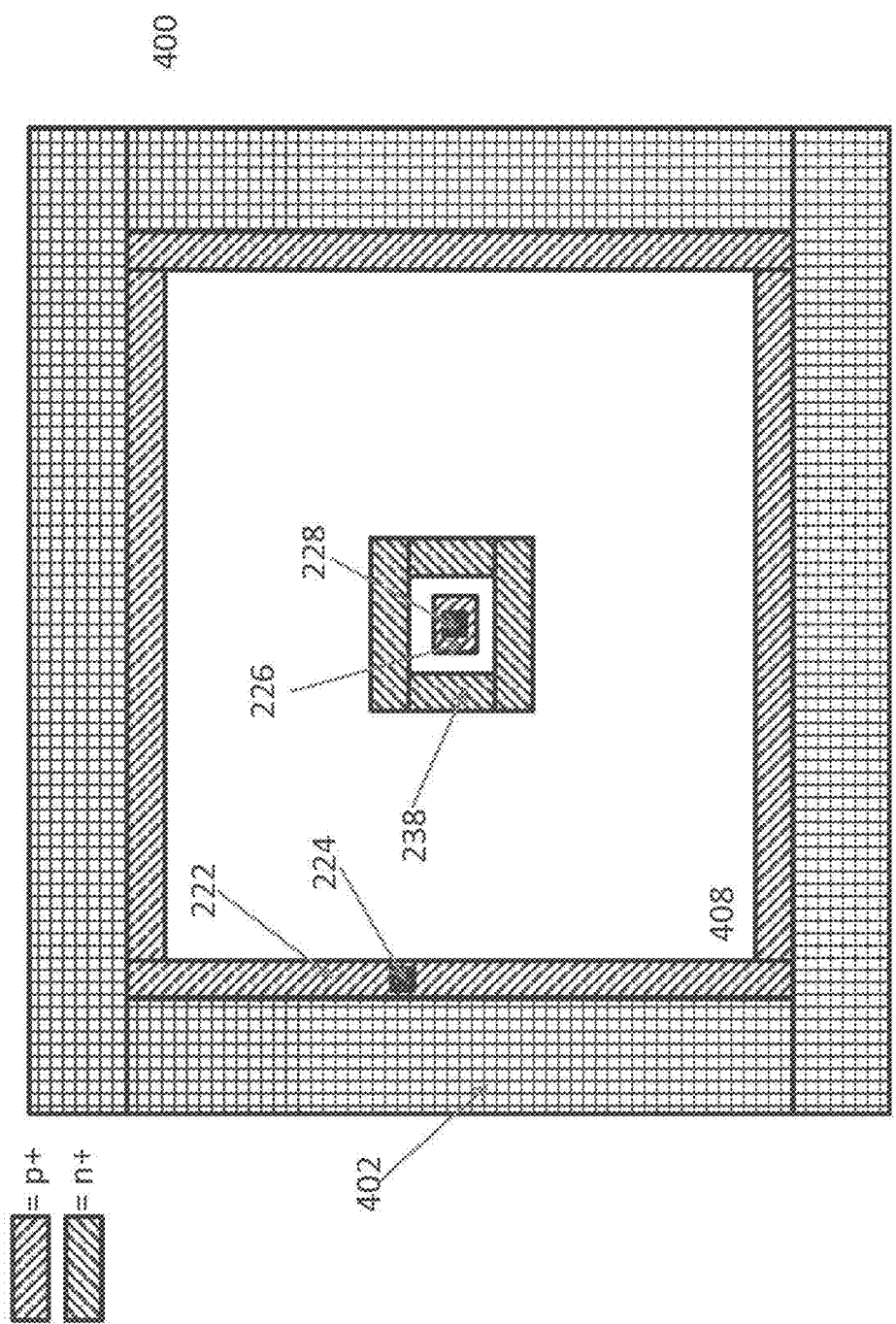
FIG. 24B shows the dynamic photodiode with a trench from a top view in a surrounding arrangement according to an embodiment of the present disclosure

FIG. 24B shows DPD 400 from a top view in a surrounding arrangement according to an embodiment of the present disclosure.

Figure 24C:
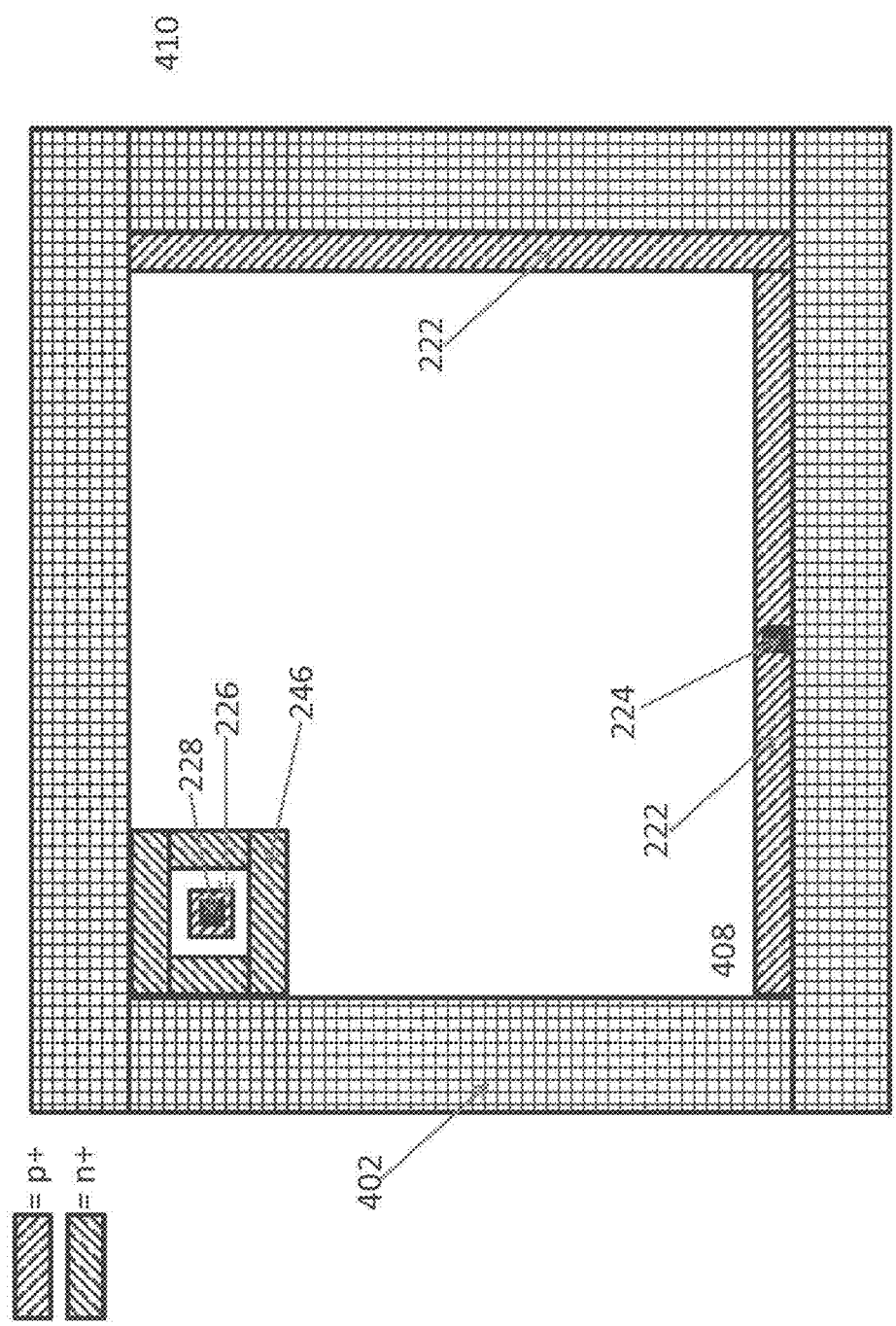
FIG. 24C shows another dynamic photodiode with a trench from a top view.

FIG. 24C shows a DPD 410 with a trench from a top view. DPD 410 has the same elements as DPD 400, but the elements may be arranged in a different manner compared to DPD 400. As shown in FIG. 24C, region 246 surrounds region 228. Contact 228 may be located on region 226. Region 246 may be located in a corner of device 410 and has trench 402 proximate to multiple edges of region 246. Trench 402 may be adjacent to region 246. Device 410 also includes region 222 with contact 224 proximate to trench 402 at two edges of device 410. Region 222 may be adjacent to two edges of device 410. Region 222 may be extended in areas that are opposite diagonally, laterally, or vertically to the corner where region 246 may be located. DPD 410 may provide reduced crosstalk.

Figure 25:
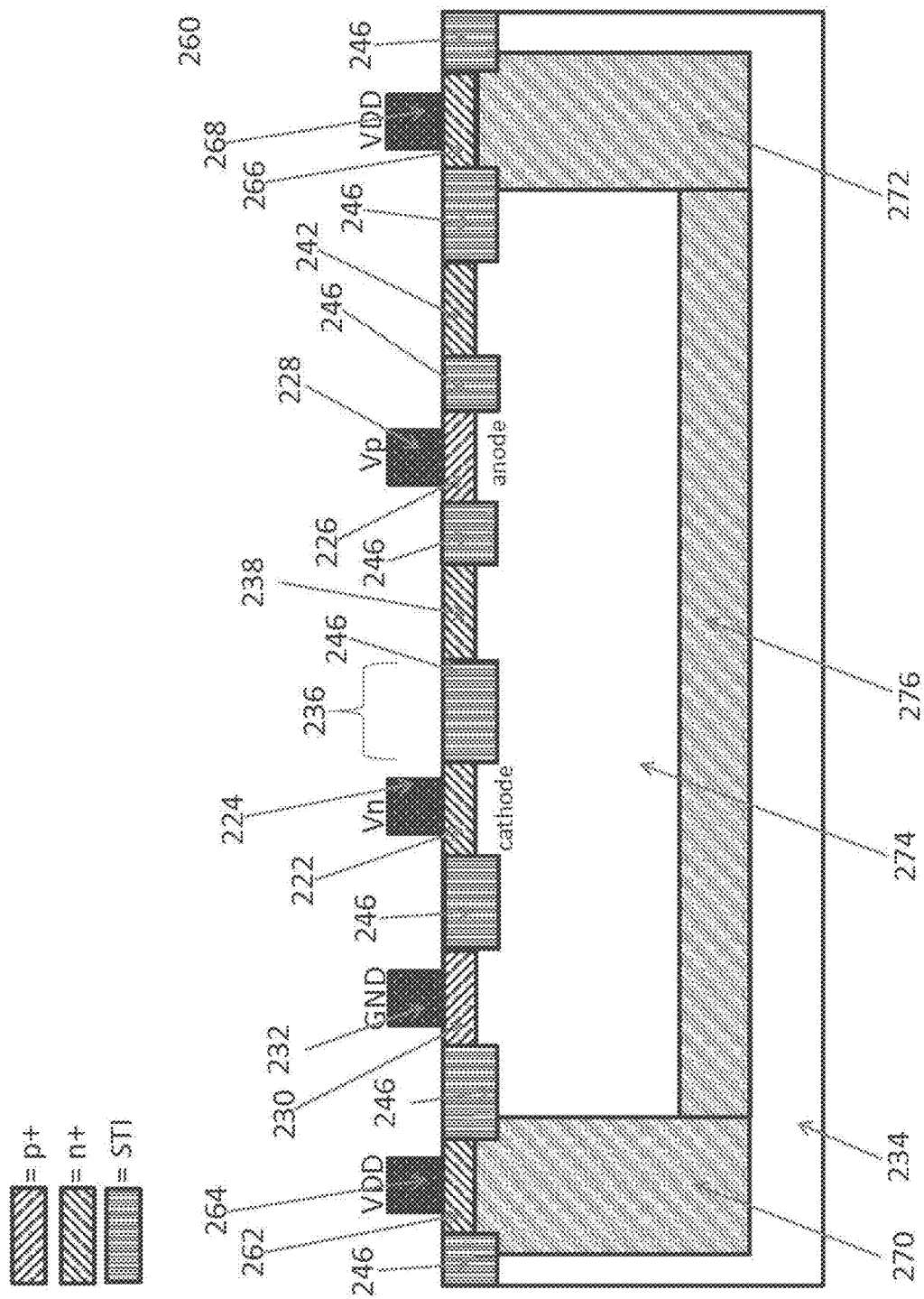
FIG. 25 shows a cross section of a dynamic photodiode with floating N+ doping in a triple well according to an embodiment of the present disclosure.

FIG. 25 shows a cross section of a DPD 260 with floating N+ doping in a triple well according to an embodiment of the present disclosure. DPD 260 features the same elements as DPD 256, but further includes doped regions 262 and 266, contacts 264 and 268, well 270, well 272, well 274, and deep well 276.

Doped regions 262 and 266 are shown in FIG. 25 as n+ regions, but may alternatively be p+ regions. Contact 264 may be attached to region 262, and contact 268 may be attached to region 266. Contacts 264 and 268 may be formed on their respective regions, and may be a made of a conductive or semiconductor material type, such as a metal (e.g., aluminum or copper), a metal compound, and/or a doped semiconductor (e.g., silicon, silicon germanium, or gallium arsenide doped with donor or acceptor impurities). Contacts 264 and 268 may be a p+ or n+ type material. Contacts 264 and 268 may be formed and have the same properties as the contact region shown in FIG. 3A, as previously discussed. A voltage VDD may be applied to contacts 264 and 268, and thereby applied to doped regions 262 and 266. Voltage VDD may be a voltage that is equal to or greater than the highest voltage in an inner region of the device. VDD may help provide device isolation by reverse biasing junctions on the inside and outside of the device.

Wells 270 and 272 may be located within substrate 234 beneath regions 262 and 266, respectively. Wells 270 and 272 are shown in FIG. 25 as being n-wells, but may alternatively be p-wells. Well 274 may be a p-well, or alternatively be an n-well. Deep well 276 is shown in FIG. 25 as being an n-well, but may alternatively be a p-well. Deep well 276 may be adjacent to well 270 and well 272, and contact well 274. As shown in FIG. 25, deep well 276, well 270, and well 272 may surround well 274.

The arrangement of DPD 260 may be advantageous because it may provide device isolation and reduce crosstalk.

It should be noted that the arrangement shown in FIG. 25 may also be applicable to DPDs with resettable N+ doping, such as DPDs 220 and 252, for example. Moreover, the configuration of the DPDs shown in FIGS. 23 and 24 may be applicable to all photodiodes as disclosed herein.

Figure 26A:
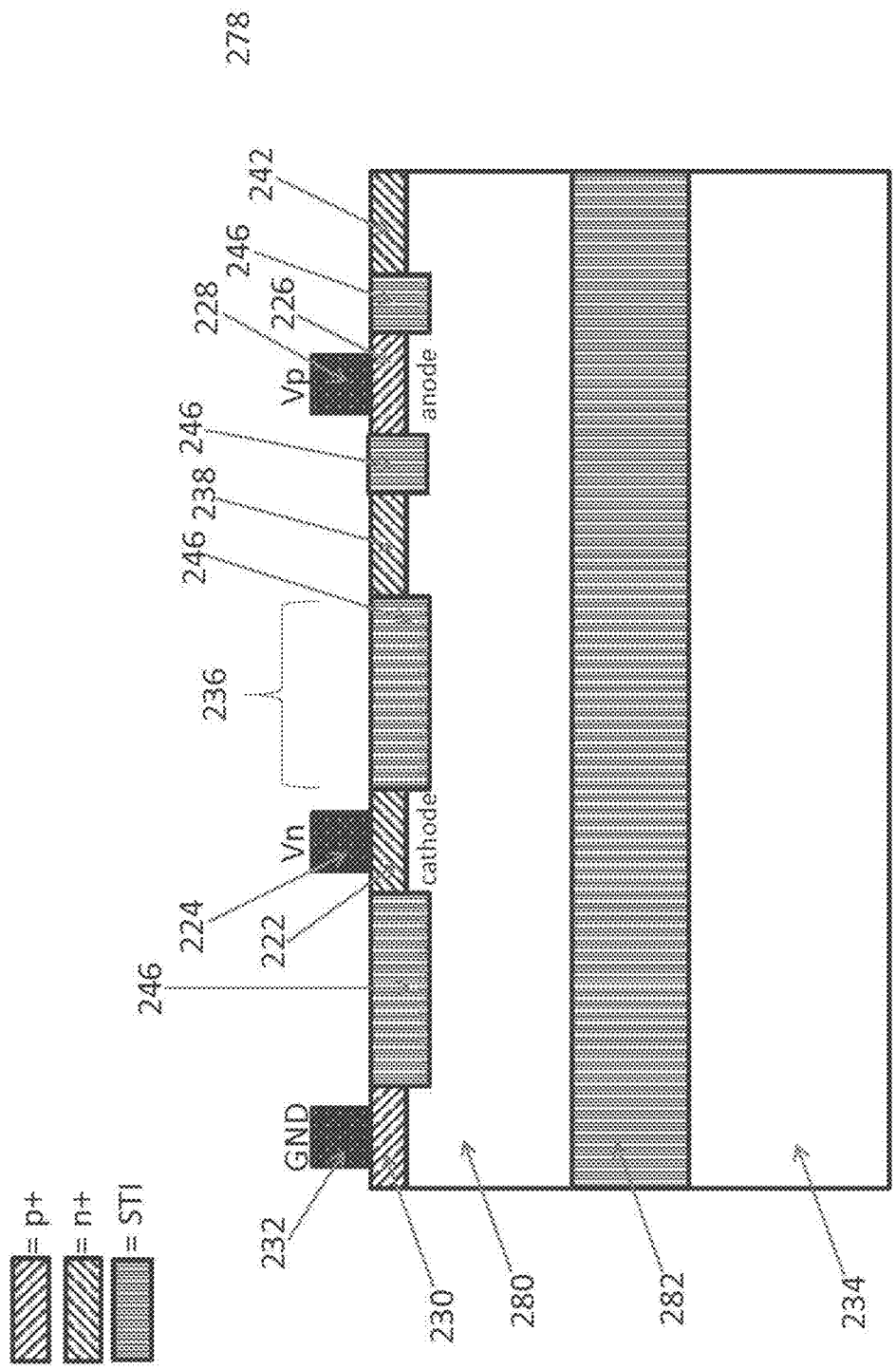
FIG. 26A shows a cross section of a dynamic photodiode with floating N+ doping on a semiconductor on insulator (SOI) substrate according to an embodiment of the present disclosure.

FIG. 26A shows a cross section of a DPD 278 with floating N+ doping on a semiconductor on insulator (SOI) substrate according to an embodiment of the present disclosure. Region 280 may be an epi-layer that may be a p-type material. Region 282 may be a buried oxide region. DPD 278 may be advantageous because less dark current may be produced. Less dark current may be produced because the device may have improved electrostatic control, and therefore may have improved potential barriers and less device leakage. It should be noted that the configuration of DPD 278 may also be applicable to DPDs with resettable N+ regions, and all photodiodes as disclosed herein.

Figure 26B:
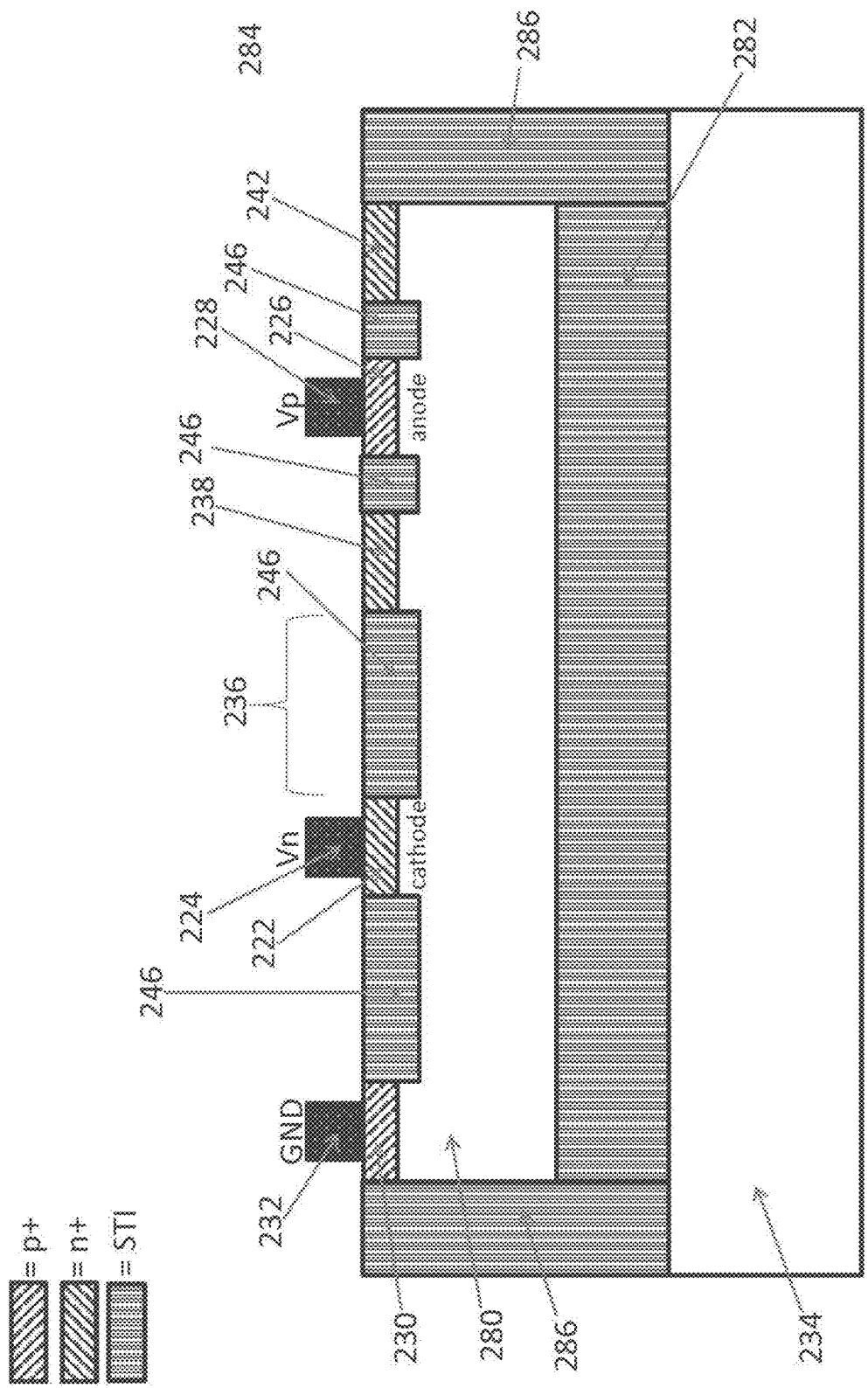
FIG. 26B shows cross section of a dynamic photodiode with floating N+ doping on a semiconductor on insulator (SOI) substrate with deep trench isolation (DTI) according to an embodiment of the present disclosure.

FIG. 26B shows a cross section of a DPD 284 with floating N+ doping on a semiconductor on insulator (SOI) substrate with deep trench isolation (DTI) according to an embodiment of the present disclosure. Regions 286 may be DTI regions. Regions 286 may be formed by silicon dioxide (SiO$_2$), for example, or any dielectric. In one example, the region 286 may be a low-k dielectric. Regions 286 may provide device isolation by surrounding regions with such dielectric material. It should be noted that the configuration of DPD 284 may also be applicable to DPDs with resettable N+ regions, and all photodiodes as disclosed herein.

Figure 27:
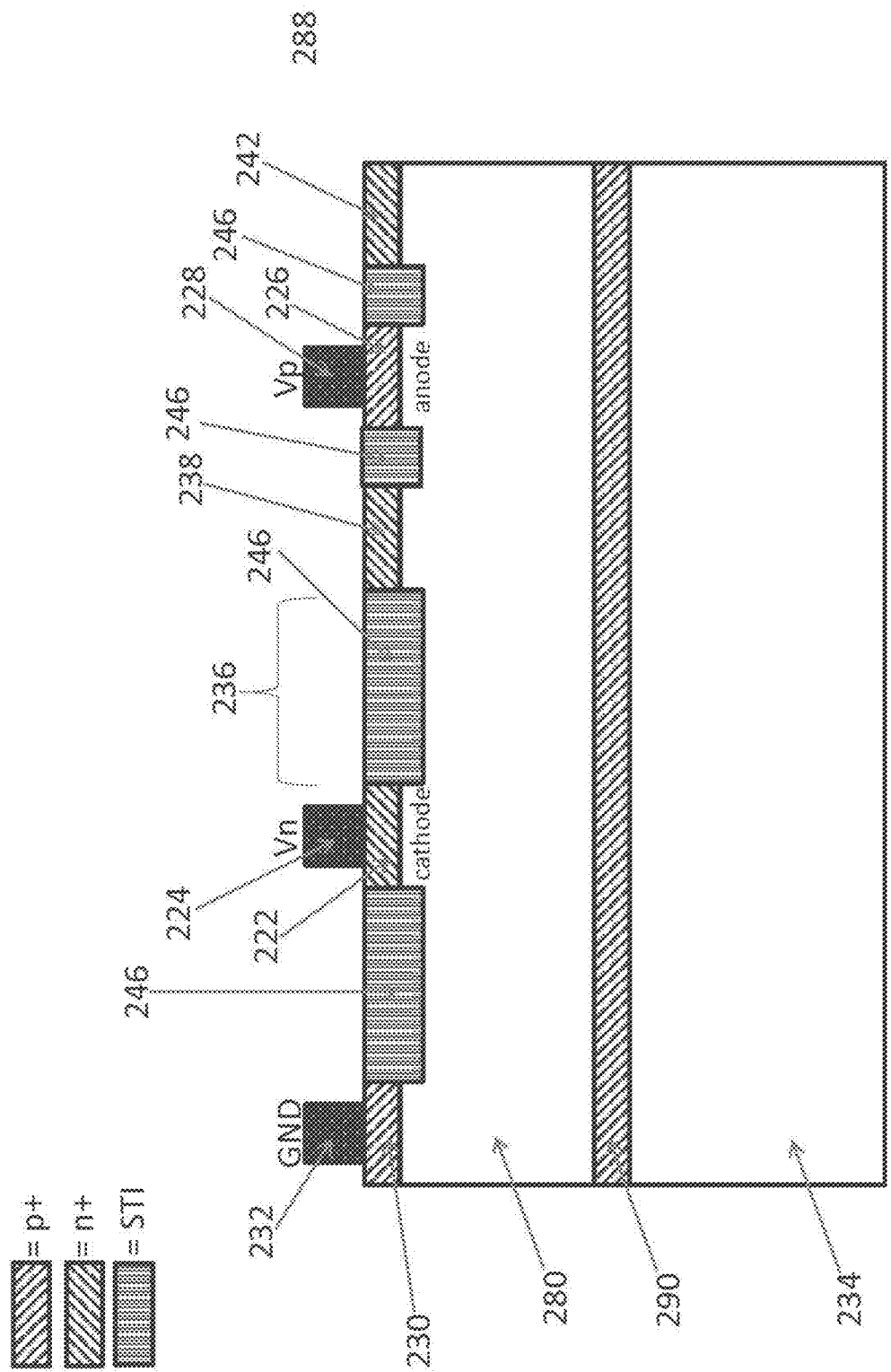
FIG. 27 shows a cross section of a dynamic photodiode with floating N+ doping on an epitaxial layer according to an embodiment of the present disclosure.

FIG. 27 shows a cross section of a DPD 288 with floating N+ doping on an epitaxial layer according to an embodiment of the present disclosure. Region 290 may be the epitaxial layer, and may be located underneath region 280 and on top of region 234. Region 290 may be a p+ region or an n+ region. DPD 288 may be advantageous because locating region 280 on top of regions 290 and 234 may improve reset of the device, provide larger depletion areas, and control electric potential of the device. Region 280 may be low doped, which may provide the larger depletion areas. Region 234 may be grounded, highly doped, and therefore provide low resistivity. Region 234 may further provide improved electric potential control. It should be noted that the configuration of DPD 288 may also be applicable to DPDs with resettable N+ regions, and all photodiodes as disclosed herein.

Figure 28A:
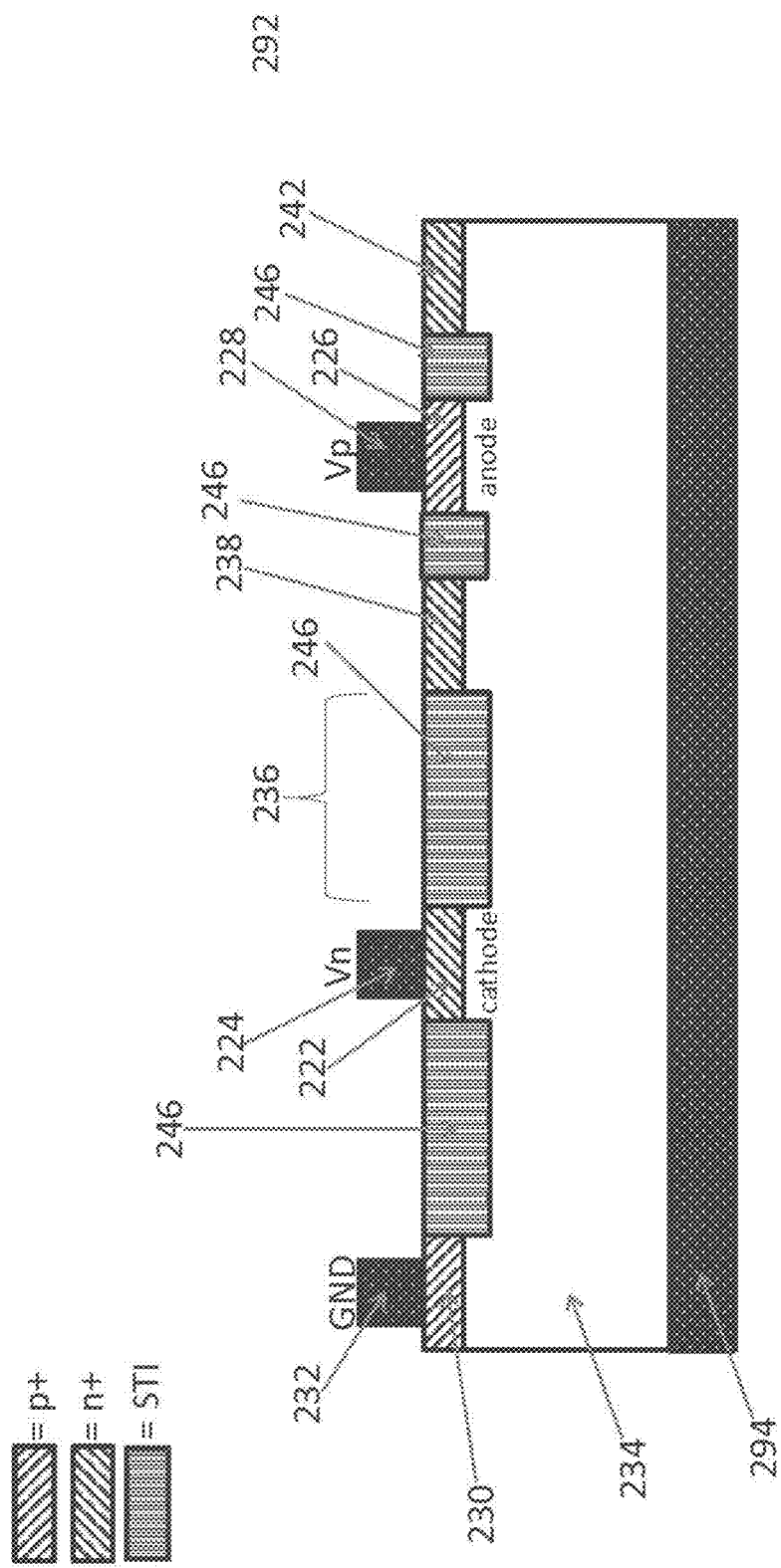
FIG. 28A shows a cross section of a dynamic photodiode with floating N+ doping on an etched wafer with a backside contact according to an embodiment of the present disclosure.

FIG. 28A shows a cross section of a DPD 292 with floating N+ doping on an etched wafer with a backside contact 294 according to an embodiment of the present disclosure. Contact 294 may be a GND contact. Contact 294 may be the same material as other contacts, such as contacts 232, 224, and 228. Contact 294 may be formed in DPD 292 by etching substrate region 234. By having contact 294 etched into substrate region 234, DPD 292 may provide improved electrical potential control. Moreover, larger depletion areas may be generated. It should be noted that the configuration of DPD 292 may also be applicable to DPDs with resettable N+ regions, and all photodiodes as disclosed herein.

Figure 28B:
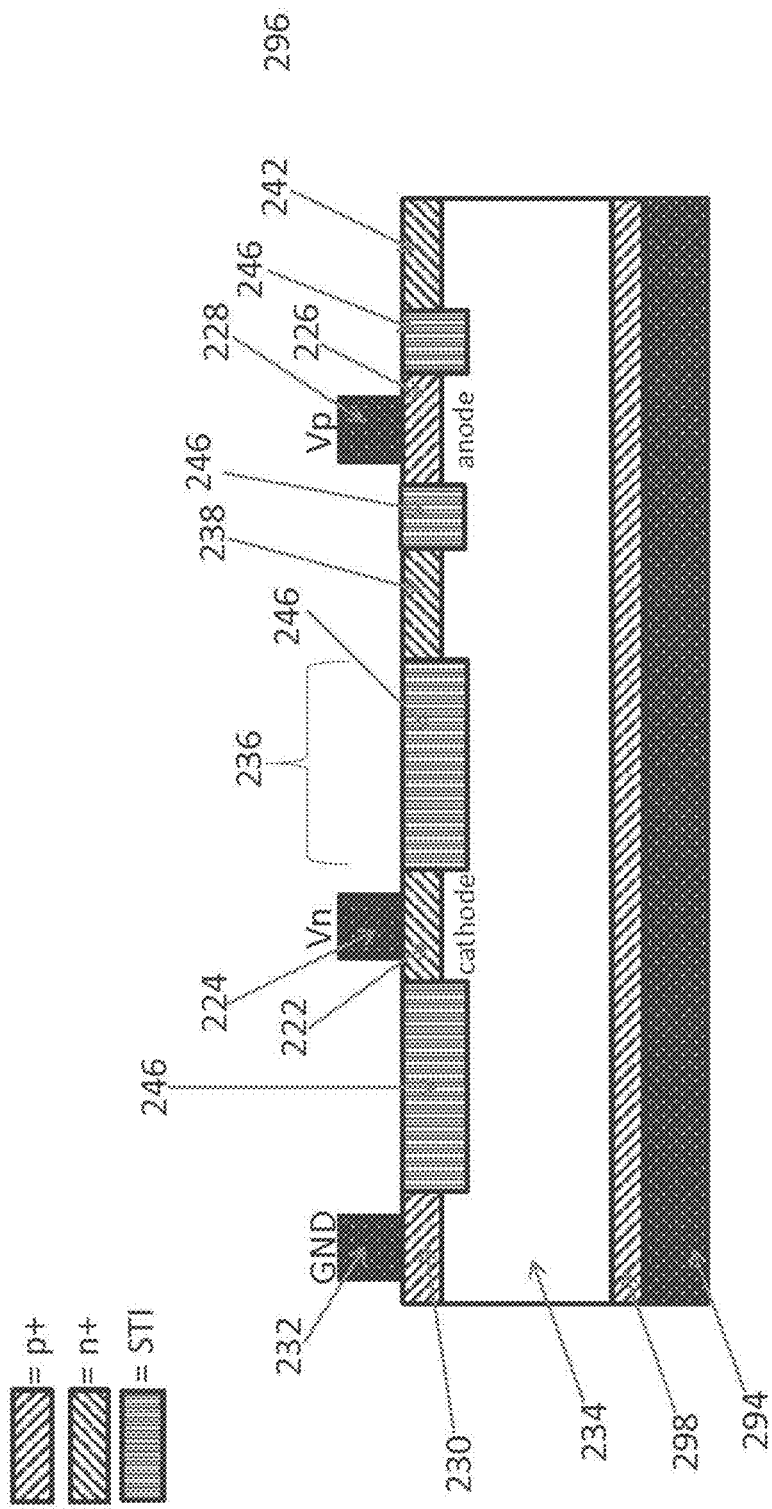
FIG. 28B shows a cross section of a dynamic photodiode with floating N+ doping on an etched wafer with a backside contact and backside p+ doping layer according to an embodiment of the present disclosure.

FIG. 28B shows a cross section of a DPD 296 with floating N+ doping on an etched wafer with a backside contact 294 and backside p+ doping layer according to an embodiment of the present disclosure. Layer 298 may be a p+ region, and may be located between contact 294 and substrate region 234. Layer 298 may provide lower resistance for contact 294, which improves performance of DPD 296. The lower contact resistance may provide improved electrostatic control and lower current leakage. It should be noted that the configuration of DPD 296 may also be applicable to DPDs with resettable N+ regions, and all photodiodes as disclosed herein.

Figure 29A:
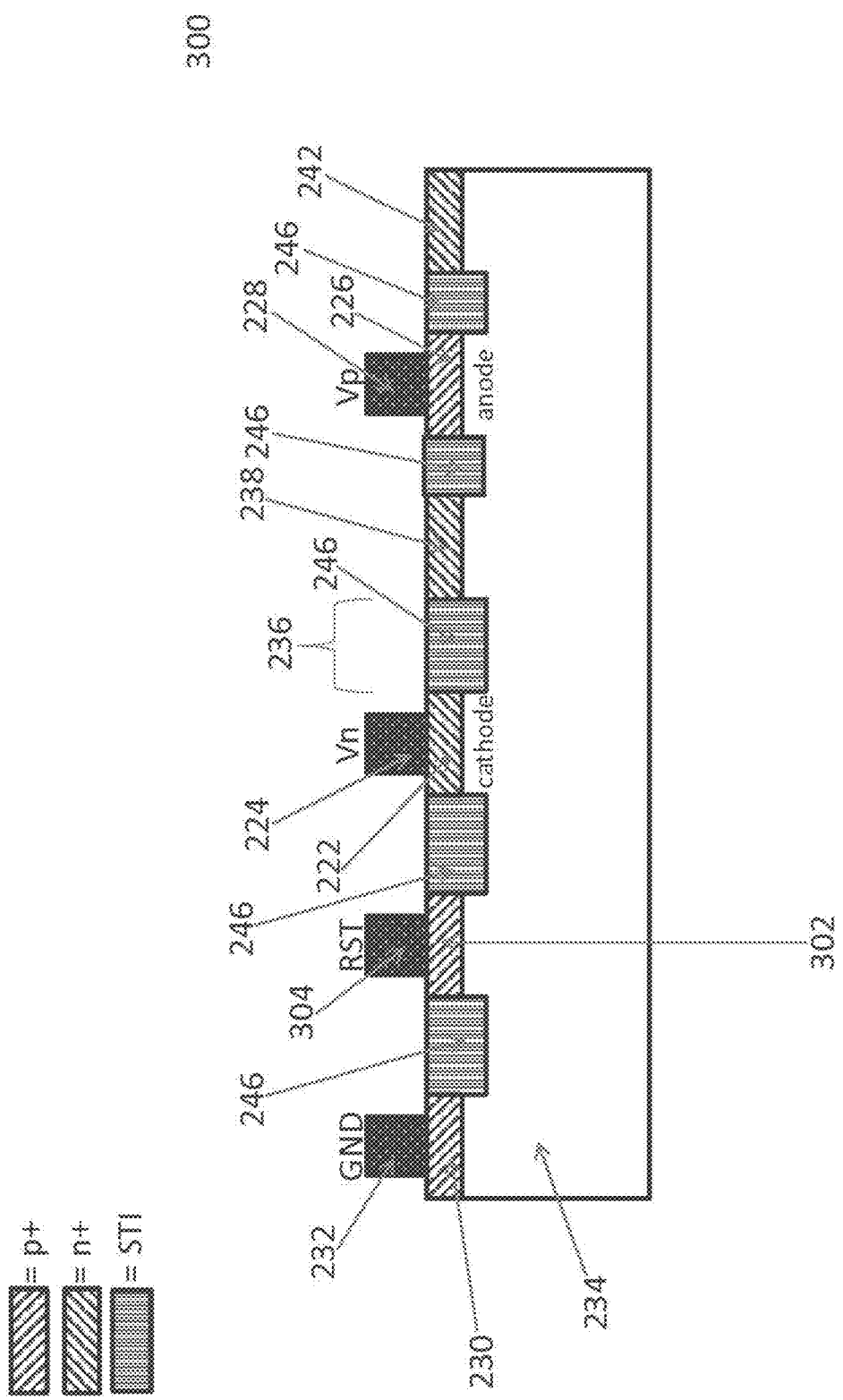
FIG. 29A shows a cross section of a dynamic photodiode with floating N+ doping and reset p+ doping diffusion according to an embodiment of the present disclosure.

FIG. 29A shows a cross section of a DPD 300 with floating N+ doping and reset p+ doping diffusion according to an embodiment of the present disclosure. Contact 304 may be provided on p+ region 302. Contact 304 may be a reset contact, where a voltage RST may be applied to it. Contact 304 may be made from the same materials as contacts 232, 224, and 228. When voltage RST is positive and Vn is a positive voltage that is equal to or greater than the voltage RST, DPD 300 may be in reset mode and reverse biased. In reset mode, little to no current flows through substrate region 234 regardless of whether light is incident on absorbing region 236. Electrons that accumulate in substrate region 234 near and/or beneath first resettable n+ region 238 and second resettable n+ region 242, and holes from second doped region 226 that flow toward first doped region 222 may be removed from substrate region 234. Thus, DPD 300 may be reset and not produce an output current until it is forward biased and placed into a sensing mode. Including contact 304 may provide more efficient carrier evacuation from substrate region 234 due to an electric field created when the voltage RST is applied to it. It should be noted that the configuration of DPD 300 may also be applicable to all photodiodes as disclosed herein.

Figure 29B:
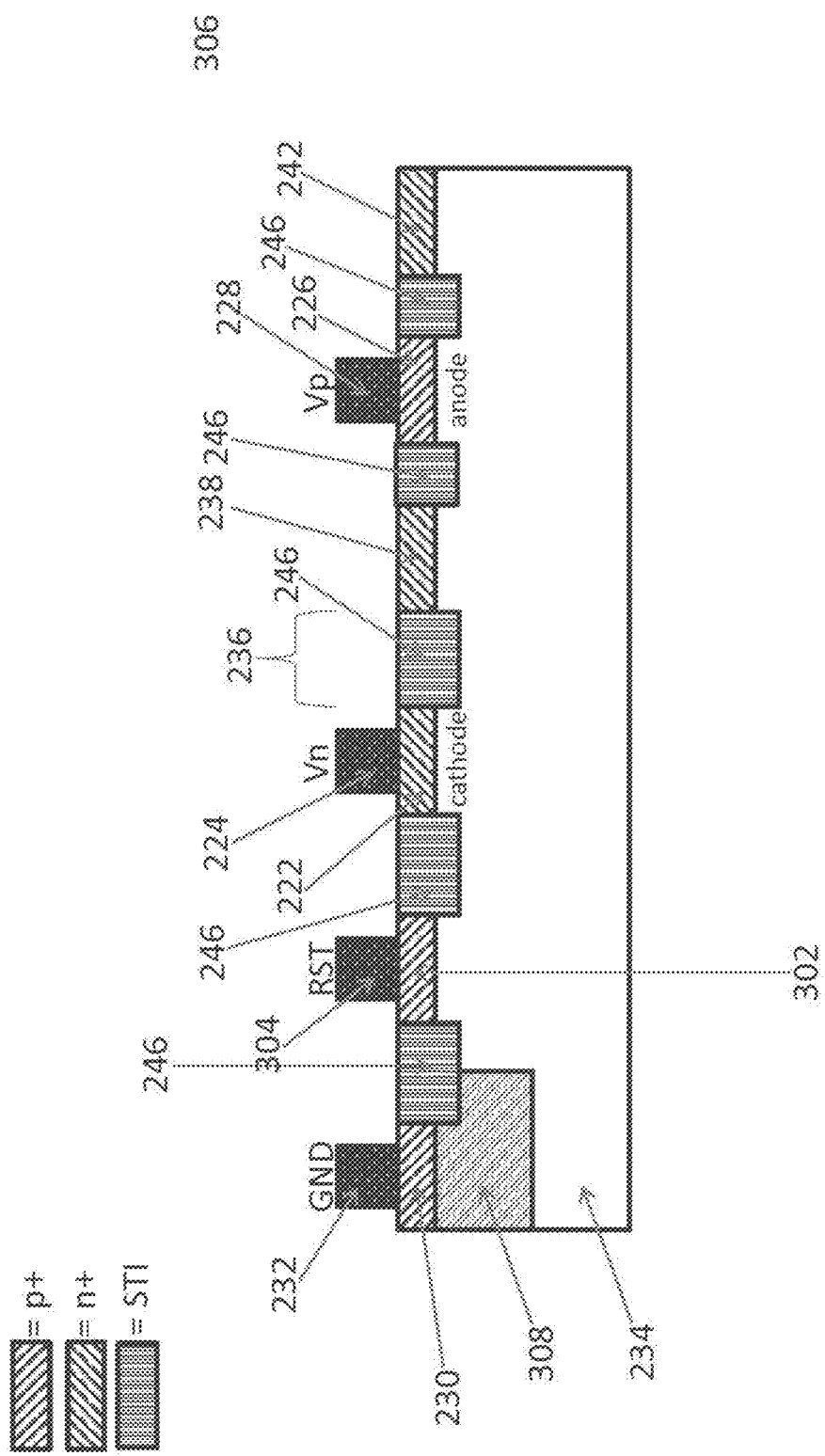
FIG. 29B shows a dynamic photodiode with floating N+ doping, reset p+ doping diffusion, and a well according to an embodiment of the present disclosure.

FIG. 29B shows a cross section of a DPD 306 with floating N+ doping, reset p+ doping diffusion, and a well 308 according to an embodiment of the present disclosure. Well 308 may be a p-well or an n-well, and may be matched to have the same doping type as substrate region 234 and third doped region 230. For example, if substrate region 234 is a p-substrate and third doped region 230 is a p+ doped region, well 308 may be a p-well. Alternatively, if substrate region 234 is an n-substrate and third doped region 230 is an n+ doped region, well 308 may be an n-well. Well 308 surrounds contact 232 and third doped region 230, and acts to extend contact 232 into substrate 234. This extension may provide improved electric potential control in the device because the GND signal applied to contact 232 may be further embedded into substrate 234, and cause a higher potential barrier within DPD 306, which in turn may reduce leakiness of the device and help fix the potential of substrate region 234. Thus, the performance of DPD 306 may be improved. It should be noted that the configuration of DPD 306 may also be applicable to all photodiodes as disclosed herein.

Figure 29C:
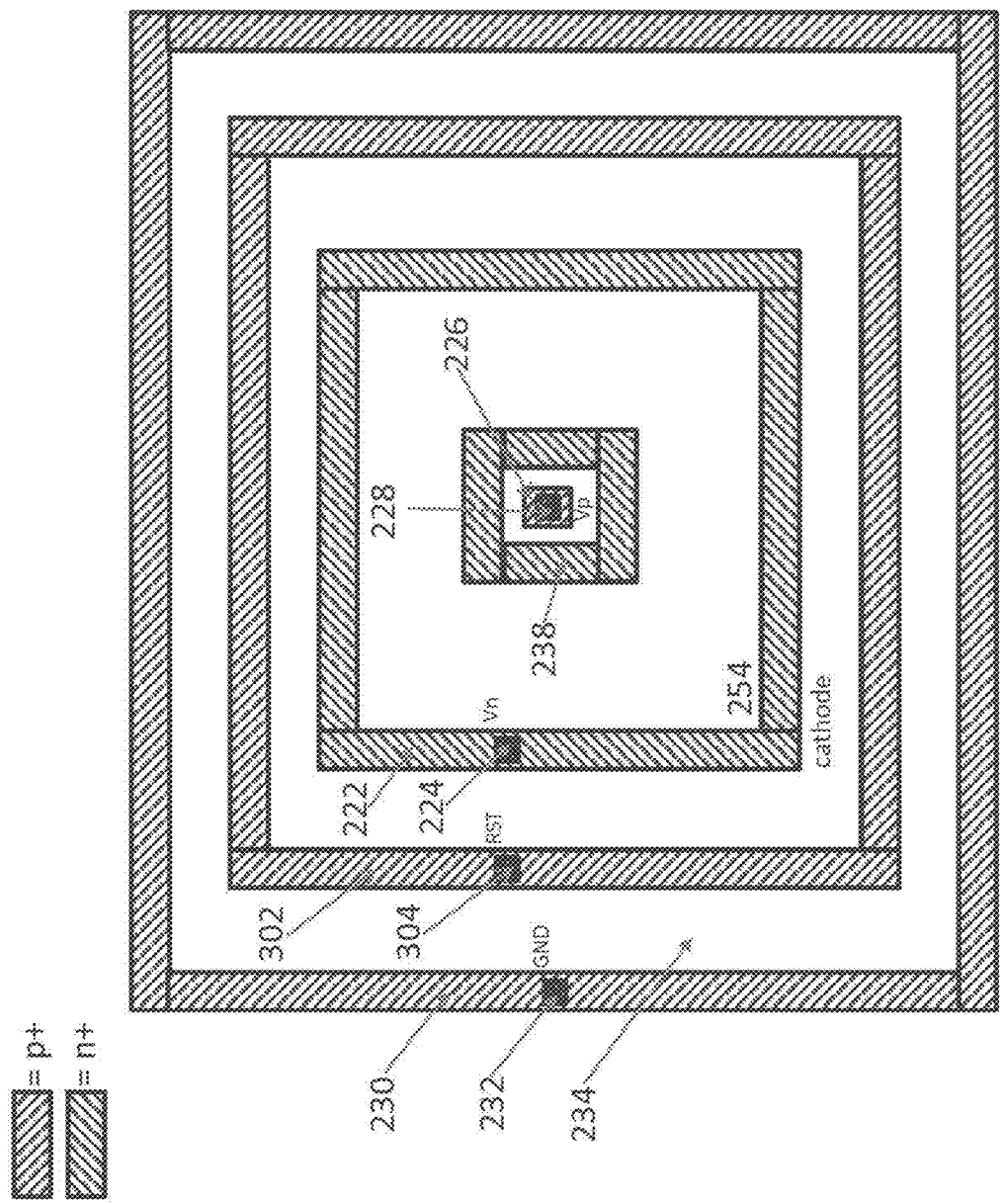
FIG. 29C shows a dynamic photodiode with floating N+ doping, reset p+ doping diffusion, and surrounding reset diffusion from a top view according to an embodiment of the present disclosure.

FIG. 29C shows a DPD 310 with floating N+ doping, reset p+ doping diffusion, and surrounding reset diffusion from a top view according to an embodiment of the present disclosure. DPD 310 features many of the same elements of DPD 300. Regions 230, 222, and 238 may be in a surrounding arrangement, and may be the same as in DPD 300, and have the same characteristics and details as previously discussed. Region 304 may be located between regions 230 and 222, and includes contact 304. The width of region 304 may be substantially uniform, or may vary. Moreover, region 304 may be curved circularly around region 222, or may be formed linearly to surround region 222 (as shown in FIG. 28C). Contact 304 may be located at any location of region 302, and may supply voltage RST to region 302. DPD 310 may provide reduced parasitic capacitance and an improved reset of the device. It should be noted that the configuration of DPD 310 may also be applicable to all photodiodes as disclosed herein.

Figure 29D:
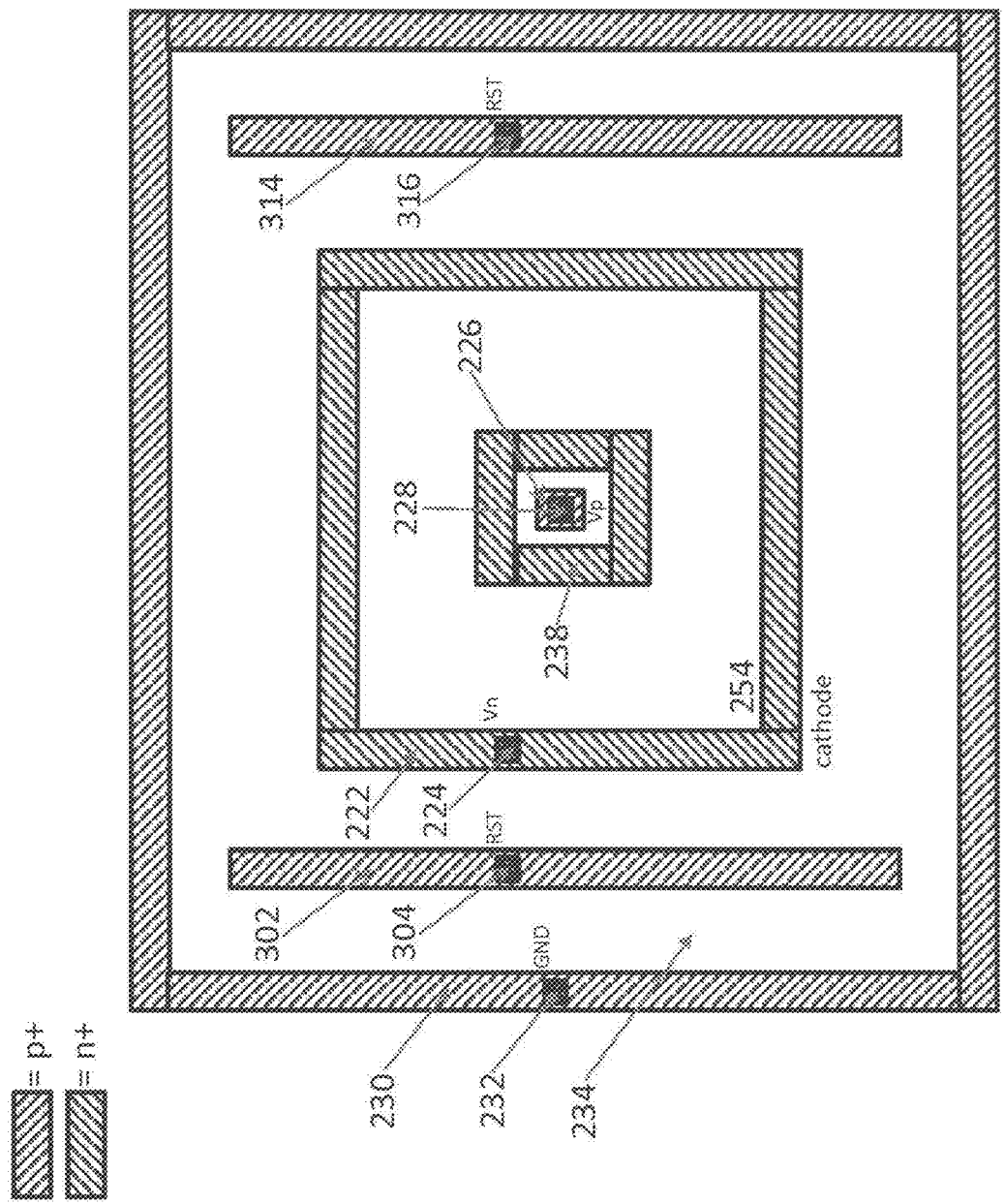
FIG. 29D shows a dynamic photodiode with floating N+ doping, reset p+ doping diffusion, and linear reset diffusion from a top view according to an embodiment of the present disclosure.

FIG. 29D shows a DPD 312 with floating N+ doping, reset p+ doping diffusion, and linear reset diffusion from a top view according to an embodiment of the present disclosure. In this configuration, region 222 surrounds region 238. A linear configuration of region 302 may be located adjacent to region 222. Another linear configuration of region 314 may be located adjacent to region 222. Region 314 may be made of the same material and have the same characteristics as region 302. Additionally, region 314 may include a contact 316. Contact 316 may be located at any position of region 314. Moreover, contact 314 may be formed from the same material and in the same fashion as contact 304. The configuration of DPD 312 may provide decreased parasitic capacitance in DPD 312, which may improve performance. It should be noted that the configuration of DPD 312 may also be applicable to all photodiodes as disclosed herein.

Figure 29E:
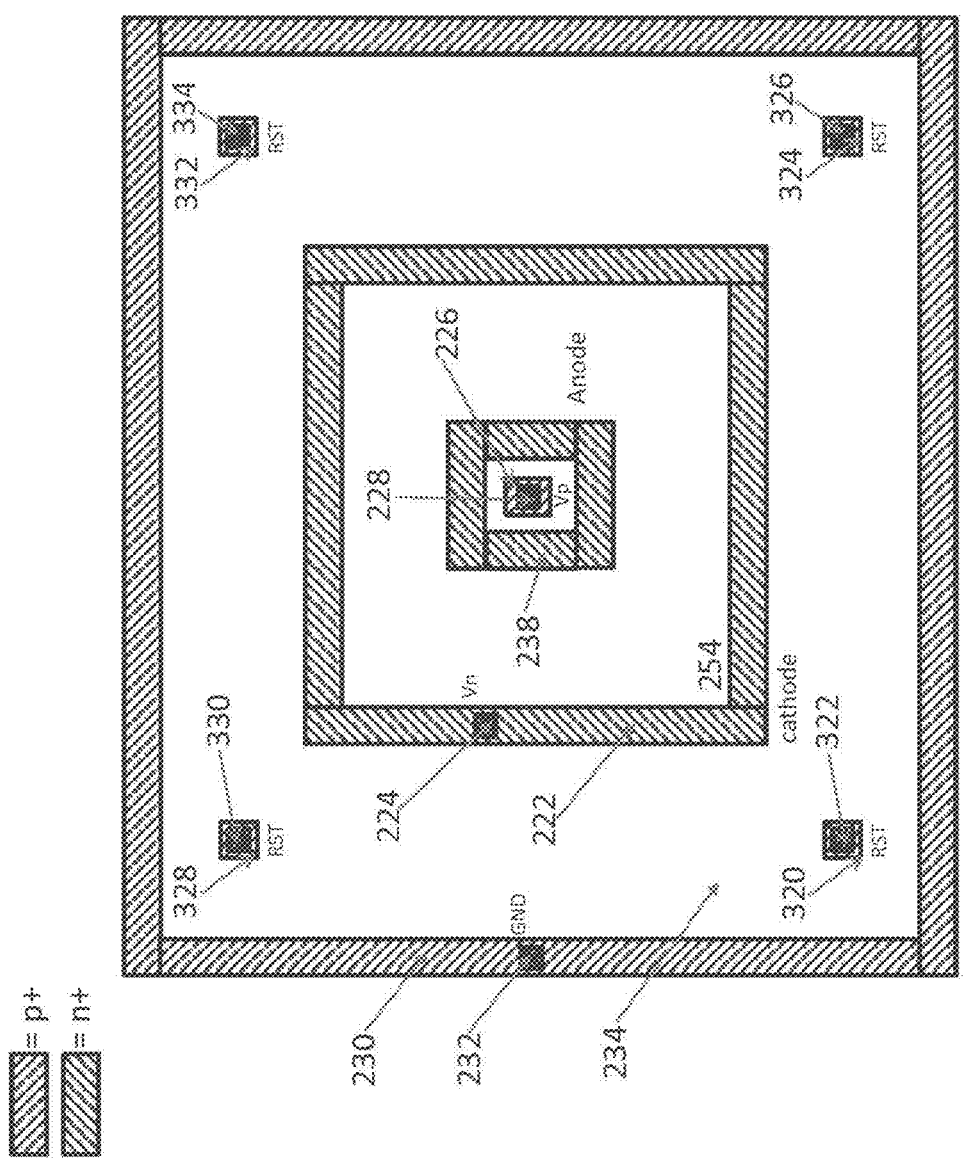
FIG. 29E shows a dynamic photodiode with floating N+ doping, reset p+ doping diffusion, and point reset diffusion from a top view according to an embodiment of the present disclosure.

FIG. 29E shows a DPD 318 with floating N+ doping, reset p+ doping diffusion, and point reset diffusion from a top view according to an embodiment of the present disclosure. In this configuration, region 222 surrounds region 238. Point regions 320, 324, 328, and 332 may be located at positions surrounding region 222, and may only take up a point position on substrate 234. The placement of point regions 320, 324, 328, and 332 shown in FIG. 28E is exemplary, and these regions may be located at different positions on substrate 234. Moreover, there may be more or fewer point regions located on substrate 234 than those shown in FIG. 29E. Point regions 320, 324, 328, and 332 may be made from the same material and configured in the same manner as region 302. Contacts 322, 326, 330, and 334 may each be located at a respective point region 320, 324, 328, and 332. Contacts 322, 326, 330, and 334 may be made from the same material and configured in the same manner as contact 304. DPD 318 may provide a reduction in parasitic capacitance due to point regions 320, 324, 328, and 332, and voltage RST that is applied to each region via respective contacts. It should be noted that the configuration of DPD 318 may also be applicable to all photodiodes as disclosed herein.

Figure 29F:
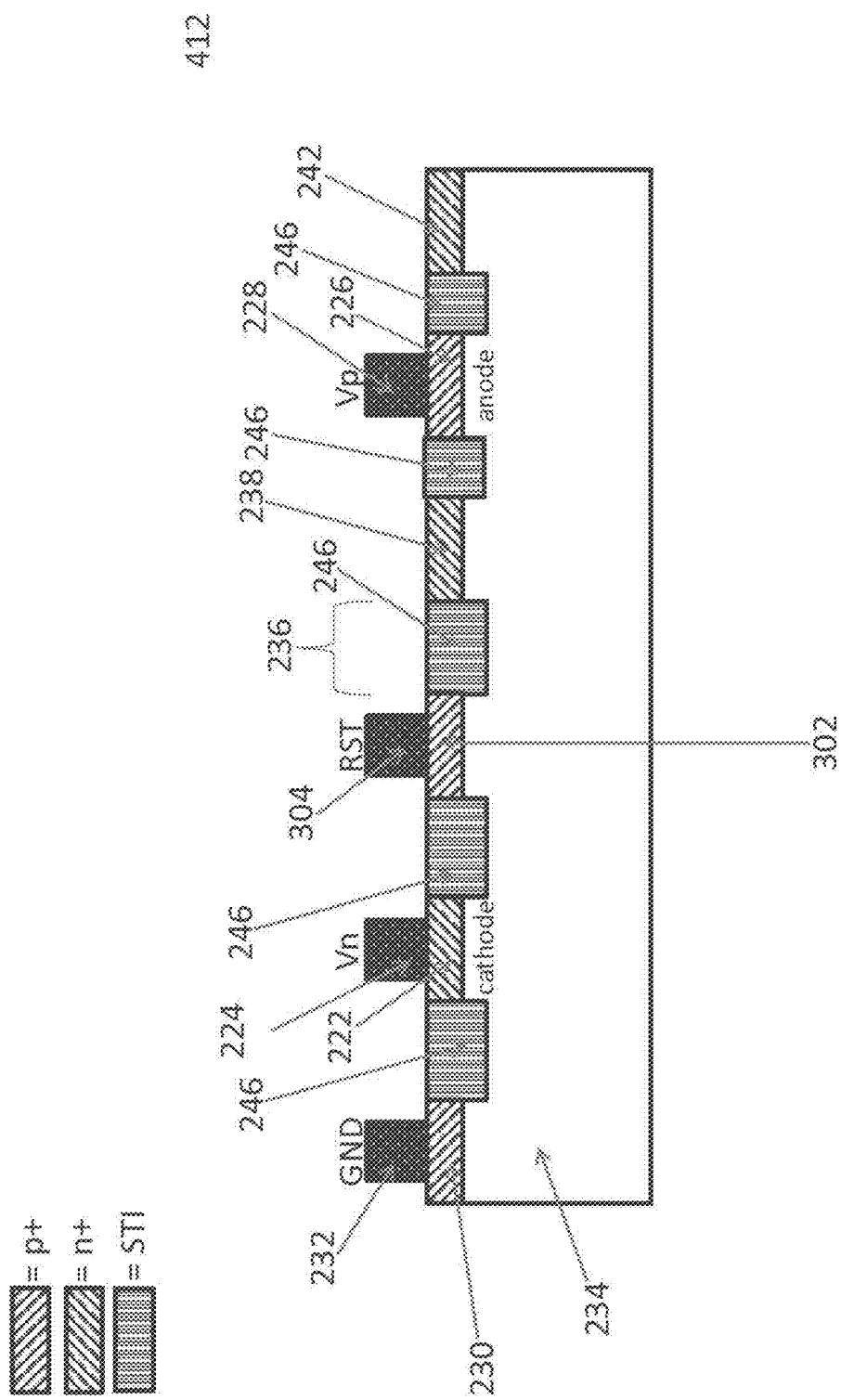
FIG. 29F shows a dynamic photodiode according to an embodiment of the present disclosure.

FIG. 29F shows a DPD 412. DPD 412 includes the same elements as DPD 300, but the location of contact 224 and region 222 may be swapped with the location of contact 304 and region 302.

Figure 29G:
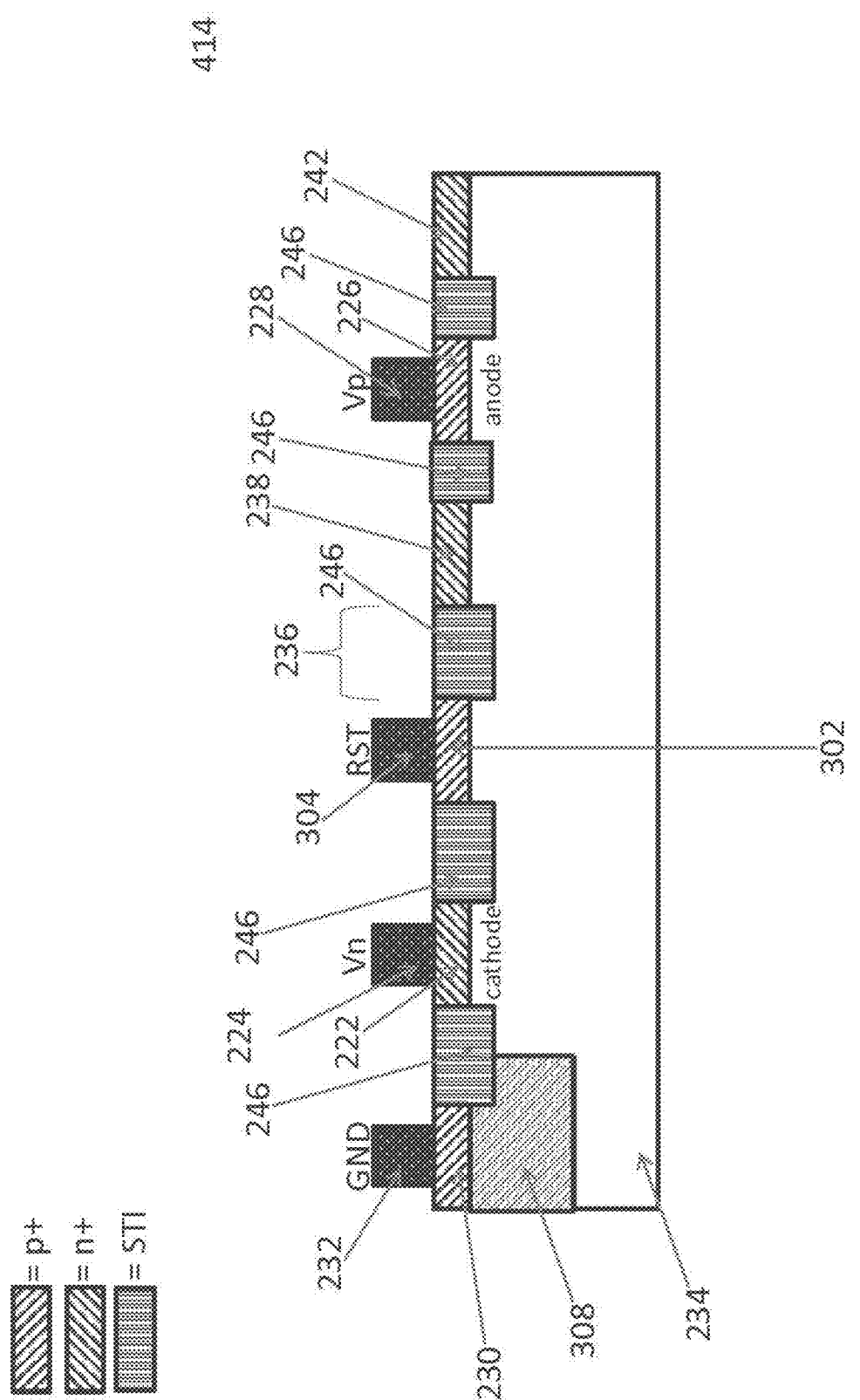
FIG. 29G shows a dynamic photodiode according to an embodiment of the present disclosure.

FIG. 29G shows a DPD 414. DPD 414 includes the same elements as DPD 306, but the location of contact 224 and region 222 may be swapped with the location of contact 304 and region 302.

Figure 29H:
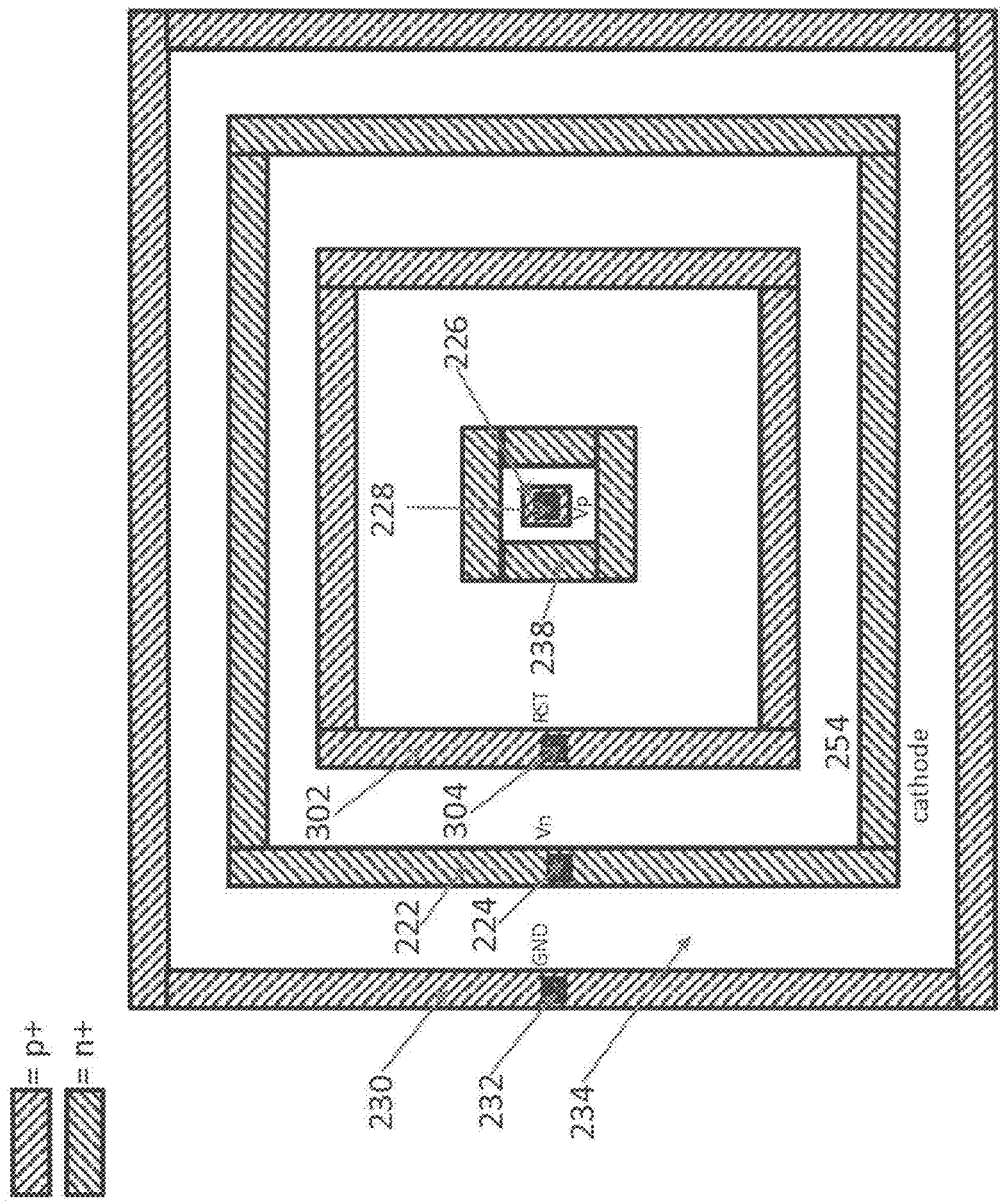
FIG. 29H shows a dynamic photodiode according to an embodiment of the present disclosure.

FIG. 29H shows a DPD 416. DPD 416 includes the same elements as DPD 310, but the location of region 222, featuring contact 224, may be swapped with the location of region 302, featuring contact 304.

Figure 29I:
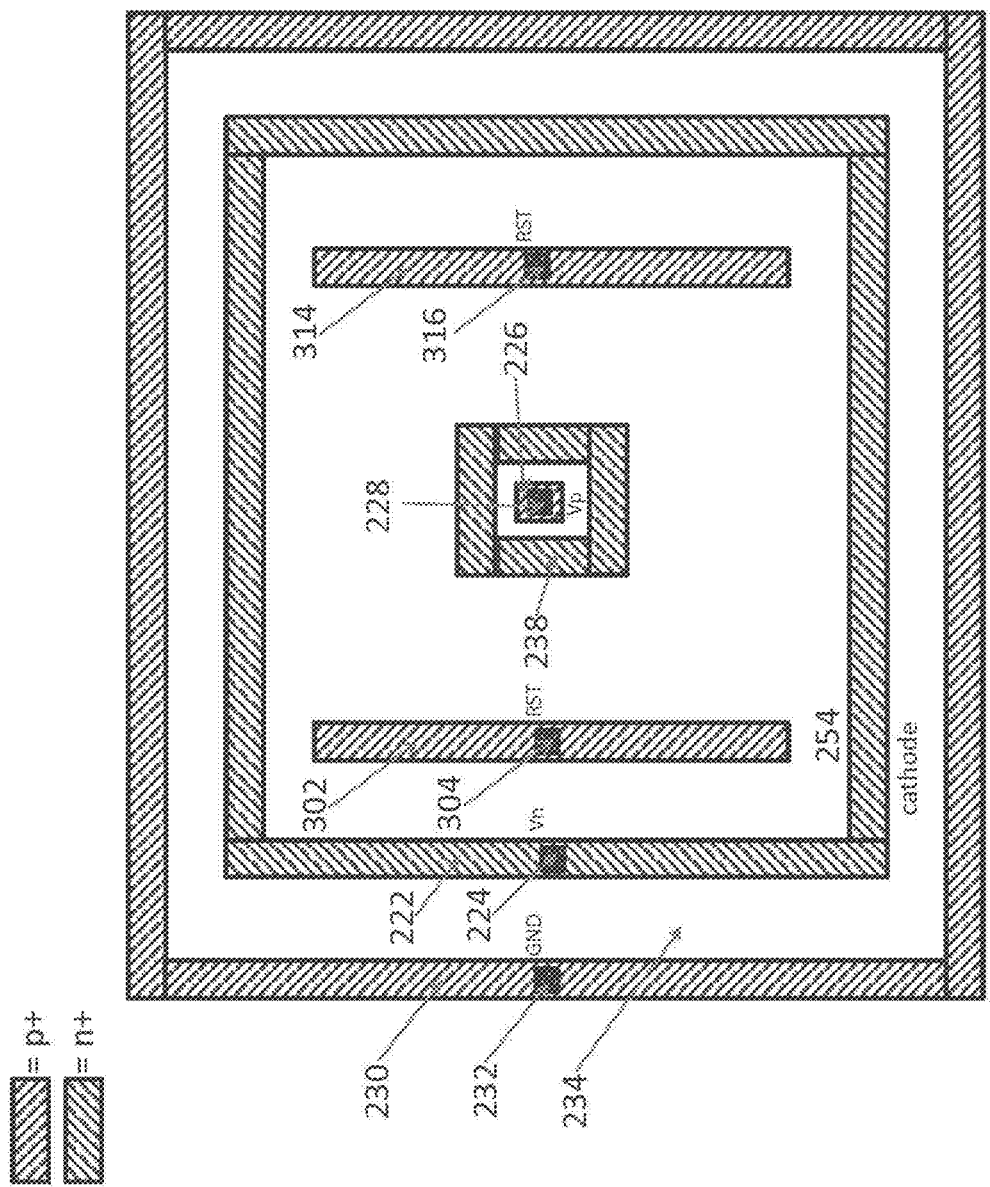
FIG. 29I shows a dynamic photodiode according to an embodiment of the present disclosure.

FIG. 29I shows a DPD 418. DPD 418 includes the same elements as DPD 312, but region 222, featuring contact 224, surrounds contacts 304 and region 302 and contact 316 and region 314.

Figure 29J:
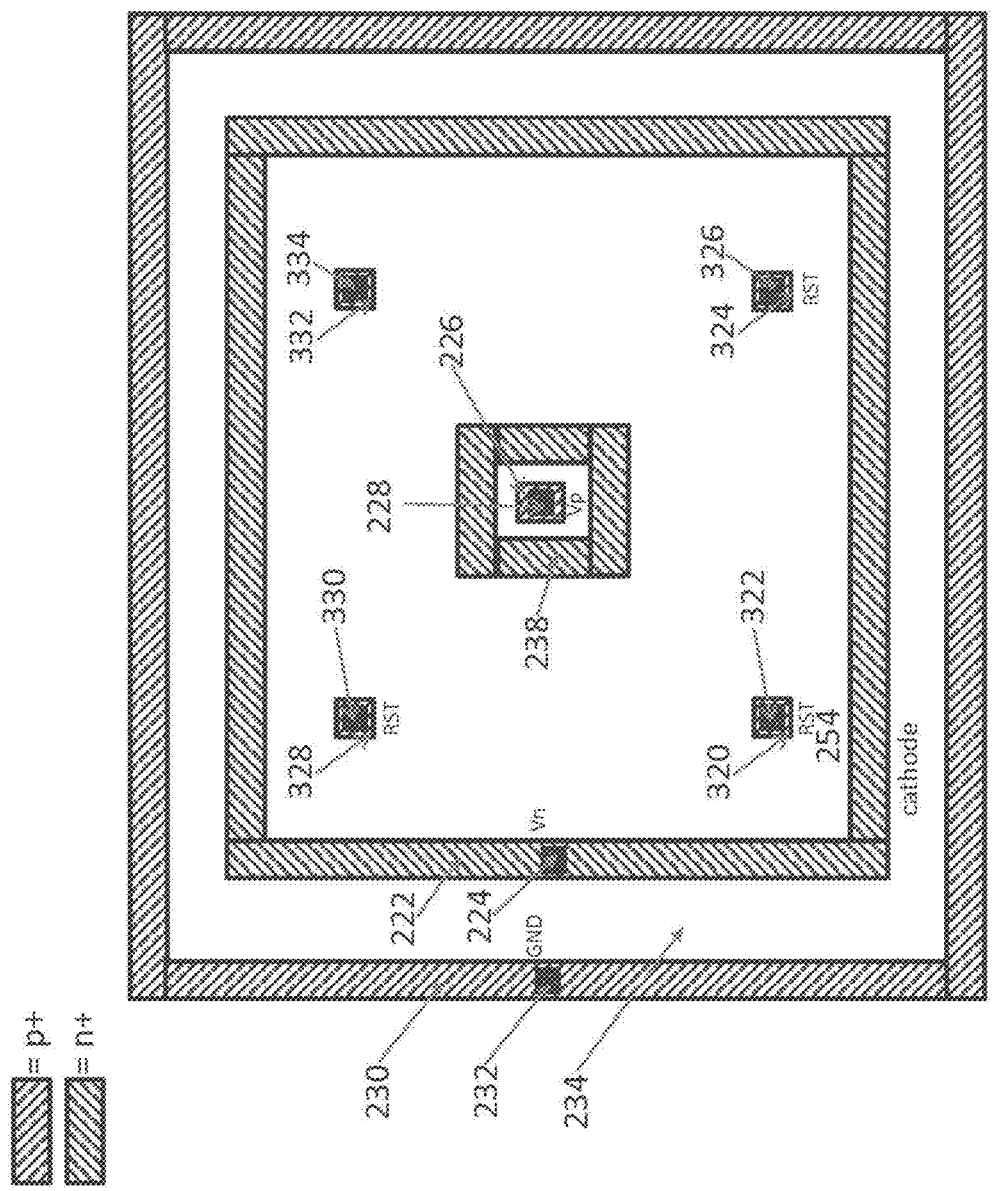
FIG. 29J shows a dynamic photodiode according to an embodiment of the present disclosure.

FIG. 29J shows a DPD 420. DPD 420 includes the same elements as DPD 318, but region 222, featuring contact 224, surrounds regions 320, 324, 328, and 332 and the respective contacts 322, 326, 330, and 334.

Figure 30:
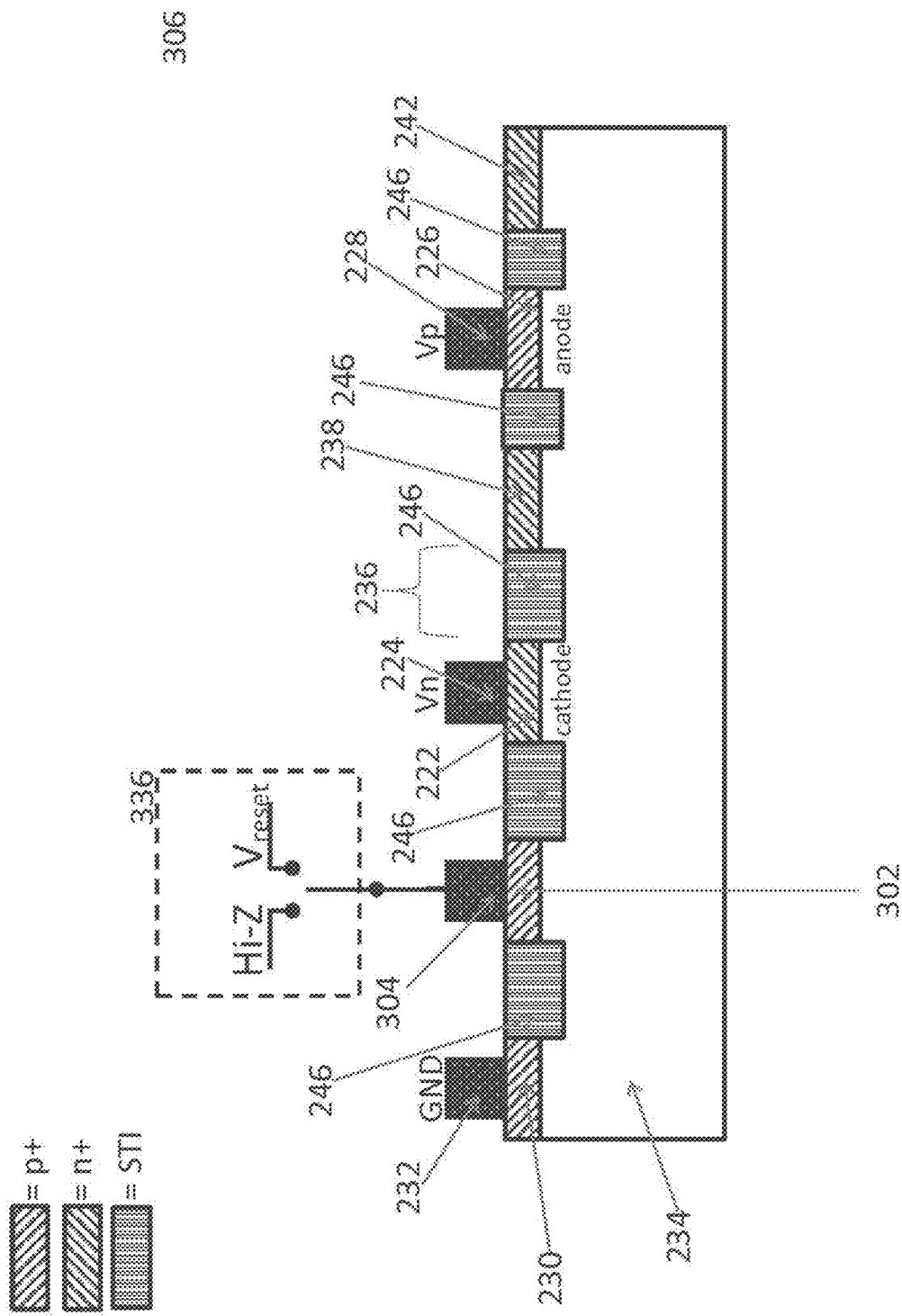
FIG. 30 shows a cross section of a dynamic photodiode along with a switch according to an embodiment of the present disclosure.

FIG. 30 shows a cross section of DPD 306 along with a switch 336 that may be used to switch between voltage Vreset and an open circuit position (e.g., a high impedance position Hi-Z) according to an embodiment of the present disclosure. For device sensing, switch 336 may be set to the open circuit position, which makes contact 304 an open circuit. Region 302 creates a potential barrier at the junction with region 222. Voltage Vn may be set to a negative voltage, voltage Vp may be set to a positive voltage, and third doped region 230 may be grounded. This configuration may cause DPD 306 to be forward biased, and in a sensing mode.

In response to incident light on light absorbing region 236, electron-hole pairs form in substrate region 234. The electron-hole pairs may be separated by an electric field in substrate region 234 created by voltages Vp and Vn. Holes in substrate region 234 move toward first doped region 222 and electrons in substrate region 234 move toward second doped region 226. Holes accumulate in substrate 234 near region 302. The potential barrier in substrate 234 may be lowered. This lowering results in additional and/or greater hole current flow from second doped region 226 to first doped region 222, and the magnitude of output current may be increased. DPD 306 thereby outputs a current upon detecting or in response to the incident light.

Switch 336 may be set to the Vreset position, which may cause a positive voltage to be applied to contact 304, and in turn region 302. Additionally, Vn may be set such that a positive voltage equal to or greater than Vreset may be applied to contact 224, and therefore region 222. DPD 306 then enters reset mode and may be reverse biased. In reset mode, little to no current flows through substrate region 234 regardless of if light is incident on absorbing region 236. Electrons and holes in substrate 234 may be removed. Thus, DPD 306 may be reset and not produce an output current until it is forward biased and placed into sensing mode again.

In each of the embodiments described herein, the detection time or triggering time of the exemplary photo detectors may be programmable or tunable, for example, to meet or accommodate response time specifications as well as power consumption specification. In one embodiment, the voltages applied to the gates may be adjusted to increase the response time of the photo detector (for example, by increasing the electric field). In another embodiment, the voltages applied to the gates may be decreased to reduce the power consumption of the photo detector. All permutations and combinations thereof are intended to fall within the scope of the present inventions.

Notably, the photo detectors may be implemented in a discrete device (for example, discrete photon receiver element) as well as in conjunction with any type of integrated circuitry (for example, integrated CMOS photon receiver circuitry), whether now known or later developed; all such configurations are intended to fall within the scope of the present inventions. Further, any manufacturing technique, whether now known or later developed, may be employed to fabricate the photo detector and/or photo detector-integrated circuit device of the present inventions; all such techniques are intended to fall within the scope of the present inventions.

Figure 20A:
FIGS. 20A and 20F are cross-sectional views of light sensors or photo detectors described and illustrated in the '891 application.
Figure 20B:
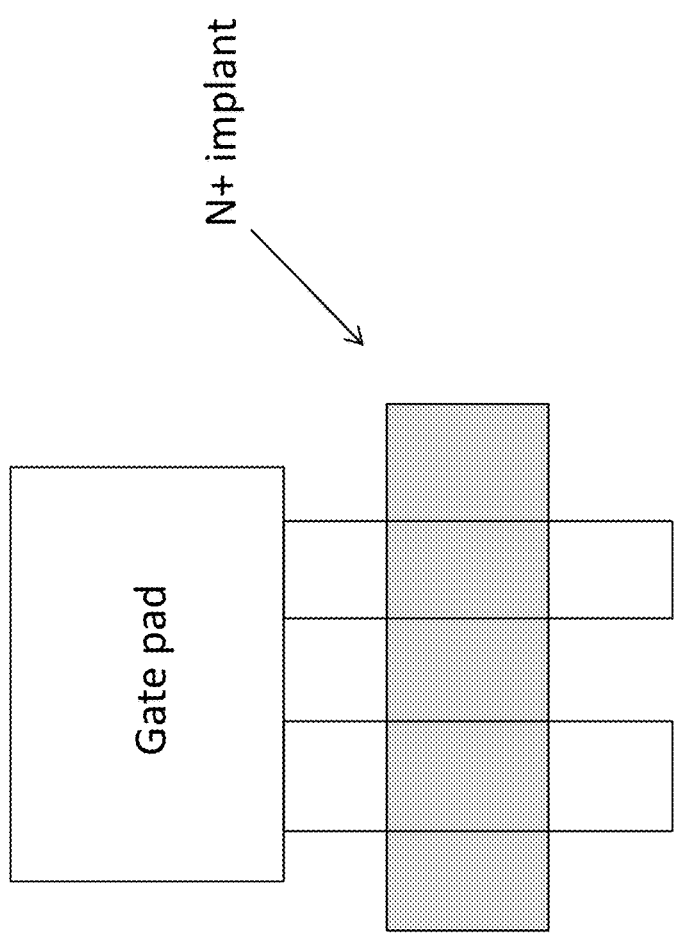
Figure 20D:
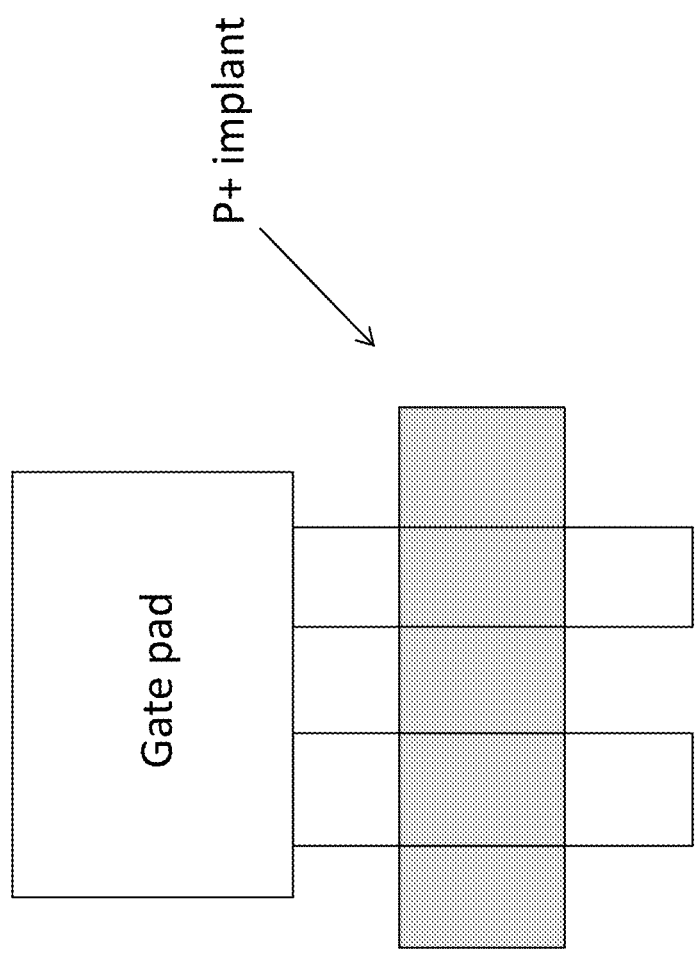
Figure 20E:
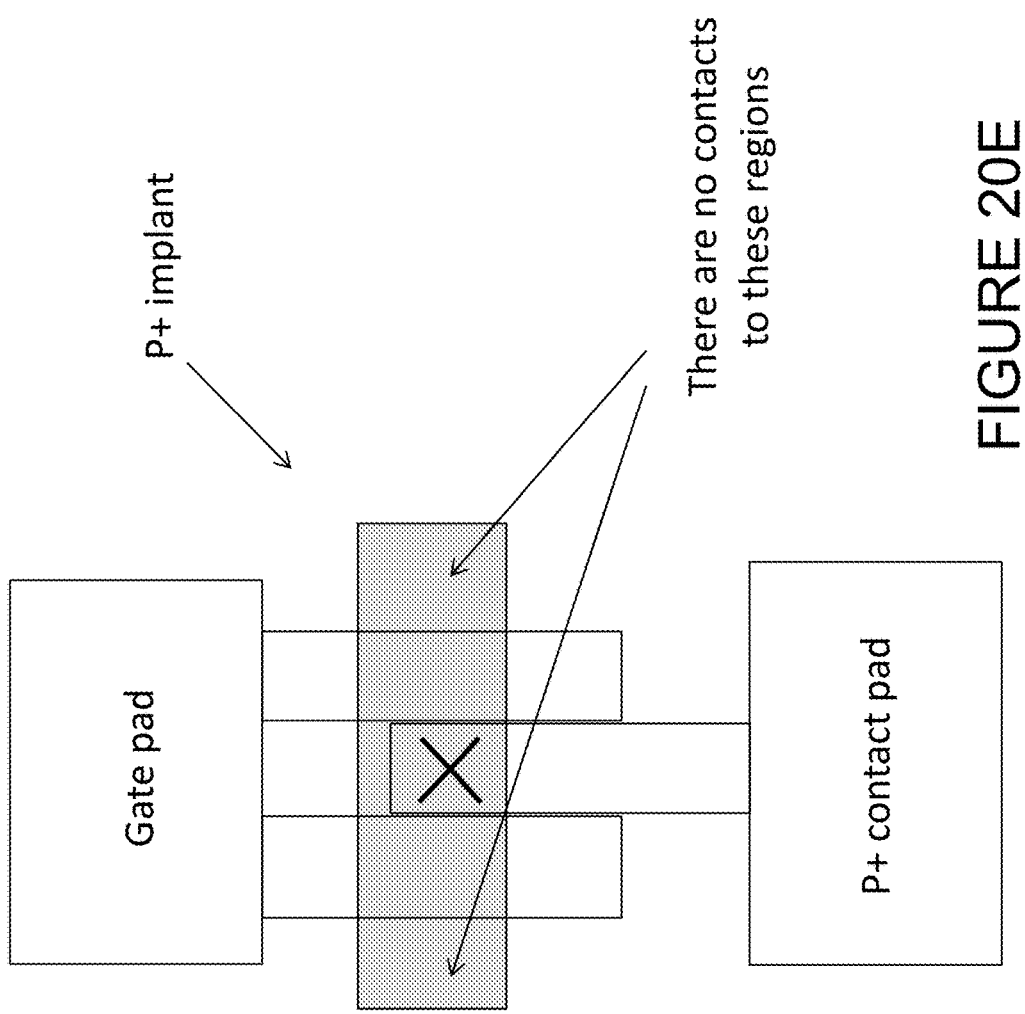
Figure 20F:
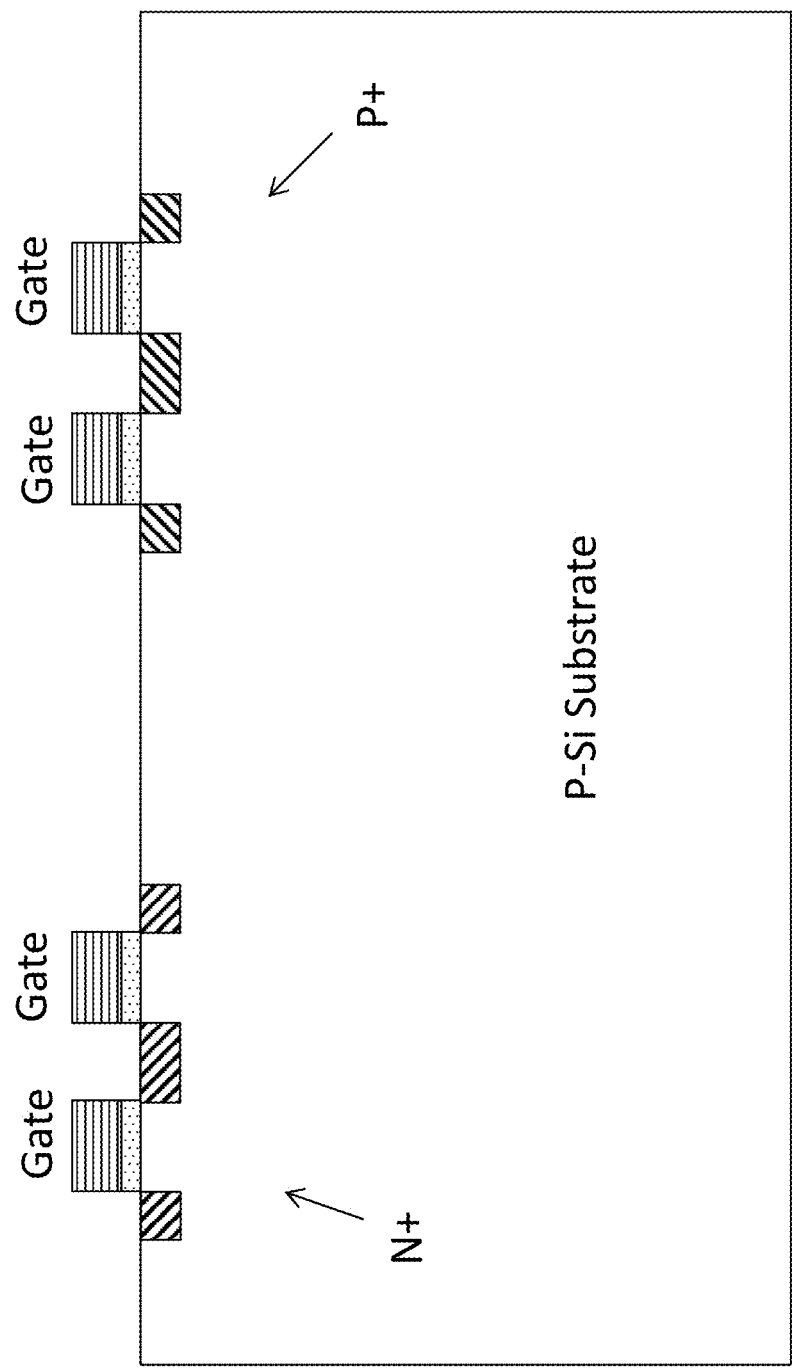

For example, the photo detectors may be fabricated via a CMOS process. (See, for example, FIGS. 20A-20F). For example, where the photo detector includes n+ regions and p+ region (see, for example, the illustrative embodiments of FIGS. 10A, 13A, 14A and 14B), the p+ regions, gates and contact regions may be fabricated during or in relation to the CMOS process of fabricating the PMOS and NMOS transistors. In particular, in one embodiment, after forming the gates, an n+ implant may be performed (see FIG. 20B), and thereafter a contact to a portion of the n+ region may be formed (see FIG. 20C). The p+ regions may be formed in a similar manner (see FIGS. 20D and 20E). FIG. 20F illustrates a cross-section of the resulting or "final" structure. Notably, where the photo detector does not include n+ regions as in several of the exemplary embodiments set forth herein, the n+ processing in connection with the photo detector may be omitted.

The n+ and p+ implantations of the photo detector may be performed during formation of the CMOS transistors. Alternatively, the n+ and p+ implantations of the photo detector may be performed before or after formation of the CMOS transistors. Moreover, the light absorbing regions and contact regions of the photo detectors of FIGS. 10A, 13A, 14A, 14B, 15A and 19A may be fabricated after such CMOS process without impact to the CMOS circuitry.

In another aspect, the photo detectors may be configured and/or disposed as an array according to any of the embodiments described and/or illustrated herein. The array may include, in addition to the array of photo detectors, control circuitry to manage the acquisition, capture and/or sensing operations of the photo detectors of the array. (See, for example, FIG. 8). For example, the control circuitry may control or enable/disable the photo detectors in a manner so that data acquisition or sensing correlates to the data rate of the transmission. In another embodiment, the photo detector array may be coupled to a plurality of fiber optic output devices wherein each fiber optic device may be associated with one or more photo detectors of the array and the control circuitry may control or enable/disable the subset of photo detectors in accordance with the associated output of the fiber optic device.

The photo detector array may be formed from a plurality of discrete devices and/or from a plurality of photo detectors integrated on a die wherein the photo detector array portion includes a plurality of photo detectors to acquire, capture, convert and/or sense the incident light from one or more associated fiber optic output(s). The photo detectors may be configured and/or arranged in any array architecture as well as in conjunction with any type of integrated circuitry, whether now known or later developed; all such configurations are intended to fall within the scope of the present inventions. Further, any manufacturing technique, whether now known or later developed, may be employed to fabricate the array (which includes a plurality of photo detectors) and/or photo detector array-integrated circuit device embodiments; all such techniques are intended to fall within the scope of the present inventions.

Notably, with reference to FIGS. 1 and 9, the photo detector(s) may be coupled to a current amplifier or photo detector (and other circuitry) to measure/condition the current output by the photo detector (for example, output via the contact region and p+ doped regions in response to the detection of light/data in the exemplary embodiments illustrated in FIGS. 3A, 15A, 15B, 17A, 17A, 19A and 19B). Notably, the current photo detector may be a high-speed sense amplifier or the like. All current sensing circuitry and architectures, now known or later developed, are intended to fall within the scope of the present inventions.

Further, the gates, contact region and p+ regions in the embodiments described and/or illustrated herein may be formed by or in a semiconductor (for example, silicon doped with acceptor impurities). Alternatively, one or more (or all) of such features (gates and regions) may be comprised of or formed (whether wholly or partially) from a metal (for example, aluminum or copper) or metal compound.

Notably, the photo detector, photo detector array and/or die/device (including the photo detector and/or photo detector array) may include an anti-reflective material disposed there over or thereon. In one embodiment, an anti-reflective material may be disposed over or on the light absorbing region of the photo detector or photo detectors (of the array of photo detectors). In another embodiment, an anti-reflective material may be disposed on or over the entire structure, or a significant portion thereof.

Further, as noted above, the photo detectors may be implemented in a discrete photo detector or in an integrated circuit device having a photon receiver section (which may include one or more photo detectors (including an array of photo detectors)). Moreover, the photo detectors may be implemented in the standard planar technology (as illustrated herein) or any 3D technology (for example, planar or vertical type), or pillar gate architectures). The body region of the photo detector may or may not be electrically floating in view of the insulation or non-conductive region (for example, in bulk-type material/substrate). As illustrated herein, the photo detector may be formed on an SOI substrate or bulk silicon substrate.

Figure 21A:
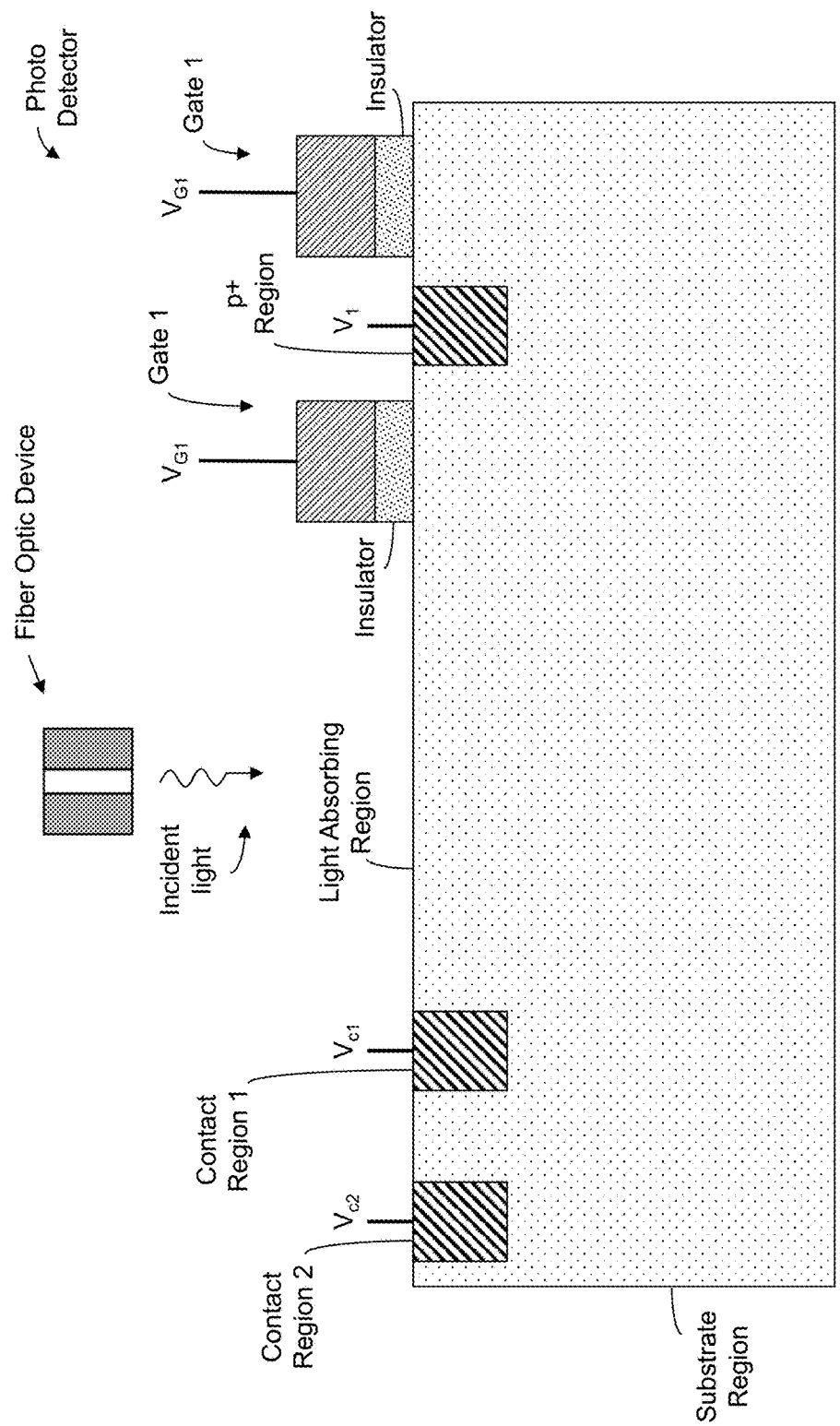
FIG. 21A is a cross-sectional view of an exemplary monolithic light sensor or photo detector that may be employed in conjunction with the present inventions wherein the sensor/detector includes a plurality of contact regions disposed on a top side (major surface) of the bulk substrate wafer/die (compare the single contact region of the embodiment of FIG. 3A)
Figure 21B:
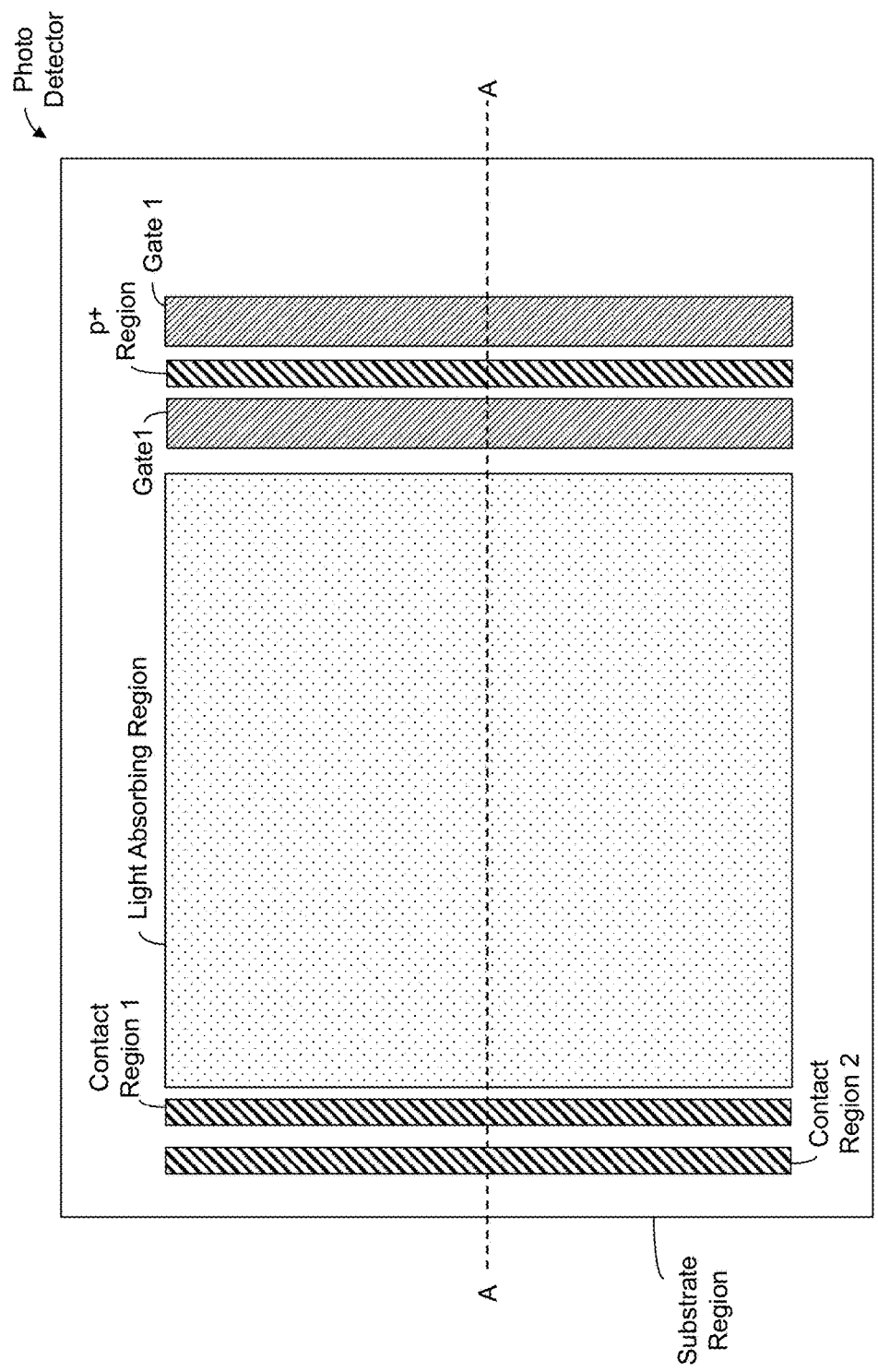
FIGS. 21B and 21C illustrate exemplary top views of the cross-sectional view of the photo detector of FIG. 21A wherein dotted lines A-A indicate the location of the cross-sectional view of FIG. 21A; although the contact region of this exemplary embodiment, like that of FIGS. 3A-3C, may employ a p+ region and/or n+ region.
Figure 21C:
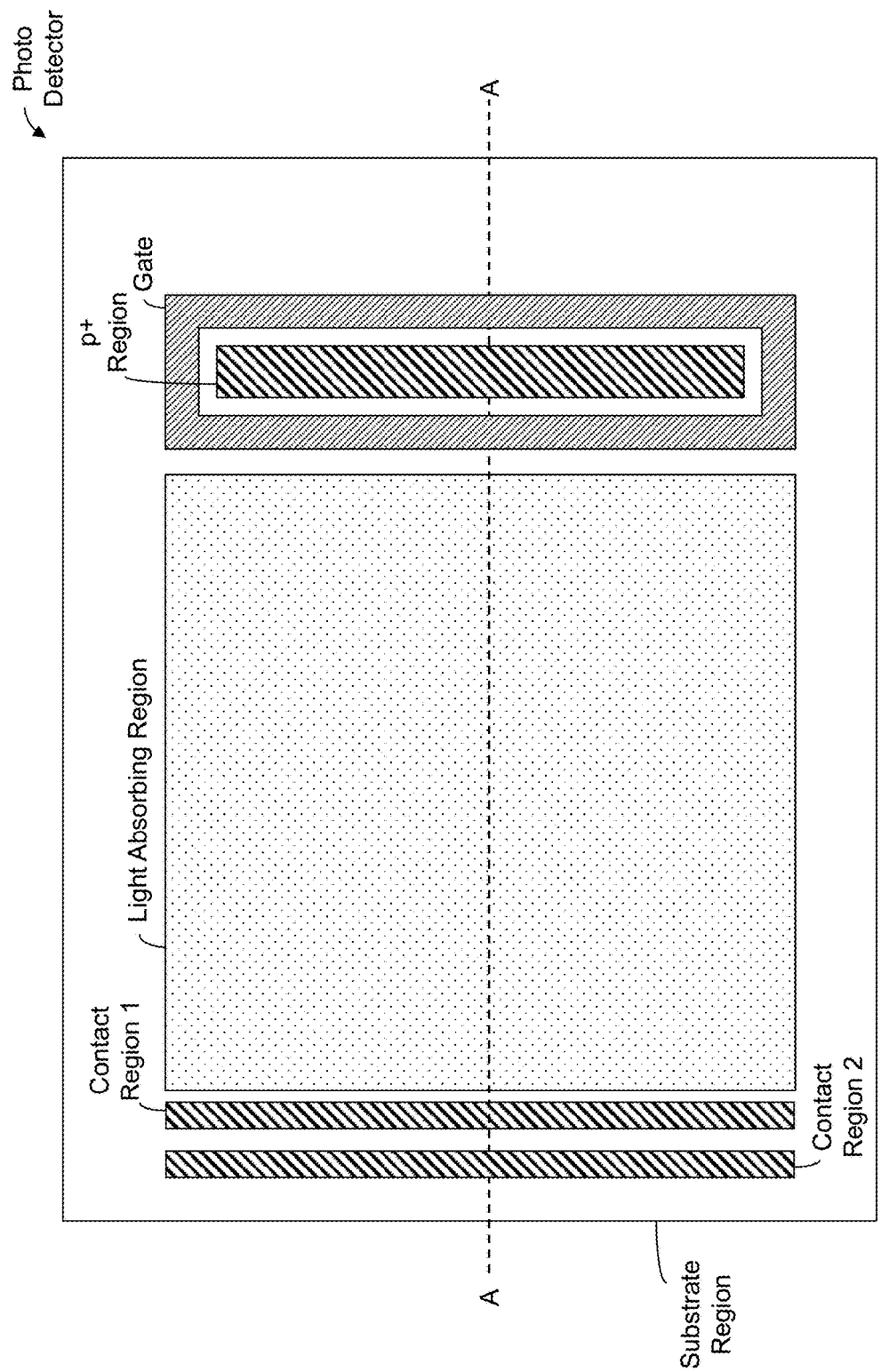

Moreover, although many of the photo detector embodiments employ a "Contact Region" (see, for example, FIGS. 3A-3C), photo detectors employed in the present inventions may include one or more additional contact regions (n+ or p+ type contact regions). For example, with reference to FIGS. 21A-21C, the exemplary photo detector includes an additional contact region (contact region 2) to improve the performance of the detector. In operation, a DC voltage may be applied to contact region 2 (for example, $V_{c}2=0$ v, ground) in order to provide additional control of the potential barriers within the detector during operation or during the inactive period. Indeed, such other photo detector embodiments described and illustrated herein may include more one or more additional contact regions (n+ or p+ type contact regions). For the sake of brevity, such discussions will not be repeated, in detail, in relation with the other exemplary embodiments described and illustrated herein.

As noted above, the illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages.

It should be noted that the term "circuit" may mean, among other things, a single component or a multiplicity of components (whether in integrated circuit form or otherwise), which may be active and/or passive, and which may be coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form, which may be a single bit (or the like) or multiple bits (or the like).

Notably, reference herein to "one embodiment" or "an embodiment" herein means that a particular feature, structure, or characteristic described in connection with the embodiment can be included in one some or all of the embodiments of the present inventions. The usages or appearances of the phrase "in one embodiment" or "in another embodiment" in the specification are not referring to the same embodiment, nor are separate or alternative embodiments necessarily mutually exclusive of one or more other embodiments. The same applies to the term "implementation."

Further, an embodiment or implementation described herein as exemplary should not to be construed as preferred or advantageous, for example, over other embodiments or implementations; rather, it is intended to reflect or indicate the embodiment or embodiments as an example embodiment(s).

The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present inventions may also be directed to such representation of the circuitry described herein, and/or techniques implemented thereby, and, as such, are intended to fall within the scope of the present inventions.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that may be used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the circuitry of the present inventions, including the photo detector and/or techniques implemented thereby, may be implemented by a computer system wherein characteristics and operations of such circuitry, and techniques implemented thereby, may be simulated, imitated, replicated, analyzed and/or predicted via a computer system. The present inventions may also be directed to such simulations and testing of the inventive device and/or circuitry, and/or techniques implemented thereby, and, as such, are intended to fall within the scope of the present inventions. The computer-readable media and data corresponding to such simulations and/or testing tools are also intended to fall within the scope of the present inventions.

Notably, if applicable, in the claims, the contact region of the photo detector may be disposed and/or formed in the substrate (see, for example, one of the p+ or n+ regions illustrated in the embodiment of FIGS. 10A, 13A, 14A and 14B) or disposed and/or formed on the substrate (see, for example, the p+ contact region of the embodiments of FIGS. 15A-15E or the n+ contact region of the embodiments of FIGS. 19A-19D).

In the claims, the term "determine" and "calculate" and other forms thereof (i.e., determining, determined and the like or calculating, calculated and the like) means, among other things, calculate, assesses, determine and/or estimate and other forms thereof.

In addition, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "data" may mean, among other things, a current or voltage signal(s) whether in analog or a digital form (which may be a single bit (or the like) or multiple bits (or the like)).

As used in the claims, the terms "comprises," "comprising," "includes," "including," "have," and "having" or any other variation thereof, are intended to cover a non-exclusive inclusion, such that a process, method, article, or apparatus that comprises a list of elements does not include only those elements but may include other elements not expressly listed or inherent to such process, method, article, or apparatus.

Further, the statement that one or more circuits, circuitry, nodes and/or components are "coupled" means that the circuits, circuitry, nodes and/or components may be joined and/or operate (for example, physically or electrically) together either directly or indirectly, i.e., through one or more intermediate circuits, circuitry, nodes and/or components, so long as a link occurs; "directly coupled" means that two elements may be directly joined, in contact and/or operate with each other.

The invention claimed is:

1. A dynamic photodiode comprising:
   a substrate;
   a first doped region disposed on the substrate, the first doped region including a first contact configured to receive a first voltage;
   a second doped region disposed on the substrate, the second doped region including a second contact configured to receive a second voltage;
   a first resettable doped region disposed on the substrate between the first doped region and the second doped region, the first resettable doped region including a first resettable contact configured to receive a reset voltage or be set as an open circuit; and
   a first light absorbing region disposed on the substrate between the first doped region and the second doped region, the first light absorbing region configured to generate first electron-hole pairs in the substrate,
   wherein first electron-hole pairs are generated in the substrate when the first resettable contact is set as an open circuit, and the first electron-hole pairs are removed from the substrate when the first resettable contact receives the reset voltage;
   wherein the first doped region is an n+ doped region, the second doped region is a p+ doped region, and the first resettable region is an n+ doped region.

2. The dynamic photodiode of claim 1, wherein the reset voltage is a positive voltage value.

3. The dynamic photodiode of claim 2, wherein the positive voltage value is greater than or equal to 1 volt, but less than or equal to 3.3 volts.

4. The dynamic photodiode of claim 1, further comprising a third doped region disposed on the substrate, the third doped region including a third contact that is grounded.

5. A dynamic photodiode comprising:
   a substrate;
   a first doped region disposed on the substrate, the first doped region including a first contact configured to receive a first voltage;
   a second doped region disposed on the substrate, the second doped region including a second contact configured to receive a second voltage;
   a first resettable doped region disposed on the substrate between the first doped region and the second doped region, the first resettable doped region including a first resettable contact configured to receive a reset voltage or be set as an open circuit;
   a fourth doped region disposed on the substrate, the fourth doped region including a fourth contact configured to receive the first voltage; and
   a first light absorbing region disposed on the substrate between the first doped region and the second doped region, the first light absorbing region configured to generate first electron-hole pairs in the substrate,
   wherein first electron-hole pairs are generated in the substrate when the first resettable contact is set as an open circuit, and the first electron-hole pairs are removed from the substrate when the first resettable contact receives the reset voltage.

6. The dynamic photodiode of claim 5, further comprising a second resettable doped region disposed on the substrate between the second doped region and the fourth doped region, the second resettable doped region including a second resettable contact configured to receive the reset voltage or be set as an open circuit.

7. The dynamic photodiode of claim 6, further comprising a second light absorbing region disposed on the substrate between the second doped region and the fourth doped region, the second light absorbing region configured to generate second electron-hole pairs in the substrate, wherein the second electron-hole pairs are generated in the substrate when the second resettable contact is set as an open circuit, and the second electron-hole pairs are removed from the substrate when the second resettable contact receives the reset voltage.

8. The dynamic photodiode of claim 6, wherein the first doped region, second doped region, first resettable region, second resettable region, and fourth doped region are linear regions arranged parallel to each other.

9. The dynamic photodiode of claim 8, wherein the first doped region is an n+ doped region, the second doped region is a p+ doped region, the first resettable region is an n+ doped region, the second resettable region is an n+ doped region, and the fourth doped region is an n+doped region.

10. A dynamic photodiode comprising:
    a substrate;
    a first doped region disposed on the substrate, the first doped region including a first contact configured to receive a first voltage;
    a second doped region disposed on the substrate, the second doped region including a second contact configured to receive a second voltage;
    a first resettable doped region disposed on the substrate between the first doped region and the second doped region, the first resettable doped region including a first resettable contact configured to receive a reset voltage or be set as an open circuit; and
    a first light absorbing region disposed on the substrate between the first doped region and the second doped region, the first light absorbing region configured to generate first electron-hole pairs in the substrate,
    wherein first electron-hole pairs are generated in the substrate when the first resettable contact is set as an open circuit, and the first electron-hole pairs are removed from the substrate when the first resettable contact receives the reset voltage;
    wherein the first doped region surrounds the first resettable doped region.

11. The dynamic photodiode of claim 10, wherein the first resettable doped region surrounds the second doped region.

12. The dynamic photodiode of claim 4, wherein the third doped region is a p+ doped region.

13. The dynamic photodiode of claim 4, wherein the third doped region surrounds the first doped region.

14. The dynamic photodiode of claim 1 further comprising a back contact attached to a first side of the substrate opposite to a second side of the substrate where the first doped region, second doped region, first resettable region, and first resettable doped region are disposed.

15. The dynamic photodiode of claim 14, wherein the back contact is grounded.

16. The dynamic photodiode of claim 14, wherein the back contact is etched into the substrate.

17. The dynamic photodiode of claim 14, wherein a doped layer is arranged between the back contact and the substrate.

18. The dynamic photodiode of claim 17, wherein the doped layer is p+ doped.

19. The dynamic photodiode of claim 4, wherein a well is arranged below the third doped region and extends the third contact into the substrate via the third doped region.

20. The dynamic photodiode of claim 19, wherein the well has the same doping type as the third doped region.

21. A dynamic photodiode comprising:

a substrate;

a first doped region disposed on the substrate, the first doped region including a first contact configured to receive a first voltage;

a second doped region disposed on the substrate, the second doped region including a second contact configured to receive a second voltage;

a first resettable doped region disposed on the substrate between the first doped region and the second doped region, the first resettable doped region including a first resettable contact configured to receive a reset voltage or be set as an open circuit;

a first light absorbing region disposed on the substrate between the first doped region and the second doped region, the first light absorbing region configured to generate first electron-hole pairs in the substrate;

an epi-layer disposed underneath the first doped region, the second doped region, the first resettable doped, and the first light absorbing region, and a buried oxide region disposed underneath the epi-layer, the buried oxide region contacting the substrate, wherein first electron-hole pairs are generated in the substrate when the first resettable contact is set as an open circuit, and the first electron-hole pairs are removed from the substrate when the first resettable contact receives the reset voltage.

22. The dynamic photodiode of claim 1, further comprising:

an epi-layer disposed underneath the first doped region, the second doped region, the first resettable doped, and the first light absorbing region, and an epitaxial layer disposed underneath the epi-layer, the epitaxial layer contacting the substrate.

\* \* \* \* \*